(12) United States Patent
Sakagami et al.

(10) Patent No.: US 6,888,479 B2
(45) Date of Patent: May 3, 2005

(54) DATA PROCESSING METHOD, CIRCUIT, AND APPARATUS WITH INCREASED ACCURACY

(75) Inventors: Koubun Sakagami, Kanagawa (JP); Kazunori Takatsu, Kanagawa (JP); Akihiko Shimizu, Kanagawa (JP); Yuichi Kadokawa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 211 days.

(21) Appl. No.: 10/247,552

(22) Filed: Sep. 20, 2002

(65) Prior Publication Data

US 2003/0110444 A1 Jun. 12, 2003

(30) Foreign Application Priority Data

Sep. 21, 2001 (JP) ........................................ 2001-289787
Jan. 21, 2002 (JP) ........................................ 2002-011160
Apr. 18, 2002 (JP) ........................................ 2002-116738

(51) Int. Cl.$^7$ ............................. H03J 3/00; H03J 5/24
(52) U.S. Cl. ..................... 341/56; 341/50; 369/59.11; 369/59.23; 375/286
(58) Field of Search ..................... 341/50, 56; 375/286; 369/59.11, 59.23

(56) References Cited

U.S. PATENT DOCUMENTS 3,754,237 A * 8/1973 de Laage de Meux ....... 341/56
4,118,791 A * 10/1978 Swain ......................... 341/50

(Continued)

FOREIGN PATENT DOCUMENTS

JP 8-124167 5/1996

OTHER PUBLICATIONS

Sung–Moon Yang et al, "LSB–Coded Modulation and its Applications to Microwave Digital Radios," Proc. Of Global Telecommunications Conf., Nov. 18, 1996, pp. 1243–1247, London UK.

Sakagami, K. et al., "A New Data Modulation Method for Multi–Level Optical Recording," Proc. Of International Symp. On Optical Memory and Optical Data Storage Meeting, Jul. 7, 2002, pp. 54–56, Waikoloa, USA.

Wong, T. L. et al, "Multilevel Optical Recording," J. Magn. Soc. Jpn., vol. 25, No. 3, pt. 2, 2001, pp. 433–436, Japan.

Penicaud, M. et al., "Interactive Decoding of Rate Adaptive Multilevel Coded Modulation for Mobile Satellite Communication," Proc. Of Global Telecommunications Conf., Nov. 18, 1996, pp. 415–519, UK.

*Primary Examiner*—Michael Tokar
*Assistant Examiner*—Khai M. Nguyen
(74) *Attorney, Agent, or Firm*—Dickstein Shapiro Morin & Oshinsky LLP

(57) ABSTRACT

In a data processing method of converting (n×m−1)-bit data to multi-level data of m symbols of n bits per symbol, n and m being integers satisfying n≧2 and m≧2, respectively, the m symbols each comprising n-bit data are arranged in m columns in an n×m matrix, with a value of each of the m symbols being set to an even or odd number, by creating the m symbols each including (n−1)-bit data of the (n×m−1)-bit data, arranging the m symbols in the m columns so that the {(n−1)×m}-bit data is arranged in upper-side {(n−1)×m} bits of the n×m matrix, and converting the remaining (m−1)-bit data of the (n×m−1)-bit data to m-bit data so that the m-bit data is arranged in a row in lower-side m bits of the n×m matrix.

79 Claims, 24 Drawing Sheets

U.S. PATENT DOCUMENTS

| | | | |
|---|---|---|---|
| 4,408,189 A | * 10/1983 | Betts et al. | 341/56 |
| 4,420,771 A | * 12/1983 | Pirsch | 341/56 |
| 4,464,765 A | * 8/1984 | Shimizu | 375/292 |
| 5,140,322 A | 8/1992 | Sakagami | |
| 5,142,380 A | 8/1992 | Sakagami et al. | |
| 5,344,683 A | 9/1994 | Shimizu | |
| 5,414,720 A | 5/1995 | Kadokawa | |
| 5,438,601 A | 8/1995 | Maegawa et al. | |
| 5,469,420 A | * 11/1995 | Fujita et al. | 369/59.18 |
| 5,497,194 A | 3/1996 | Sakagami et al. | |
| 5,638,354 A | 6/1997 | Nakayama et al. | |
| 5,737,307 A | 4/1998 | Shimizu | |
| 5,812,520 A | 9/1998 | Nakayama et al. | |
| 5,822,286 A | 10/1998 | Nakayama et al. | |
| 5,828,640 A | * 10/1998 | Kobayashi | 369/59.23 |
| 5,926,446 A | 7/1999 | Shimizu | |
| 6,064,774 A | 5/2000 | Takatsu et al. | |
| 6,127,100 A | 10/2000 | Shimizu | |
| 6,272,242 B1 | 8/2001 | Saitoh et al. | |
| 6,333,704 B1 | * 12/2001 | Jung et al. | 341/58 |
| 6,487,149 B1 | 11/2002 | Yokoi et al. | |
| 6,604,219 B1 | * 8/2003 | Lee et al. | 714/769 |
| 2002/0021643 A1 | 2/2002 | Miura et al. | |
| 2002/0036978 A1 | 3/2002 | Shimizu | |
| 2002/0071380 A1 | 6/2002 | Shimizu et al | |

\* cited by examiner

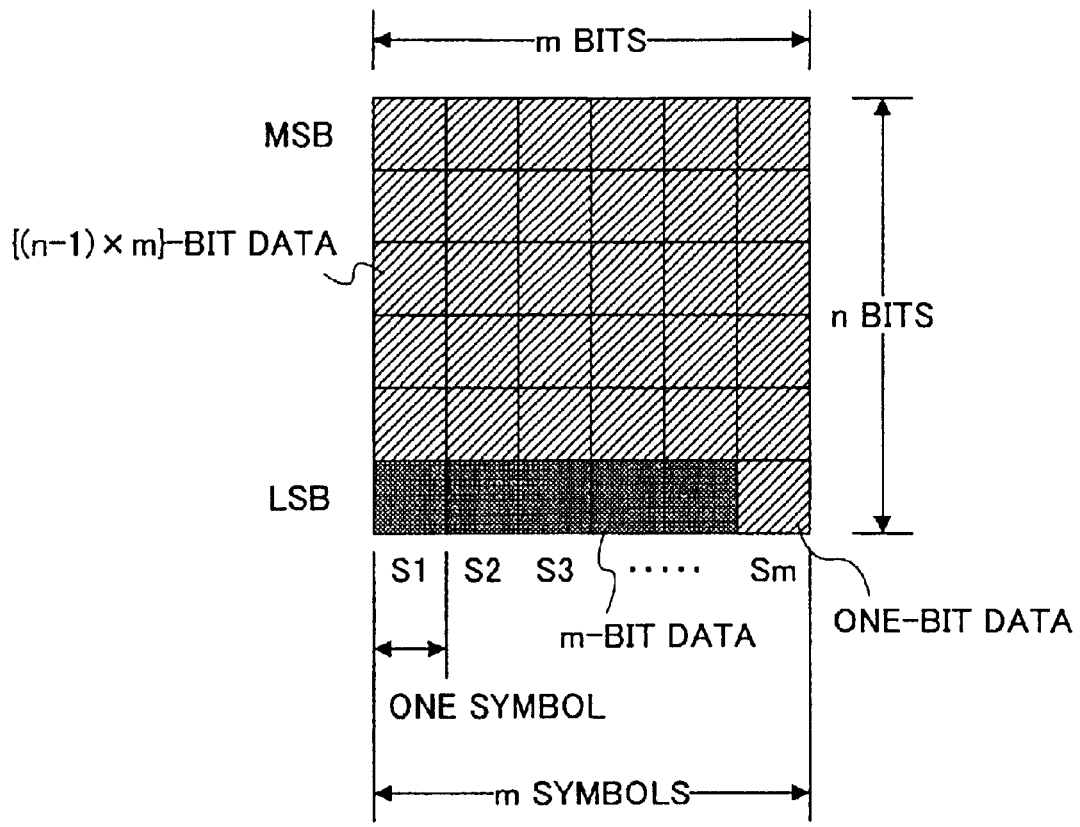

FIG.4

|   | (a) | (b) |
|---|---|---|
| 00 | 000 | 111 |
| 01 | 011 | 100 |
| 10 | 101 | 010 |
| 11 | 110 | 001 |

FIG.5

|   | (a) | (b) |
|---|---|---|
| 000 | 0000 | 0001 |
| 001 | 0011 | 0010 |
| 010 | 0101 | 0100 |
| 011 | 0110 | 0111 |
| 100 | 1001 | 1000 |
| 101 | 1010 | 1011 |
| 110 | 1100 | 1101 |
| 111 | 1111 | 1110 |

FIG.7

| SIGNAL DATA VALUE OF INPUT SYMBOL | CANDIDATE SYMBOL VALUE |
|---|---|
| 14, 15 | 3 |
| 10~13 | 2, 3 |
| 6~9 | 1, 2 |
| 2~5 | 0, 1 |
| 0, 1 | 0 |

FIG.8

| SIGNAL DATA VALUE OF INPUT SYMBOL | CANDIDATE SYMBOL VALUE |
|---|---|
| 28~31 | 3 |
| 20~27 | 2, 3 |
| 12~19 | 1, 2 |
| 4~11 | 0, 1 |
| 0~3 | 0 |

FIG.12

| SIGNAL DATA VALUE OF INPUT SYMBOL | CANDIDATE SYMBOL VALUE | IDEAL SIGNAL DATA VALUE | EVEN/ODD DISTINCTION |
|---|---|---|---|
| 10~15 | 2 | 10 | EVEN |
| 10~15 | 3 | 14 | ODD |
| 6~9 | 2 | 10 | EVEN |
| 6~9 | 1 | 6 | ODD |
| 0~5 | 0 | 2 | EVEN |
| 0~5 | 1 | 6 | ODD |

(a) RECORDING MARK
(b) REPRODUCTION SIGNAL — TIME LENGTH — TIME
(c) DATA DISTRIBUTION
SYMBOL VALUE → 0 1 2 3

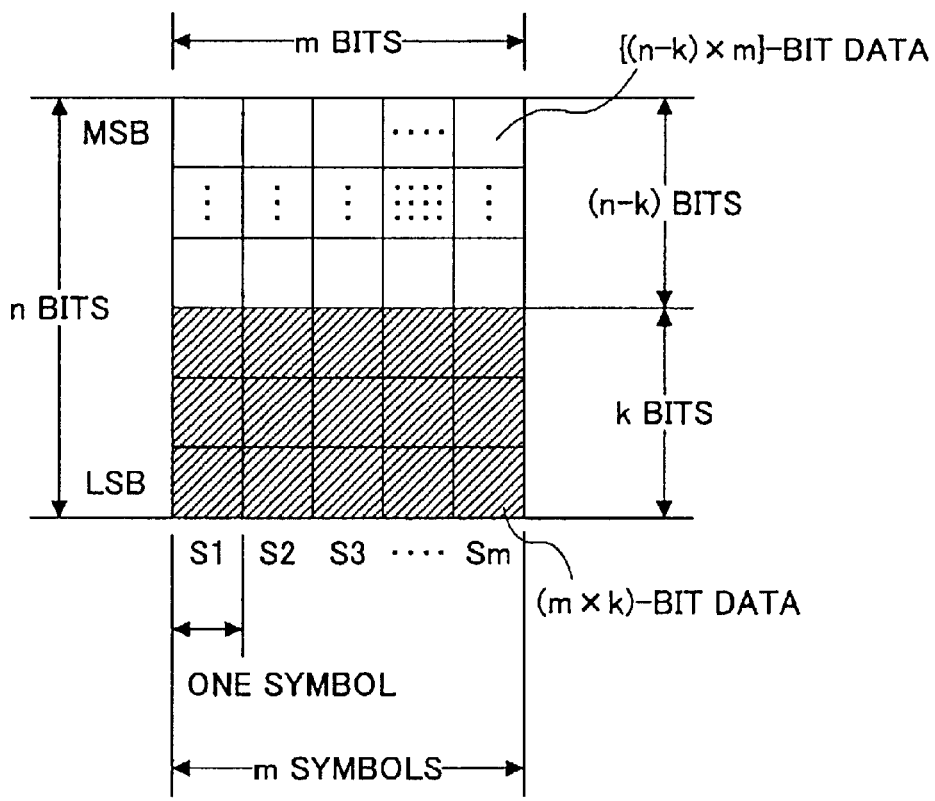

|  | (a) | | | | (b) | | | |
|---|---|---|---|---|---|---|---|---|
|  | b0 | b1 | b2 | b3 | b0 | b1 | b2 | b3 |
| 000 | 0 | 0 | 0 | 0 | 0 | 0 | 0 | 1 |
| 001 | 0 | 0 | 1 | 1 | 0 | 0 | 1 | 0 |
| 010 | 0 | 1 | 0 | 1 | 0 | 1 | 0 | 0 |
| 011 | 0 | 1 | 1 | 0 | 0 | 1 | 1 | 1 |
| 100 | 1 | 0 | 0 | 1 | 1 | 0 | 0 | 0 |
| 101 | 1 | 0 | 1 | 0 | 1 | 0 | 1 | 1 |
| 110 | 1 | 1 | 0 | 0 | 1 | 1 | 0 | 1 |
| 111 | 1 | 1 | 1 | 1 | 1 | 1 | 1 | 0 |

FIG.21

| b0 | b1 | b2 | b3 | (a) | | | (b) | | | SYMBOL VALUE STRING | |
|---|---|---|---|---|---|---|---|---|---|---|---|
| | | | | d0 | b0 | b1 | d1 | b2 | b3 | S1 | S2 |
| 0 | 0 | 0 | 0 | 1 | 0 | 0 | 0 | 0 | 0 | 4 | 0 |
| 0 | 0 | 1 | 1 | 1 | 0 | 0 | 0 | 1 | 1 | 4 | 3 |
| 0 | 1 | 0 | 1 | 1 | 0 | 1 | 0 | 0 | 1 | 5 | 1 |
| 0 | 1 | 1 | 0 | 1 | 0 | 1 | 0 | 1 | 0 | 5 | 2 |
| 1 | 0 | 0 | 1 | 1 | 1 | 0 | 0 | 0 | 1 | 6 | 1 |
| 1 | 0 | 1 | 0 | 1 | 1 | 0 | 0 | 1 | 0 | 6 | 2 |
| 1 | 1 | 0 | 0 | 0 | 1 | 1 | 0 | 0 | 0 | 3 | 0 |
| 1 | 1 | 1 | 1 | 0 | 1 | 1 | 0 | 1 | 1 | 3 | 3 |

| SYMBOL OF MULTI-LEVEL DATA | | | SIGNAL VALUE OF CENTER MULTI-LEVEL DATA |
|---|---|---|---|
| PRECEDING | CENTER | SUCCEEDING | |
| 0 | 0 | 0 | T (0, 0, 0) |
| 0 | 0 | 1 | T (0, 0, 1) |
| 0 | 0 | 2 | T (0, 0, 2) |
| ⋮ | ⋮ | ⋮ | ⋮ |
| p | q | r | T (p, q, r) |
| ⋮ | ⋮ | ⋮ | ⋮ |
| 7 | 7 | 6 | T (7, 7, 6) |
| 7 | 7 | 7 | T (7, 7, 7) |

DATA PROCESSING METHOD, CIRCUIT, AND APPARATUS WITH INCREASED ACCURACY

BACKGROUND OF THE INVENTION

1. Field of the Invention

The present invention generally relates to data processing methods, circuits, and apparatuses, and more particularly to a data processing method that is useful in recording a multi-level signal on and reproducing a multi-level signal from an information recording medium such as an optical disk (for instance, a CD-R disk, a CD-RW disk, or a DVD disk), a magneto-optical disk, a magnetic disk, or a magnetic tape, or in transmitting and receiving a multi-level signal through a wireless or wire transmission path, a data processing circuit mounted in an information storage device or a communication device to which the data processing method is applied, and a data processing apparatus, such as an information storage device or a communication device, to which the data processing method is applied.

2. Description of the Related Art

Japanese Laid-Open Patent Application No. 8-124167 discloses an optical information recording and reproduction method and apparatus that, in processing a multi-level information signal reproduced from a recording medium, detect data with an excellent eye opening obtained by performing equalization (waveform equalization) to eliminate intersymbol interference between adjacent data.

Normally, it is a premise in information recording and reproduction to obtain an excellent eye opening by performing signal processing such as waveform equalization as in the above-mentioned prior art technology. As recording density becomes higher, however, intersymbol interference increases, so that waveform equalization reaches its limit. As a result, an excellent eye opening cannot be obtained, resulting in the problem of incorrect detection of data at the time of data reproduction.

According to a conventional multi-level data processing method, test data for all the combinations of a plurality of (three) succeeding multi-level data are recorded on an information recording medium, and a table recording the reproduced signal values of the test data is created at the time of reproducing multi-level data so that multi-level data whose error between its reproduced signal values and the signal values recorded in the table is minimum is output as reproduced multi-level data.

Further, according to another conventional method of determining multi-level data using such a table, after determining multi-level data on both ends of the three succeeding multi-level data by using fixed thresholds, multi-level data that minimizes an error between its center reproduced signal value and a signal value in the table is output as reproduced multi-level data. Thereby, the accuracy of determination is increased with the compact table.

According to yet another conventional method of determining multi-level data, with a plurality of multi-level data being treated as a set, binary data is converted to multi-level data by arranging the binary data directly in upper-side bits of the multi-level data and arranging data in the remaining lower-side bits of the multi-level data in accordance with a predetermined conversion rule. At the time of reproducing the multi-level data, since the lower-side bits thereof are likely to be determined wrongly, the multi-level data is determined using the fact that the lower-side bits of the multi-level data comply with the predetermined rule.

According to this method of processing multi-level data, at the time of recording or transmitting multi-level data of n bits per symbol (n is an integer satisfying n≧2), with m symbols (m is an integer satisfying m≧2) being a set, binary data is arranged in the upper-side (n−1)×m bits ((n−1) bits×m symbols) of the m symbols and binary data obtained by converting m−1 bits to m bits (corresponding to the predetermined conversion rule) is arranged in the lower-side bits of the m symbols. Thereby, one bit of redundancy data is generated due to the predetermined conversion rule, while the accuracy in multi-level data determination is increased.

Further, the data is arranged in the lower-side bits of the multi-level data in accordance with the predetermined conversion rule in the above-described processing, which is effective when a data error is limited to the lower-side bits at the time of reproducing multi-level data. However, if the data error occurs beyond the lower-side bits, the multi-level data is wrongly determined. Therefore, there has been proposed a multi-level data processing method by which data is arranged in the lower-side k bits of multi-level data in accordance with a predetermined conversion rule.

According to this multi-level data processing method, at the time of recording or transmitting multi-level data of n bits per symbol (n is an integer satisfying n≧2), with m symbols (m is an integer satisfying m≧2) being a set, binary data is arranged in the upper-side (n−k)×m bits ((n−k) bits×m symbols) (k is an integer satisfying n>k≧1) of the m symbols and binary data obtained by converting m×k−1 bits to m×k bits (corresponding to the predetermined conversion rule) is arranged in the lower-side m×k bits (lower-side k bits×m symbols) of the m symbols. By thus arranging the data in the lower-side k bits of the m symbols, accuracy in multi-level data determination is increased even if characteristically, errors are likely to occur in the transmission path of data, such as an information recording medium (an optical disk, for instance) or a communication path.

The above-described multi-level data processing methods are kinds of pattern recognition methods that recognize intersymbol interference that occurs at the time of recording successive multi-level data sets as interrelationships among the successive multi-level data sets. Therefore, when the multi-level data can take numerous values or a reproduction signal includes much noise, patterns in a table become less distinctive so that the multi-level data is likely to be determined wrongly.

Further, at the time of reproducing multi-level data, first, a reproduction signal is subjected to waveform equalization to eliminate intersymbol interference therefrom, and then candidate multi-level data are output based on fixed thresholds. Thereafter, candidate multi-level data whose lower-side bit data complies with a predetermined conversion rule are selected, so that candidate multi-level data having a minimum error is output as reproduced multi-level data. Therefore, intersymbol interference remains slightly after the waveform equalization. This may cause an error at the time of outputting candidate multi-level data based on fixed thresholds, leading to the problem that the final reproduced multi-level data is wrongly determined.

SUMMARY OF THE INVENTION

Accordingly, it is a general object of the present invention to provide a data processing method, circuit, and apparatus in which the above-described disadvantage is eliminated.

A more specific object of the present invention is to provide a data processing method, circuit, and apparatus by which multi-level data can be reproduced with more simplicity and accuracy than conventionally.

The above objects of the present invention are achieved by a data processing method of converting (n×m−1)-bit data to multi-level data of m symbols of n bits per symbol, n and m being integers satisfying n≧2 and m≧2, respectively, wherein the m symbols each including n-bit data are arranged in m columns in an n×m matrix, with a value of each of the m symbols being set to an even or odd number, by creating the m symbols each including (n−1)-bit data of the (n×m−1)-bit data, arranging the m symbols in the m columns so that the {(n−1)×m}-bit data is arranged in upper-side {(n−1)×m} bits of the n×m matrix, and converting the remaining (m−1)-bit data of the (n×m−1)-bit data to m-bit data so that the m-bit data is arranged in a row in lower-side m bits of the n×m matrix.

The above objects of the present invention are also achieved by a data processing method of determining a value of each of m symbols of a set of a multi-level signal based on input signal data of the m symbols obtained after quantizing the multi-level signal recorded on an information recording medium or transmitted to a transmission path and reproduced from the information recording medium or received from the transmission path, in which multi-level signal each of the m symbols is formed of n-bit data, the set is formed of the m symbols, {(n−1)×m}-bit data is arranged in upper-side (n−1) bits of the m symbols, (m−1)-bit data is converted to m-bit data, and the value of each of the m symbols is set to an even or odd number by arranging the m-bit data in the remaining lower-side bits of the m symbols, n and m being integers satisfying n≧2 and m≧2, respectively, wherein: $2^{(m-1)}$ ideal signal data value strings corresponding to symbol value strings of even and odd symbol values closest to input signal data values of the m symbols of the set are determined, the symbol value strings corresponding to $2^{(m-1)}$ m-bit data patterns of m even and odd numbers based on one of which data patterns the (m−1)-bit data is converted to the m-bit data; a sum of errors between the input signal data values and ideal signal data values of each of the ideal signal data value strings is calculated; and one of the symbol value strings is determined to be multi-level data of the set, the one of the symbol value strings corresponding to one of the ideal signal value strings which one has the minimum sum of errors.

The above objects of the present invention are also achieved by a data processing method of determining a value of each of m symbols of a set of a multi-level signal based on input signal data of the m symbols obtained after quantizing the multi-level signal recorded on an information recording medium or transmitted to a transmission path and reproduced from the information recording medium or received from the transmission path, in which multi-level signal: each of the m symbols is formed of n-bit data; the set is formed of the m symbols; {(n−1)×m}-bit data is arranged in upper-side (n−1) bits of the m symbols; (m−1)-bit data is converted to m-bit data based on one of first and second tables of different types each created to store $2^{(m-1)}$ m-bit data patterns selected from $2^m$ m-bit data patterns, the first table being selected in the case of a numeric string for selecting the one of the first and second tables for a given set=0 and the second table being selected in the case of the numeric string=1, the numeric string being started from an initial value corresponding to a first set and using a result of a logical operation on a value of the numeric string for an (i−1)th set and predetermined data in the (i−1)th set as a value of the predetermined numeric string for an ith set, i being an integer satisfying i≧2; and the value of each of the m symbols is set to an even or odd number by arranging the m-bit data in the remaining lower-side bits of the m symbols, n and m being integers satisfying n≧2 and m≧2, respectively, wherein: $2^{(m-1)}$ ideal signal data value strings corresponding to symbol value strings of even and odd symbol values closest to input signal data values of the m symbols of each of a target set and one or a plurality of succeeding sets in each of cases of the numeric string=0 and 1 are determined, the symbol value strings corresponding to patterns of even and odd numbers on the selected one of the first and second tables; a sum of errors between the input signal data values and ideal signal data values of each of the ideal signal data value strings is calculated with respect to the m symbols of each of the target and the one or plurality of succeeding sets; one of the symbol value strings which one corresponds to one of the ideal signal value strings which one has the minimum sum of errors is determined, with respect to each of the target and the one or plurality of succeeding sets in each of the cases of the numeric string=0 and 1, to be temporary multi-level data of each of the target and the one or plurality of succeeding sets; and one of the symbol value strings of the target set which one corresponds to one of combinations of the temporary multi-level data of the target set and the one or plurality of succeeding sets which one minimizes a total of the sums of errors of the temporary multi-level data of the target set and the one or plurality of the succeeding sets is determined to be multi-level data of the target set, the combinations being made in accordance with the numeric string.

The above objects of the present invention are also achieved by a data processing circuit including: (n−1) first selector circuits each supplied with different m-bit data of (n×m−1)-bit parallel data and outputting one-bit data of the supplied m-bit data, n and m being integers satisfying n≧2 and m≧2, respectively; a converter circuit supplied with the remaining (m−1)-bit data of the (n×m−1)-bit parallel data and converting the supplied (m−1)-bit data to m-bit data; and a second selector circuit supplied with the m-bit data output from the converter circuit and outputting one-bit data of the supplied m-bit data, wherein the (n×m−1)-bit parallel data is output as n-bit parallel data.

The above objects of the present invention are also achieved by a data processing circuit including: an output circuit supplied with signal data values obtained after quantizing a multi-level signal whose one symbol is formed of n-bit data and outputting ideal signal data values corresponding to even and odd symbol values closest to each of the supplied signal data values, n being an integer satisfying n≧2; a first calculator circuit calculating errors between the supplied signal data values and the respective ideal signal data values; a plurality of first register circuits retaining the errors calculated in the first calculator circuit; a second calculator circuit calculating a sum of errors of each of predetermined combinations of the errors output from the first register circuits; a plurality of second register circuits retaining the sums calculated in the second calculator circuit; a minimum value detector circuit detecting a minimum value of the sums output from the second register circuits; and a control circuit outputting a symbol value string that is n-bit parallel data, the symbol value string corresponding to the minimum value detected in the minimum value detector circuit.

The above objects of the present invention are also achieved by a signal processing circuit including: (n−1) first selector circuits each supplied with different m-bit data of (n×m−1)-bit parallel data and outputting one-bit data of the supplied m-bit data, n and m being integers satisfying n≧2 and m≧2, respectively; a converter circuit supplied with the remaining (m−1)-bit data of the (n×m−1)-bit parallel data and converting the supplied (m−1)-bit data to m-bit data; a second selector circuit supplied with the m-bit data output from the converter circuit and outputting one-bit data of the supplied m-bit data; a first control circuit outputting the (n×m−1)-bit parallel data as n-bit parallel data; an output circuit supplied with signal data values obtained after quantizing a multi-level signal whose one symbol is formed of n-bit data and outputting ideal signal data values corresponding to even and odd symbol values closest to each of the supplied signal data values; a first calculator circuit calculating errors between the supplied signal data values and the respective ideal signal data values; a plurality of first register circuits retaining the errors calculated in the first calculator circuit; a second calculator circuit calculating a sum of errors of each of predetermined combinations of the errors output from the first register circuits; a plurality of second register circuits retaining the sums calculated in the second calculator circuit; a minimum value detector circuit detecting a minimum value of the sums output from the second register circuits; and a second control circuit outputting a symbol value string that is n-bit parallel data, the symbol value string corresponding to the minimum value detected in the minimum value detector circuit.

The above objects of the present invention are also achieved by a data processing apparatus including: a first part arranging {(n−1)×m}-bit data in upper-side (n−1) bits of m symbols of a set, each of the m symbols being formed of n-bit data, the set being formed of the m symbols, n and m being integers satisfying $n \geq 2$ and $m \geq 2$, respectively; a second part converting (m−1)-bit data to m-bit data; a third part setting a value of each of the m symbols of the set to an even or odd number by arranging the m-bit data in the remaining lower-side bits of the m symbols; and a fourth part having the m symbols recorded on an information recording medium or transmitted to a transmission path as a multi-level signal.

The above objects of the present invention are also achieved by a data processing apparatus including: a first part supplied with a multi-level signal whose one symbol is formed of n-bit data as a signal reproduced from an information recording medium or received from a transmission path, n being an integer satisfying $n \geq 2$; a second part supplied with signal data values obtained after quantizing the multi-level signal and outputting ideal signal data values corresponding to even and odd symbol values closest to each of the supplied signal data values; a third part calculating errors between the signal data values obtained after quantizing the multi-level signal and the respective ideal signal data values output from the second part; a plurality of first data retaining parts retaining the errors calculated in the third part; a fourth part calculating a sum of errors of each of predetermined combinations of the errors output from the first data retaining parts; a plurality of second data retaining parts retaining the sums calculated in the fourth part; a fifth part obtaining a minimum value of the sums output from the second data retaining parts; and a control part outputting a symbol value string that is n-bit parallel data, the symbol value string corresponding to the minimum value obtained in the fifth part.

The above objects of the present invention are also achieved by a data processing apparatus including: a first part arranging {(n−1)×m}-bit data in upper-side (n−1) bits of m symbols of a set, each of the m symbols being formed of n-bit data, the set being formed of the m symbols, n and m being integers satisfying $n \geq 2$ and $m \geq 2$, respectively; a second part converting (m−1)-bit data to m-bit data; a third part setting a value of each of the m symbols of the set to an even or odd number by arranging the m-bit data in the remaining lower-side bits of the m symbols; a fourth part having the m symbols recorded on an information recording medium or transmitted to a transmission path as a multi-level signal; a fifth part supplied with a multi-level signal whose one symbol is formed of n-bit data as a signal reproduced from an information recording medium or received from a transmission path; a sixth part supplied with signal data values obtained after quantizing the multi-level signal and outputting ideal signal data values corresponding to even and odd symbol values closest to each of the supplied signal data values; a seventh part calculating errors between the signal data values obtained after quantizing the multi-level signal and the respective ideal signal data values output from the sixth part; a plurality of first data retaining parts retaining the errors calculated in the seventh part; an eighth part calculating a sum of errors of each of predetermined combinations of the errors output from the first data retaining parts; a plurality of second data retaining parts retaining the sums calculated in the eighth part; a ninth part obtaining a minimum value of the sums output from the second data retaining parts; and a control part outputting a symbol value string that is n-bit parallel data, the symbol value string corresponding to the minimum value obtained in the ninth part.

The above objects of the present invention are also achieved by a data processing method of converting data to multi-level data of n bits per symbol, n being an integer satisfying $n \geq 2$, wherein: a set is formed of m symbols, m being an integer satisfying $m \geq 2$; {(n−k)×m}-bit data is arranged in upper-side (n−k) bits of the m symbols of the set, k being an integer satisfying $n > k \geq 1$; and (m×k−1)-bit data is converted to (m×k)-bit data to be arranged in the remaining lower-side k bits of the m symbols of the set.

The above objects of the present invention are also achieved by a data processing method of determining a value of each of m symbols of a set of a multi-level signal based on input signal data of the m symbols obtained after quantizing the multi-level signal recorded on an information recording medium or transmitted to a transmission path and reproduced from the information recording medium or received from the transmission path, in which multi-level signal each of the m symbols is formed of n-bit data, the set is formed of the m symbols, {(n−k)×m}-bit data is arranged in upper-side (n−k) bits of the m symbols, and (m×k−1)-bit data is converted to (m×k)-bit data to be arranged in the remaining lower-side k bits of the m symbols, n, m, and k being integers satisfying $n \geq 2$, $m \geq 2$, and $n > k \geq 1$, respectively, wherein: $2^{(m \times k - 1)}$ ideal signal data value strings corresponding to symbol value strings of even and odd symbol values closest to input signal data values of the m symbols of the set are determined, the symbol value strings corresponding to $2^{(m \times k - 1)}$ (m×k)-bit data patterns of m even and odd numbers based on one of which data patterns the (m×k−1)-bit data is converted to the (m×k)-bit data; a sum of errors between the input signal data values and ideal signal data values of each of the ideal signal data value strings is calculated; and one of the symbol value strings is determined to be multi-level data of the set, the one of the symbol value strings corresponding to one of the ideal signal value strings which one has the minimum sum of errors.

The above objects of the present invention are achieved by a data processing method of determining a value of each of m symbols of a set of a multi-level signal based on input signal data of the m symbols obtained after quantizing the multi-level signal recorded on an information recording medium or transmitted to a transmission path and reproduced from the information recording medium or received from the transmission path, in which multi-level signal: each of the m symbols is formed of n-bit data; the set is formed of the m symbols; {(n−k)×m}-bit data is arranged in upper-side (n−k) bits of the m symbols; (m×k−1)-bit data is converted to (m×k)-bit data based on one of first and second tables of different types each created to store $2^{(m \times k-1)}$ (m×k)-bit data patterns selected from $2^{(m \times k)}$ (m×k)-bit data patterns, the first table being selected in the case of a numeric string for selecting the one of the first and second tables for a given set=0 and the second table being selected in the case of the numeric string=1, the numeric string being started from an initial value corresponding to a first set and using a result of a logical operation on a value of the numeric string for an (i−1)th set and predetermined data in the (i−1)th set as a value of the predetermined numeric string for an ith set, i being an integer satisfying i≧2; and the (m×k)-bit data is arranged in the remaining lower-side k bits of the m symbols, n, m, and k being integers satisfying n≧2, m≧2, and n>k≧1, respectively, wherein: $2^{(m \times k-1)}$ ideal signal data value strings corresponding to symbol value strings of even and odd symbol values closest to input signal data values of the m symbols of each of a target set and one or a plurality of succeeding sets in each of cases of the numeric string=0 and 1 are determined, the symbol value strings corresponding to patterns of even and odd numbers on the selected one of the first and second tables; a sum of errors between the input signal data values and ideal signal data values of each of the ideal signal data value strings is calculated with respect to the m symbols of each of the target and the one or plurality of succeeding sets; one of the symbol value strings which one corresponds to one of the ideal signal value strings which one has the minimum sum of errors is determined, with respect to each of the target and the one or plurality of succeeding sets in each of the cases of the numeric string=0 and 1, to be temporary multi-level data of each of the target and the one or plurality of succeeding sets; and one of the symbol value strings of the target set which one corresponds to one of combinations of the temporary multi-level data of the target set and the one or plurality of succeeding sets which one minimizes a total of the sums of errors of the temporary multi-level data of the target set and the one or plurality of the succeeding sets is determined to be multi-level data of the target set, the combinations being made in accordance with the numeric string.

The above objects of the present invention are also achieved by a data processing circuit including: (n−k) first selector circuits each supplied with different m-bit data of (n×m−1)-bit parallel data and outputting one-bit data of the supplied m-bit data, n, m, and k being integers satisfying n≧2, m≧2, and n>k≧1, respectively; a converter circuit supplied with the remaining (m×k−1)-bit data of the (n×m−1)-bit parallel data and converting the supplied (m×k−1)-bit data to (m×k)-bit data; and a second selector circuit supplied with the (m×k)-bit data output from the converter circuit and outputting one-bit data of the supplied (m×k)-bit data, wherein the (n×m−1)-bit parallel data is output as n-bit parallel data.

The above objects of the present invention are also achieved by a data processing circuit including: an output circuit supplied with signal data values obtained after quantizing a multi-level signal whose one symbol is formed of n-bit data and outputting ideal signal data values corresponding to a plurality of symbol values closest to each of the supplied signal data values, n being an integer satisfying n≧2; a first calculator circuit calculating errors between the supplied signal data values and the respective ideal signal data values; a plurality of first register circuits retaining the errors calculated in the first calculator circuit; a second calculator circuit calculating a sum of errors of each of predetermined combinations of the errors output from the first register circuits; a plurality of second register circuits retaining the sums calculated in the second calculator circuit; a minimum value detector circuit detecting a minimum value of the sums output from the second register circuits; and a control circuit outputting a symbol value string that is n-bit parallel data, the symbol value string corresponding to the minimum value detected in the minimum value detector circuit.

The above objects of the present invention are also achieved by a signal processing circuit including: (n−k) first selector circuits each supplied with different m-bit data of (n×m−1)-bit parallel data and outputting one-bit data of the supplied m-bit data, n, m, and k being integers satisfying n≧2, m≧2, and n>k≧1, respectively; a converter circuit supplied with the remaining (m×k−1)-bit data of the (n×m−1)-bit parallel data and converting the supplied (m×k−1)-bit data to (m×k)-bit data; and a second selector circuit supplied with the (m×k)-bit data output from the converter circuit and outputs one-bit data of the supplied (m×k)-bit data; a first control circuit outputting the (n×m−1)-bit parallel data as n-bit parallel data; an output circuit supplied with signal data values obtained after quantizing a multi-level signal whose one symbol is formed of n-bit data and outputting ideal signal data values corresponding to a plurality of symbol values closest to each of the supplied signal data values; a first calculator circuit calculating errors between the supplied signal data values and the respective ideal signal data values; a plurality of first register circuits retaining the errors calculated in the first calculator circuit; a second calculator circuit calculating a sum of errors of each of predetermined combinations of the errors output from the first register circuits; a plurality of second register circuits retaining the sums calculated in the second calculator circuit; a minimum value detector circuit detecting a minimum value of the sums output from the second register circuits; and a second control circuit outputting a symbol value string that is n-bit parallel data, the symbol value string corresponding to the minimum value detected in the minimum value detector circuit.

The above objects of the present invention are also achieved by a data processing apparatus including: a first part arranging {(n−k)×m}-bit data in upper-side (n−k) bits of m symbols of a set, each of the m symbols being formed of n-bit data, the set being formed of the m symbols, n, m, and k being integers satisfying n≧2, m≧2, n>k≧1, respectively; a second part converting (m×k−1)-bit data to (m×k)-bit data; a third part arranging the m-bit data in the remaining lower-side k bits of the m symbols; and a fourth part having the m symbols recorded on an information recording medium or transmitted to a transmission path as a multi-level signal.

The above objects of the present invention are also achieved by a data processing apparatus including: a first part supplied with a multi-level signal whose one symbol is formed of n-bit data as a signal reproduced from an information recording medium or received from a transmission path, n being an integer satisfying n≧2; a second part supplied with signal data values obtained after quantizing the multi-level signal and outputting ideal signal data values corresponding to a plurality of symbol values closest to each of the supplied signal data values; a third part calculating errors between the signal data values obtained after quantizing the multi-level signal and the respective ideal signal data values output from the second part; a plurality of first data retaining parts retaining the errors calculated in the third part; a fourth part calculating a sum of errors of each of predetermined combinations of the errors output from the first data retaining parts; a plurality of second data retaining parts retaining the sums calculated in the fourth part; a fifth part obtaining a minimum value of the sums output from the second data retaining parts; and a control part outputting a symbol value string that is n-bit parallel data, the symbol value string corresponding to the minimum value obtained in the fifth part.

The above objects of the present invention are also achieved by a data processing apparatus including: a first part arranging $\{(n-k) \times m\}$-bit data in upper-side (n–k) bits of m symbols of a set, each of the m symbols being formed of n-bit data, the set being formed of the m symbols, n, m, and k being integers satisfying $n \geq 2$, $m \geq 2$, $n > k \geq 1$, respectively; a second part converting $(m \times k-1)$-bit data to $(m \times k)$-bit data; a third part arranging the m-bit data in the remaining lower-side k bits of the m symbols; and a fourth part having the m symbols recorded on an information recording medium or transmitted to a transmission path as a multi-level signal; a fifth part supplied with a multi-level signal whose one symbol is formed of n-bit data as a signal reproduced from the information recording medium or received from the transmission path; a sixth part supplied with signal data values obtained after quantizing the multi-level signal and outputting ideal signal data values corresponding to a plurality of symbol values closest to each of the supplied signal data values; a seventh part calculating errors between the signal data values obtained after quantizing the multi-level signal and the respective ideal signal data values output from the sixth part; a plurality of first data retaining parts retaining the errors calculated in the seventh part; an eighth part calculating a sum of errors of each of predetermined combinations of the errors output from the first data retaining parts; a plurality of second data retaining parts retaining the sums calculated in the eighth part; a ninth part obtaining a minimum value of the sums output from the second data retaining parts; and a control part outputting a symbol value string that is n-bit parallel data, the symbol value string corresponding to the minimum value obtained in the ninth part.

The above objects of the present invention are also achieved by a multi-level data processing method for converting binary data to multi-level data of n bits per symbol and recording the multi-level data and test data on an information recording medium, the test data including $2^{(M \times n)}$ combinations of M successive multi-level data, n and M being integers satisfying $n \geq 2$ and $M \geq 3$, respectively, wherein: one set is formed of m symbols of multi-level data, m being an integer satisfying $m \geq 2$; $\{(n-k) \times m\}$-bit binary data of $(n \times m-1)$-bit binary data is arranged in upper-side (n–k) bits of m symbols of a set, k being an integer satisfying $n > k \geq 1$; and the remaining $(m \times k-1)$-bit binary data of the $(n \times m-1)$-bit binary data is converted to $(m \times k)$ bits to be arranged in the remaining lower-side k bits of the m symbols of the set, whereby the binary data is converted to the multi-level data.

The above objects of the present invention are also achieved by a multi-level data processing method for converting binary data to multi-level data of n bits per symbol, recording the multi-level data and test data on an information recording medium, and reproducing the multi-level data from the information recording medium, the test data including $2^{(M \times n)}$ combinations of M successive multi-level data, n and M being integers satisfying $n \geq 2$ and $M \geq 3$, respectively, wherein: at a time of recording the multi-level data, one set is formed of m symbols of multi-level data, m being an integer satisfying $m \geq 2$; $\{(n-k) \times m\}$-bit binary data of $(n \times m-1)$-bit binary data is arranged in upper-side (n–k) bits of m symbols of a set, k being an integer satisfying $n > k \geq 1$; and the remaining $(m \times k-1)$-bit binary data of the $(n \times m-1)$-bit binary data is converted to $(m \times k)$ bits to be arranged in the remaining lower-side k bits of the m symbols of the set, whereby the binary data is converted to the multi-level data; and at a time of reproducing the multi-level data, signal values of multi-level data are stored in a table by inputting a reproduction signal of the test data; the multi-level data to which the binary data is converted is reproduced to be input as a signal so that first multi-level data minimizing an error between signal values of the input multi-level data and corresponding signal values stored in the table is output; lower-side k bits of m symbols of a target set of the first multi-level data are compared with conversion data for converting the $(m \times k-1)$-bit binary data to the $(m \times k)$ bits; and one of candidate multi-level data corresponding to the conversion data which one has signal values having a minimum error with respect to the signal values of the input multi-level data is output as second multi-level data and the second multi-level data is output as reproduced multi-level data when the lower-side k bits match none of the conversion data, and the first multi-level data is output as the reproduced multi-level data when the lower-side k bits match any of the conversion data.

The above objects of the present invention are also achieved by a multi-level data processing method for converting binary data to multi-level data of n bits per symbol, recording the multi-level data and test data on an information recording medium, and reproducing the multi-level data from the information recording medium, the test data including $2^{(M \times n)}$ combinations of M successive multi-level data, n and M being integers satisfying $n \geq 2$ and $M \geq 3$, respectively, wherein: at a time of recording the multi-level data, one set is formed of m symbols of multi-level data, m being an integer satisfying $m \geq 2$; $\{(n-k) \times m\}$-bit binary data of $(n \times m-1)$-bit binary data is arranged in upper-side (n–k) bits of m symbols of a set, k being an integer satisfying $n > k \geq 1$; and the remaining $(m \times k-1)$-bit binary data of the $(n \times m-1)$-bit binary data is converted to $(m \times k)$ bits to be arranged in the remaining lower-side k bits of the m symbols of the set, whereby the binary data is converted to the multi-level data; and at a time of reproducing the multi-level data, signal values of multi-level data are stored in a table by inputting a reproduction signal of the test data; the multi-level data to which the binary data is converted is reproduced to be input as a signal so that first multi-level data minimizing an error between signal values of the input multi-level data and corresponding signal values stored in the table is output; lower-side k bits of m symbols of a target set of the first multi-level data are compared with conversion data for converting the $(m \times k-1)$-bit binary data to the $(m \times k)$ bits; and one of strings of candidate multi-level data of a plurality of successive sets including the target set is selected, the one of the strings having signal values having a minimum error with respect to input signal values of the sets, the candidate multi-level data corresponding to the conversion data, and candidate multi-level data of the target set in the selected one of the strings is output as second multi-level data of the target set so that the second multi-level data is output as reproduced multi-level data when the lower-side k bits match none of the conversion data, and the first multi-level data is output as the reproduced multi-level data when the lower-side k bits match any of the conversion data.

The above objects of the present invention are also achieved by a multi-level data processing apparatus including: a conversion part converting input binary data to multi-level data of n bits per symbol, n being an integer satisfying $n \geq 2$; a generation part generating test data including $2^{(M \times n)}$ combinations of M successive multi-level data, M being an integer satisfying $M \geq 3$; and a recording part recording the multi-level data output from the conversion part and the test data output from the generation part on an information recording medium, wherein the conversion part converts input (n×m−1)-bit binary data to multi-level data of m symbols per set, m being an integer satisfying $m \geq 2$, the conversion part including: a first part arranging {(n−k)×m}-bit binary data of the (n×m−1)-bit binary data in upper-side (n−k) bits of m symbols of a set, k being an integer satisfying $n > k \geq 1$; a second part converting the remaining (m×k−1)-bit binary data of the (m×k−1)-bit data to (m×k) bits; and a third part arranging the (m×k) bits in the remaining lower-side k bits of the m symbols of the set.

The above objects of the present invention are also achieved by a multi-level data processing apparatus including: a conversion part converting input binary data to multi-level data of n bits per symbol, n being an integer satisfying $n \geq 2$; a generation part generating test data including $2^{(M \times n)}$ combinations of M successive multi-level data, M being an integer satisfying $M \geq 3$; a recording part recording the multi-level data output from the conversion part and the test data output from the generation part on an information recording medium; and a reproduction part reproducing the multi-level data from the information recording medium, wherein: the conversion part converts input (n×m−1)-bit binary data to multi-level data of m symbols per set, m being an integer satisfying $m \geq 2$, the conversion part including: a first part arranging {(n−k)×m}-bit binary data of the (n×m−1)-bit binary data in upper-side (n−k) bits of m symbols of a set, k being an integer satisfying $n > k \geq 1$; a second part converting the remaining (m×k−1)-bit binary data of the (m×k−1)-bit data to (m×k) bits; and a third part arranging the (m×k) bits in the remaining lower-side k bits of the m symbols of the set; and the reproduction part includes: a reproduction signal output part outputting a reproduction signal from the information recording medium; a signal value output part supplied with the reproduction signal output from the reproduction signal output part and outputting signal values of multi-level data; a storage part storing the signal values of the test data output from the signal value output part in a table; a first error calculation part calculating an error between signal values of the multi-level data to which the binary data is converted and corresponding signal values stored in the table; a first multi-level data output part outputting first multi-level data minimizing the error output from the first error calculation part; a comparison part comparing lower-side k bits of m symbols of a target set of the first multi-level data with conversion data for converting the (m×k−1)-bit binary data to the (m×k) bits; a second error calculation part calculating, based on the comparison of the comparison part, an error between each of candidate multi-level data corresponding to the conversion data and the signal values of the multi-level data to which the binary data is converted; a second multi-level data output part outputting one of the candidate multi-level data which one has a minimum of the errors output from the second error calculation part as second multi-level data; and a reproduced multi-level data output part outputting, as reproduced multi-level data, the second multi-level data if the lower-side k bits match none of the conversion data in the comparison part and the first multi-level data if the lower-side k bits match any of the conversion data in the comparison part.

The above objects of the present invention are further achieved by a multi-level data processing apparatus including: a conversion part converting input binary data to multi-level data of n bits per symbol, n being an integer satisfying $n \geq 2$; a generation part generating test data including $2^{(M \times n)}$ combinations of M successive multi-level data, M being an integer satisfying $M \geq 3$; a recording part recording the multi-level data output from the conversion part and the test data output from the generation part on an information recording medium; and a reproduction part reproducing the multi-level data from the information recording medium, wherein: the conversion part converts input (n×m−1)-bit binary data to multi-level data of m symbols per set, m being an integer satisfying $m \geq 2$, the conversion part including: a first part arranging {(n−k)×m}-bit binary data of the (n×m−1)-bit binary data in upper-side (n−k) bits of m symbols of a set, k being an integer satisfying $n > k \geq 1$; a second part converting the remaining (m×k−1)-bit binary data of the (m×k−1)-bit data to (m×k) bits; and a third part arranging the (m×k) bits in the remaining lower-side k bits of the m symbols of the set; and the reproduction part includes: a reproduction signal output part outputting a reproduction signal from the information recording medium; a signal value output part supplied with the reproduction signal output from the reproduction signal output part and outputting signal values of multi-level data; a storage part storing the signal values of the test data output from the signal value output part in a table; a first error calculation part calculating an error between signal values of the multi-level data to which the binary data is converted and corresponding signal values stored in the table; a first multi-level data output part outputting first multi-level data minimizing the error output from the first error calculation part; a comparison part comparing lower-side k bits of m symbols of a target set of the first multi-level data with conversion data for converting the (m×k−1)-bit binary data to the (m×k) bits; a second error calculation part calculating, based on the comparison in the comparison part, an error between input signal values of the sets and each of strings of candidate multi-level data of a plurality of successive sets including the target set, the candidate multi-level data corresponding to the conversion data; a second multi-level data output part outputting, as second multi-level data of the target set, candidate multi-level data of the target set in one of the strings of the candidate multi-level data which one has a minimum of the errors calculated in the second error calculation part; and a reproduced multi-level data output part outputting, as reproduced multi-level data, the second multi-level data when the lower-side k bits match none of the conversion data, and the first multi-level data when the lower-side k bits match any of the conversion data.

BRIEF DESCRIPTION OF THE DRAWINGS

Other objects, features and advantages of the present invention will become more apparent from the following detailed description when read in conjunction with the accompanying drawings, in which:

FIG. 2 is a diagram showing a matrix for illustrating a data processing method according to a first embodiment of the present invention;

FIG. 3 is a table showing data patterns for illustrating a first data conversion method relating to the data processing method of the first embodiment;

FIG. 4 is a table showing data patterns for illustrating a second data conversion method relating to the data processing method of the first embodiment;

FIG. 5 is a table showing other data patterns for illustrating the second data conversion method relating to the data processing method of the first embodiment;

FIG. 7 is a table showing the relationship between the signal data value of an input symbol and its candidate symbol values according to the third embodiment of the present invention;

FIG. 8 is a table showing the relationship between the signal data value of an input symbol and its candidate symbol values according to a fourth embodiment of the present invention;

FIG. 12 is a table showing the relationship between the signal data value of an input symbol and its candidate symbol values for illustrating the operation of the data processing circuit of FIG. 11;

FIG. 16 is a diagram showing a matrix for illustrating a data processing method according to an eighth embodiment of the present invention;

FIG. 17 is a table showing data patterns for illustrating a first data conversion method relating to the data processing method of the eighth embodiment;

FIG. 21 is a diagram showing the relationship among the signal data value of an input symbol, a candidate symbol value, and a candidate symbol value string according to the tenth embodiment of the present invention;

DETAILED DESCRIPTION OF THE PREFERRED EMBODIMENTS

A description will now be given, with reference to the accompanying drawings, of embodiments of the present invention.

First, a description will be given of the conditions of a multi-level signal to which a data processing method according to the present invention is applied.

Figure 1A:
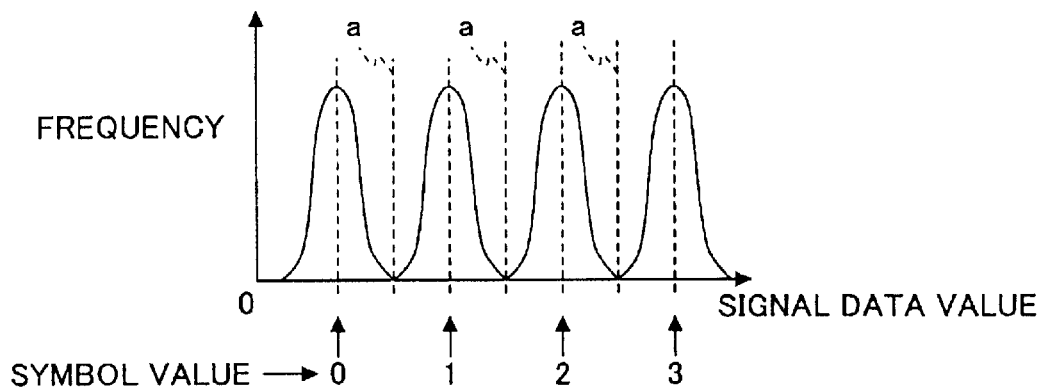
FIGS. 1A and 1B are diagrams showing distributions of waveform-equalized multi-level data for illustrating the conditions of a multi-level signal to which a data processing method of the present invention is applied.
Figure 1B:
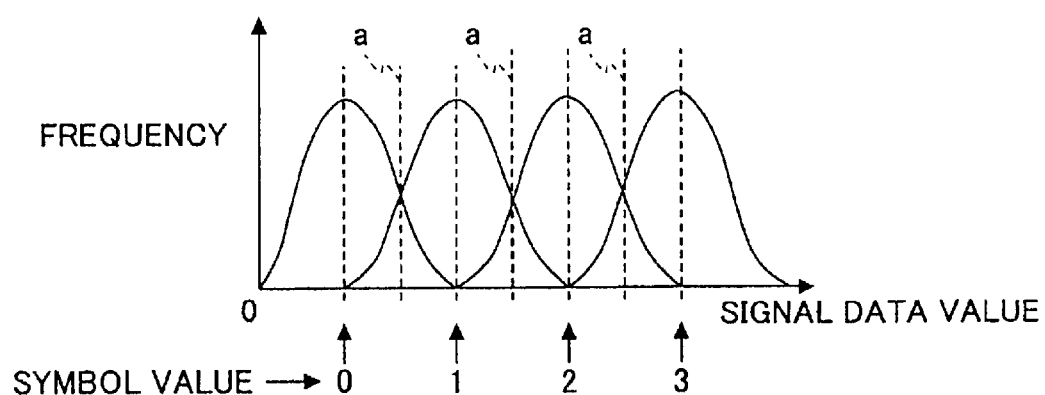

FIGS. 1A and 1B are diagrams showing distributions of multi-level data after waveform equalization. In this case, multi-level data of four values (0 through 3) are shown.

Hereinafter, one piece of multi-level data (multi-bit data) is referred to as a "symbol", and values that the symbol can take (for instance, 0 through 3) are referred to as "symbol values".

Further, a multi-level signal refers to an analog signal in the case of recording information on and reproducing information from an information recording medium such as an optical disk or in the case of transmitting or receiving information through a transmission path. Digital data to which the multi-level signal is A/D (analog-to-digital)-converted is referred to as "signal data".

If an excellent eye opening is obtained with respect to multi-level data as in the above-described prior art (see FIG. 6 of Japanese Laid-Open Patent Application No. 8-124167), signal data values are distributed as shown in FIG. 1A, so that simple data detection with thresholds "a" achieves a low error rate.

On the other hand, with a higher recording density, there are overlaps at the thresholds "a" in the distribution as shown in FIG. 1B, so that the error rate of data detection is higher.

Any data processing method according to the present invention is applicable when the signal data values of a multi-level signal are distributed to overlap only adjacent symbol values, for instance, when data distribution is such that the data of a symbol value "1" may be mistaken only for "0" or "2" but not for "3" when data detection is performed simply with the thresholds "a".

That is, any data processing method according to the present invention is applicable when the symbol value of one symbol of multi-level data is uniquely determined if it is determined whether the symbol is an even or odd number.

Next, a description will be given of a data processing method according to a first embodiment of the present invention.

FIG. 2 is a diagram showing a matrix for illustrating the data processing method of the first embodiment.

Here, the multi-level data is treated as sets of a plurality of symbols (S1 through Sm) with each symbol being n-bit data (n is an integer satisfying $n \geq 2$) and each set consisting of m symbols (m is an integer satisfying $m \geq 3$).

In this case, each symbol can take $2^n$ symbol values. MSB means the Most Significant Bit, and LSB means the Least Significant Bit.

A description will be given of a method of converting binary data to multi-level data.

First, $\{(n-1) \times m\}$-bit binary data is arranged in the upper-side (n−1) bits of m symbols in one set.

Further, (m−1)-bit binary data is converted to m-bit binary data and arranged in the LSBs of the m symbols.

Thus, the (n×m−1)-bit binary data ($\{(n-1) \times m\}+(m-1)=(n \times m-1)$) is converted to the m symbols of multi-level data of n bits per symbol.

Here, if (n×m)-bit binary data is simply arranged in the m symbols of multi-level data of n bits per symbol, each symbol takes a random symbol value.

However, by converting the (m−1)-bit binary data to the m-bit binary data and arranging the m-bit binary-data in the LSBs of the m symbols, the symbol value of each symbol can be limited to even numbers if the LSB of the symbol is "0" and to odd numbers of the LSB of the symbol is "1".

Accordingly, the degree of variation of each symbol value can be reduced to half the degree of variation in the case where the symbol value of each symbol varies at random.

Thereby, the number of candidates can be halved at the time of detecting (determining) the multi-level data, so that the error rate can be reduced.

According to the data processing method of the first embodiment, in converting binary data to multi-level data, (m−1) bits are converted to m bits to be arranged in the LSBs of the multi-level data, thereby limiting the symbol value of each symbol to either even or odd numbers depending on the LSB of the symbol. Therefore, the number of candidates can be halved in the case of determining the multi-level data, so that the error rate can be reduced.

Next, a description will be given of a first method of converting the (m−1)-bit data to the m-bit data according to the first embodiment of the present invention.

FIG. 3 is a table showing data patterns for illustrating the first method.

In FIG. 3, m is three, for instance.

In the case of adding "0" to the right side of two-bit data, the two-bit data "00", "01", "10", and "11" are converted to three-bit data "000", "010", "100", and "110", respectively, as shown in (a) of FIG. 3.

In the case of adding "0" in the center of the two-bit data, the two-bit data "00", "01", "10", and "11" are converted to three-bit data "000", "001", "100", and "101", respectively, as shown in (b) of FIG. 3.

Further, in the case of adding "0" to the left side of the two-bit data, the two-bit data "00", "01", "10", and "11" are converted to three-bit data "000", "001", "010", and "011", respectively, as shown in (c) of FIG. 3.

Furthermore, in the case of adding "1" to the left side of the two-bit data, the two-bit data "00", "01", "10", and "11" are converted to three-bit data "100", "101", "110", and "111", respectively, as shown in (d) of FIG. 3.

In addition, "1" may be added to the right side or in the center of the two-bit data.

According to the above-described conversion method, the conversion can be performed easily without creating a conversion table.

The first conversion method, which converts the (m−1)-bit data to the m-bit data only by adding "0" or "1" to the (m−1)-bit data, is thus realized easily.

Next, a description will be given of a second method of converting the (m−1)-bit data to the m-bit data according to the first embodiment of the present invention.

FIGS. 4 and 5 are tables showing data patterns for illustrating the second method.

FIG. 4 shows other conversions in the case of m=3, where three-bit data obtained after conversion differ by two bits.

Four patterns are thus selected from the eight patterns, so that two tables of data patterns can be created as shown in (a) and (b) of FIG. 4.

FIG. 5 shows conversions in the case of m=4 according to the second method, where four-bit data obtained after conversion differ by more than two bits.

According to the data processing method of the first embodiment, the (m−1)-bit data may be converted to the m-bit data, using a corresponding one of the data patterns of each conversion table which data patterns differ by more than two bits so that the degree of separation among the data patterns is increased. Therefore, errors can be reduced at the time of determining the multi-level data.

Next, a description will be given of a data processing method according to a second embodiment of the present invention.

According to the data processing method of the second embodiment, the (m−1)-bit data is converted to the m-bit data by selecting and using one of two different conversion methods for each set instead of using only one conversion method for all the sets.

For instance, a numeric string P consisting of "0"s and "1"s arranged to correspond to the sets for selecting the conversion tables of (a) and (b), respectively, of FIG. 4 or 5 is defined as P=0, 1, 0, 1, 0, 1, . . . or P=0, 0, 1, 1, 0, 0, . . . . The conversion table may be determined with respect to each set so that the conversion table (a) is selected in the case of P=0 and the conversion table (b) is selected in the case of P=1. Further, random numbers defined by an initial value and a generation method may be used as the numeric string P.

Since all the m-bit patterns are thus employed, the data patterns of the sets are prevented from being biased, so that the multi-level signal is prevented from having its specific frequency component emphasized. Therefore, the multi-level signal is easily adapted to the frequency characteristics of an information recording and reproduction system and a transmission path.

According to the data processing method of the second embodiment, two different conversion tables are employed to convert the (m−1)-bit data to the m-bit data. Therefore, since all the m-bit data patterns are used, the data patterns of the converted data are prevented from being biased. Accordingly, the multi-level signal is prevented from having its specific frequency component from being biased so as to be adapted easily to the frequency characteristics of an information recording and reproduction system and a transmission path.

According to the second embodiment, one of the two tables is selected for each (n×m−1)-bit data based on a given numeric string P consisting of "0"s and "1"s each determined for corresponding (n×m−1)-bit data.

The numeric string P is generated thus easily so that the data processing method of the second embodiment can be realized with ease. In the data processing method of the second embodiment, a uniquely determined numeric string is used to select one of the two conversion tables. Therefore, the selection can be made easily.

Further, according to the data processing method of the second embodiment, one of the two conversion tables may be selected by, instead of using the above-described fixed numeric string P, using data in a set to determine a value for the next set in the numeric string P.

For instance, a value P(1) for the first set in the numeric string P is determined to be "0" as an initial value, and a value P(i) for the ith set (i is an integer satisfying i≧2) in the numeric string P is defined based on the result of any of the following logical operations:

P(i)=P(i−1) EOR LSB of Sm of the (i−1)th set (EOR: exclusive OR operator)

P(i)=NOT MSB of S1 of the (i−1)th set (NOT: logical negation operator)

P(i)=LSB of S2 of the (i−1)th set

According to the data processing method of the second embodiment, in the numeric string P, a value for a set is interrelated with a value for the next set through the logical operation. Therefore, at the time of determining the multi-level data of a target set, the determination can be performed in consideration of a plurality of sets succeeding the target-set, so that errors can be reduced at the time of determining the multi-level data.

If the result of the determination of the multi-level data of the target set is erroneous, however, the error is propagated to the succeeding sets. Therefore, the numeric string P may be terminated after determining k values (k is a predetermined integer satisfying k≧1) subsequent to the initial value, and thereafter, restarted from the initial value. This termination and restarting of the numeric string P may be performed repeatedly.

The numeric string P is terminated and then restarted from the initial value each time a predetermined number of values subsequent to the initial value are determined. Therefore, even if the result of the determination of the multi-level data of a target set contains an error, the propagation of the error can be limited to the predetermined number of sets after the target set.

Next, a description will be given of a data processing method according to a third embodiment of the present invention.

In the third embodiment, two-bit data is converted to multi-level data, and the multi-level signal is input as a signal reproduced from an information recording medium or received from a transmission path to be A/D-converted to digital data, from which the multi-level data is determined.

Figure 6:
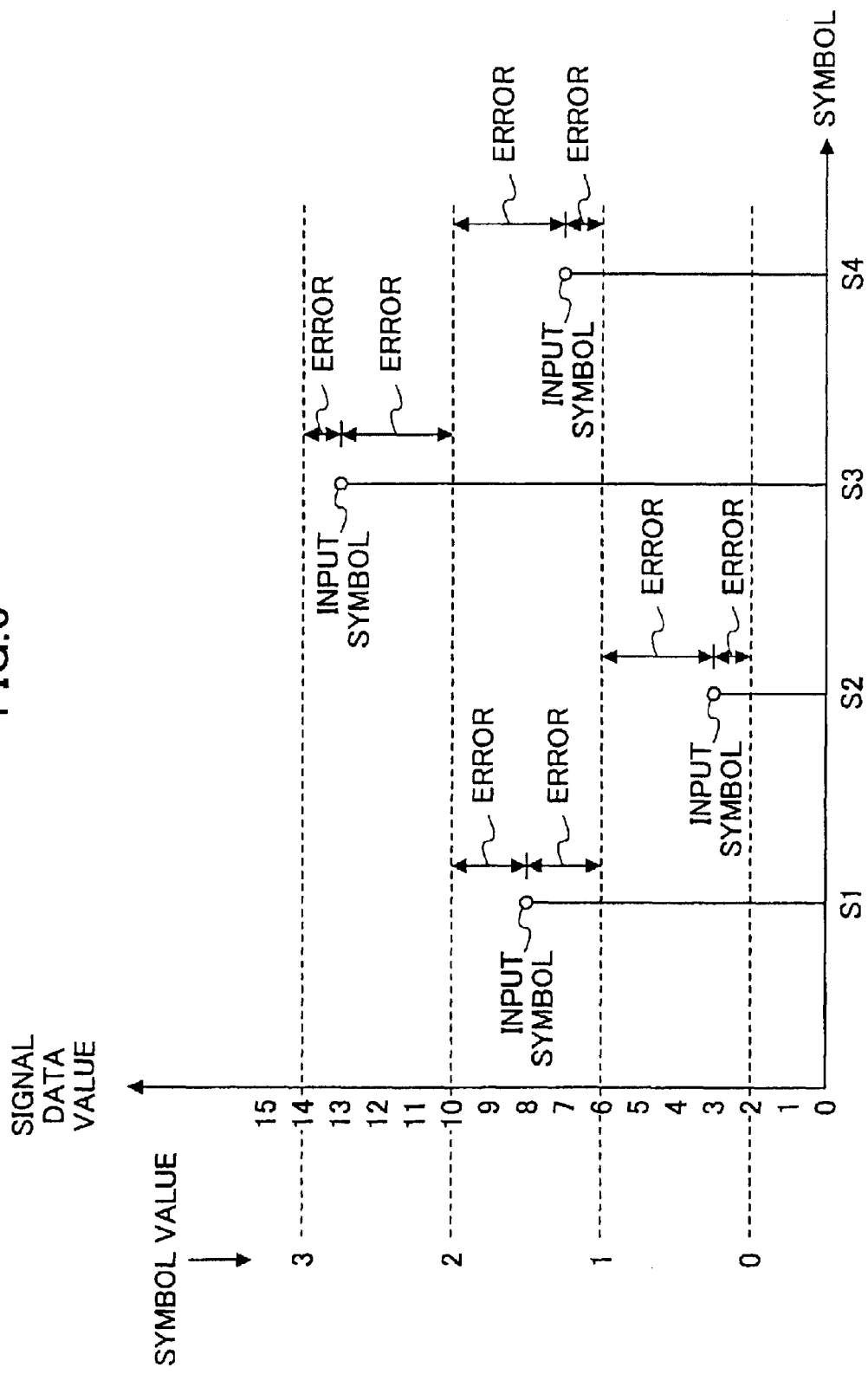
FIG. 6 is a diagram for illustrating a data processing method according to a third embodiment of the present invention.

FIG. 6 is a diagram for illustrating the data processing method of the third embodiment.

Here, one symbol is two-bit multi-level data, and takes symbol values ranging from 0 to 3. Further, one set consists of four symbols.

For simplification of description, the number of bits for quantization of A/D conversion is four, and signal data values range from decimal 0 to 15. Further, the symbol values "0", "1", "2", and "3" correspond to ideal signal data values "2", "6", "10", and "14", respectively.

FIG. 7 is a table showing the relationship between the signal data value of an input symbol and its candidate symbol values according to the third embodiment.

Candidate symbol values for a group of the signal data values "0 and 1" and a group of the signal data values "14 and 15" are restricted to "0" and "3", respectively, but may be changed to "0 or 1" and "2 or 3", respectively.

Since a data processing method according to the present invention is applicable when signal data values are distributed to overlap only adjacent symbol values, candidate symbol values for one input symbol are the closest even and odd symbol values only.

Next, a description will be given of a method of determining the multi-level data of each set in the case of using only the conversion table of (a) of FIG. 5.

As shown in FIG. 6, the signal data values of the four input symbols S1 through S4 of one set are "8", "3", "13", and "7", respectively.

Eight possible symbol value strings obtained from the candidate symbol values determined based on the list shown in FIG. 7 and the bit (data) patterns of the conversion table of (a) of FIG. 5 are shown in the left column "candidate symbol value string" of the following Table 1.

TABLE 1

| CANDIDATE SYMBOL VALUE STRING | IDEAL SIGNAL DATA VALUE STRING | SUM OF ERRORS BETWEEN IDEAL AND INPUT SIGNAL DATA VALUES |
|---|---|---|
| 1 | 2-0-2-2 | 10-2-10-10 | 9 |
| 2 | 2-0-3-1 | 10-2-14-6 | 5 |
| 3 | 2-1-2-1 | 10-6-10-6 | 9 |
| 4 | 2-1-3-2 | 10-6-14-10 | 9 |
| 5 | 1-0-2-1 | 6-2-10-6 | 7 |
| 6 | 1-0-3-2 | 6-2-14-10 | 7 |
| 7 | 1-1-2-2 | 6-6-10-10 | 11 |
| 8 | 1-1-3-1 | 6-6-14-6 | 7 |

Ideal signal data value strings corresponding to the eight candidate symbol value strings are shown in the center column "ideal signal data value string" of Table 1. Further, the sums of errors between the signal data value string of the input symbols (8-3-13-7) and the ideal signal value data strings are shown in the right column "sum of errors between ideal and input signal data values" of Table 1.

Here, at the time of calculating the sum of errors, the absolute values of the differences between the signal data values of the four input symbols and their corresponding ideal signal data values are first obtained and then summed up. However, the differences may be squared and then summed up.

As a result, the candidate symbol value string having the smallest sum of errors (2-0-3-1) is determined to be the multi-level data of the set, or the multi-level data determination result of the set.

Thus, the reliability of the multi-level data determination is increased by employing the determination result minimizing the error in the set.

Particularly, the symbol S1 (signal data value 8), which is the center value of the range of the symbol value "1" to "2", is difficult to determine simply from only itself. However, according to this multi-level data determination method, a highly reliable determination result can be obtained.

According to the data processing method of the third embodiment, at the time of converting binary data to multi-level data, the (m−1)-bit data is converted to the m-bit data to be set in the LSB of the multi-level data so that the symbol value of each symbol is limited to either even or odd numbers depending on the LSB of the symbol. Using this limitation, the data processing method of the third embodiment obtains the minimum error between the ideal and input signal data values with respect to each ideal signal data value string, and determines the multi-level data based on the bit pattern of the conversion table which bit pattern provides the minimum value. Therefore, the determination is more reliable than in the case where one symbol is simply determined independently.

According to the data processing method of the third embodiment, the conversion table of (a) of FIG. 5 is employed in the above-described determination.

Therefore, since the (m−1)-bit data is converted to the m-bit data, using a corresponding one of the data patterns of the conversion table which data patterns differ by more than two bits, the degree of separation among the data patterns is increased, thus reducing errors at the time of determining the multi-level data.

According to the data processing method of the third embodiment, the (m−1)-bit data may be converted to the m-bit data by adding "0" or "1" as shown in FIG. 3 instead of using the conversion table of (a) of FIG. 5.

Since the (m−1)-bit data can be converted to the m-bit data simply by adding "0" or "1", data processing for determining the multi-level data can be simplified and realized easily.

Further, the data processing method of the third embodiment may select and use one of two different conversion tables for each set instead of using only one conversion table as described above.

For instance, a numeric string P consisting of "0"s and "1"s arranged for selecting one of first and second conversion tables for each set is defined as P=0, 1, 0, 1, 0, 1, . . . or P=0, 0, 1, 1, 0, 0, . . . . The conversion table may be determined with respect to each set so that the first conversion table is selected in the case of P=0 and the second conversion table is selected in the case of P=1. Further, random numbers defined by an initial value and a generation method may be used as the numeric string P.

Since all the m-bit patterns are thus employed, the data patterns of the sets are prevented from being biased, so that the multi-level signal is prevented from having its specific frequency component emphasized. Therefore, the multi-level signal is easily adapted to the frequency characteristics of an information recording and reproduction system and a transmission path.

According to the data processing method of the third embodiment, two different conversion tables are employed to convert the (m−1)-bit data to the m-bit data. Therefore, since all the m-bit data patterns are used, the data patterns of the converted data are prevented from being biased. Accordingly, the multi-level signal is prevented from having its specific frequency component biased so as to be adapted easily to the frequency characteristics of an information recording and reproduction system and a transmission path.

According to the third embodiment, one of the two tables is selected for each (n×m−1)-bit data based on a given numeric string P consisting of "0"s and "1"s each determined for corresponding (n×m−1)-bit data.

The numeric string P is generated thus easily so that the data processing method of the third embodiment can be realized with ease. In the data processing method of the third embodiment, a uniquely determined numeric string is used to select one of the two-conversion tables. Therefore, the selection can be made easily.

Next, a description will be given of a data processing method according to a fourth embodiment of the present invention.

According to the data processing method of the fourth embodiment, one of two conversion tables may be selected by, instead of using a fixed numeric string P, using data in a set to determine a value for the next set in the numeric string P.

For instance, a value P(1) for the first set in the numeric string P is determined to be "0" as an initial value, and a value P(i) for the ith set (i is an integer satisfying i≧2) in the numeric string P is defined based on the result of any of the following logical operations:

P(i)=P(i−1) EOR LSB of Sm of the (i−1)th set (EOR: exclusive OR operator)

P(i)=NOT MSB of S1 of the (i−1)th set (NOT: logical negation operator)

P(i)=LSB of S2 of the (i−1)th set

Thus, at the time of determining the multi-level data of a target set, the determination can be performed in consideration of a plurality of sets succeeding the target set, so that errors can be reduced at the time of determining the multi-level data.

Next, a description will be given of the case where P(i)=P(i−1) EOR LSB of Sm of the (i−1)th set.

Here, one symbol is two-bit multi-level data, and takes symbol values ranging from 0 to 3. Further, one set consists of four symbols (S1 through S4).

The number of bits for quantization of A/D conversion is five, and signal data values range from decimal 0 to 31.

Further, the symbol values "0", "1", "2", and "3" correspond to ideal signal data values "4", "12", "20", and "28", respectively.

FIG. 8 is a table showing the relationship between the signal data value of an input symbol and its candidate symbol values according to the fourth embodiment.

Candidate symbol values for a group of the signal data values "0 through 3" and a group of the signal data values "28 through 31" are restricted to "0" and "3", respectively, but may be changed to "0 or 1" and "2 or 3", respectively.

Further, the conversion table of (a) of FIG. 5 is used in the case of P=0, and the conversion table of (b) of FIG. 5 is used in the case of P=1.

When the signal data value string of the input symbols of the ith set is "21-5-27-13" and the signal data value string of the input symbols of the (i+1)th set is "10-19-14-25", the multi-level data of the input symbols of the ith set is determined by processing the data of the two sets.

First, the multi-level data of each of the ith set and (i+1)th set is temporarily determined in the case of P=0 and in the case of P=1. The following tables 2 through 5 show the process of obtaining the multi-level data of each of the ith set and (i+1)th set in each of the cases. Table 2 shows the, case of the ith set with P=0, Table 3 shows the case of the ith set with P=1, Table 4 shows the case of the (i+1)th set with P=0, and Table 5 shows the case of (i+1)th set with P=1.

TABLE 2

| CANDIDATE SYMBOL VALUE STRING | IDEAL SIGNAL DATA VALUE STRING | SUM OF ERRORS BETWEEN IDEAL AND INPUT SIGNAL DATA VALUES |
|---|---|---|
| 1 2-0-2-2 | 20-4-20-20 | 16 |
| 2 2-0-3-1 | 20-4-28-12 | 4 |
| 3 2-1-2-1 | 20-12-20-12 | 16 |
| 4 2-1-3-2 | 20-12-28-20 | 16 |
| 5 3-0-2-1 | 28-4-20-12 | 16 |
| 6 3-0-3-2 | 28-4-28-20 | 16 |
| 7 3-1-2-2 | 28-12-20-20 | 28 |
| 8 3-1-3-1 | 28-12-28-12 | 16 |

TABLE 3

| CANDIDATE SYMBOL VALUE STRING | IDEAL SIGNAL DATA VALUE STRING | SUM OF ERRORS BETWEEN IDEAL AND INPUT SIGNAL DATA VALUES |
|---|---|---|
| 1 2-0-2-1 | 20-4-20-12 | 10 |
| 2 2-0-3-2 | 20-4-28-20 | 10 |
| 3 2-1-2-2 | 20-12-20-20 | 22 |
| 4 2-1-3-1 | 20-12-28-12 | 10 |
| 5 3-0-2-2 | 28-4-20-20 | 22 |
| 6 3-0-3-1 | 28-4-28-12 | 10 |
| 7 3-1-2-1 | 28-12-20-12 | 22 |
| 8 3-1-3-2 | 28-12-28-20 | 22 |

TABLE 4

| CANDIDATE SYMBOL VALUE STRING | IDEAL SIGNAL DATA VALUE STRING | SUM OF ERRORS BETWEEN IDEAL AND INPUT SIGNAL DATA VALUES |
|---|---|---|
| 1 0-2-2-2 | 4-20-20-20 | 18 |
| 2 0-2-1-3 | 4-20-12-28 | 12 |
| 3 0-1-2-3 | 4-12-20-28 | 22 |
| 4 0-1-1-2 | 4-12-12-20 | 20 |
| 5 1-2-2-3 | 12-20-20-28 | 12 |
| 6 1-2-1-2 | 12-20-12-20 | 10 |
| 7 1-1-2-2 | 12-12-20-20 | 20 |
| 8 1-1-1-3 | 12-12-12-28 | 14 |

TABLE 5

| CANDIDATE SYMBOL VALUE STRING | IDEAL SIGNAL DATA VALUE STRING | SUM OF ERRORS BETWEEN IDEAL AND INPUT SIGNAL DATA VALUES |
|---|---|---|
| 1 0-2-2-3 | 4-20-20-28 | 16 |
| 2 0-2-1-2 | 4-20-12-20 | 14 |
| 3 0-1-2-2 | 4-12-20-20 | 24 |
| 4 0-1-1-3 | 4-12-12-28 | 18 |
| 5 1-2-2-2 | 12-20-20-20 | 14 |
| 6 1-2-1-3 | 12-20-12-28 | 8 |
| 7 1-1-2-3 | 12-12-20-28 | 18 |
| 8 1-1-1-2 | 12-12-12-20 | 16 |

The candidate symbol value string(s) that minimizes (minimize) the sum of errors are selected from each of the above-described Tables 2 through 5. The temporary multi-level data determination result of each case is shown in the following Table 6.

TABLE 6

| ITH SET | | (I + 1) TH SET | |
|---|---|---|---|
| P | SYMBOL VALUE STRING | SUM OF ERRORS | P | SYMBOL VALUE STRING | SUM OF ERRORS |
| 0 | 2-0-3-1 | 4 | 0 | 1-2-1-2 | 10 |
| 1 | 2-0-2-1 | 10 | 1 | 1-2-1-3 | 8 |
|   | 2-0-3-2 | 10 |   |   |   |
|   | 2-1-3-1 | 10 |   |   |   |
|   | 3-0-3-1 | 10 |   |   |   |

In the case of the ith set with P=1 (see Table 3), the four symbol value strings having the same minimum sum of errors are temporarily determined to be the multi-level data of the ith set.

Since there is a relationship defined by P(i+1)=P(i) EOR LSB of S4 of the ith set between P(i) for the ith set and P(i+1) for the (i+1)th set, the correlated temporary multi-level data determination results for the two sets are obtained by correlating P(i) with P(i+1) for the (i+1)th set calculated from the temporary multi-level data determination results of the ith set. Table 7 shows the correlated temporary multi-level data determination results for the two sets.

TABLE 7

| ITH SET | | (I + 1) TH SET | | |
|---|---|---|---|---|
| P | SYMBOL VALUE STRING | SUM OF ERRORS | P | SYMBOL VALUE STRING | SUM OF ERRORS | SUM OF ERRORS OF TWO SETS |
| 0 | 2-0-3-1 | 4 | 1 | 1-2-1-3 | 8 | 12 |
| 1 | 2-0-2-1 | 10 | 0 | 1-2-1-2 | 10 | 20 |
|   | 2-0-3-2 | 10 | 1 | 1-2-1-3 | 8 | 18 |
|   | 2-1-3-1 | 10 | 0 | 1-2-1-2 | 10 | 20 |
|   | 3-0-3-1 | 10 | 0 | 1-2-1-2 | 10 | 20 |

Table 7 shows that the combination of the symbol value string "2-0-3-1" of the ith set and the symbol value string "1-2-1-3" of the (i+1)th set minimizes the combined sum of errors of the two sets. From this result, the multi-level data of the ith set is determined to be "2-0-3-1".

The multi-level data can be determined from more information by thus taking into consideration a correlation between values for a plurality of sets in the numeric string P. Therefore, errors can be reduced at the time of determining the multi-level data compared with the case where the multi-level data is determined independently set by set.

According to the data processing method of the fourth embodiment, at the time of converting binary data to multi-level data, the (m−1)-bit data is converted to the m-bit data, and the m-bit data is set in the LSBs of the multi-level data, thereby limiting the symbol value of each symbol to either even or odd numbers depending on the LSB of the symbol. Further, two conversion tables are used in converting the (m−1)-bit data to the m-bit data, and a value for a target set and a value for the next set are correlated through the logical operation in the numeric string P for selecting one of the two conversion tables for each set. Therefore, the multi-level data of the target set can be determined in consideration of not only the target set but also the next set. That is, the multi-level data determination can be performed in consideration of a plurality of sets. Therefore, errors can be reduced at the time of determining the multi-level data.

According to the data processing method of the fourth embodiment, the conversion tables of (a) and (b) of FIG. 5 are used in converting the (m−1)-bit data to the m-bit data in the above-described determination process.

Since the data patterns of each conversion table are determined to differ by more than two bits, the degree of separation among the data patterns is increased. Therefore, errors can be reduced at the time of determining the multi-level data.

In the fourth embodiment, the multi-level data of the preceding one of the two sets is determined based on the data for the two sets. However, the multi-level data of the preceding t (t is an integer satisfying t≧s) sets may be determined from data for s sets (s is an integer satisfying s≧2).

Further, the numeric string P for selecting one of the conversion tables for each set may be terminated when a predetermined number of values subsequent to an initial value are determined, and then restarted from the initial value. This termination and restarting of the numeric string P may be performed repeatedly.

According to the data processing method of the fourth embodiment, the termination and restarting of the numeric string P is performed each time the predetermined number of values subsequent to the initial value are determined. Therefore, even if the result of the determination of the multi-level data of a target set contains an error, the propagation of the error can be limited to the predetermined number of sets after the target set.

Any of the above-described data processing methods of the first through fourth embodiments can be realized as software that operates on a computer system using a microprocessor or a digital signal processor.

Next, a description will be given of a data processing circuit according to a fifth embodiment of the present invention.

Figure 9:
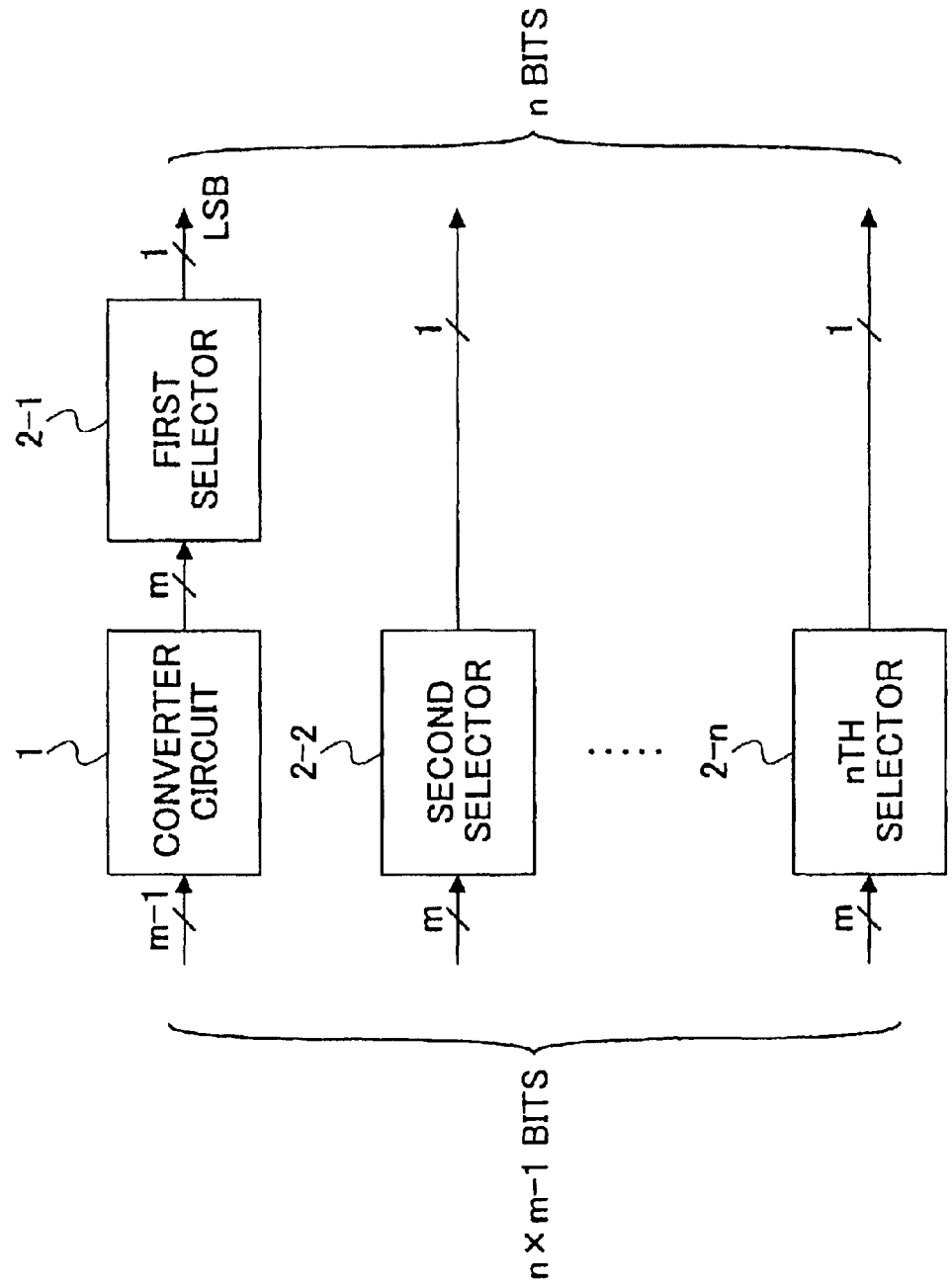
FIG. 9 is a block diagram showing a data processing circuit according to a fifth embodiment of the present invention.

FIG. 9 is a block diagram showing the data processing circuit according to the fifth embodiment of the present invention.

The data processing circuit converts binary data to multi-level data. When (n×m−1)-bit parallel data is input to the data processing circuit, the data processing circuit outputs parallel data of n bits per symbol.

The data processing circuit includes a converter circuit 1, a first selector 2-1, and second through nth selectors 2-2 through 2-n. The converter circuit 1 converts the m−1 bits of the input data to m bits. The m-bit output of the converter circuit 1 is input to the first selector 2-1, and the first selector 2-1 selects one of the input m bits. Each of the second through nth selectors 2-2 through 2-n is supplied with corresponding m bits of the rest of the input data.

A circuit for controlling switching of each of the first through nth selectors 2-1 through 2-n in timing with inputting and outputting of data is not shown in the drawing.

Next, a description will be given of the operation of the data processing circuit for converting binary data to multi-level data.

Figure 10:
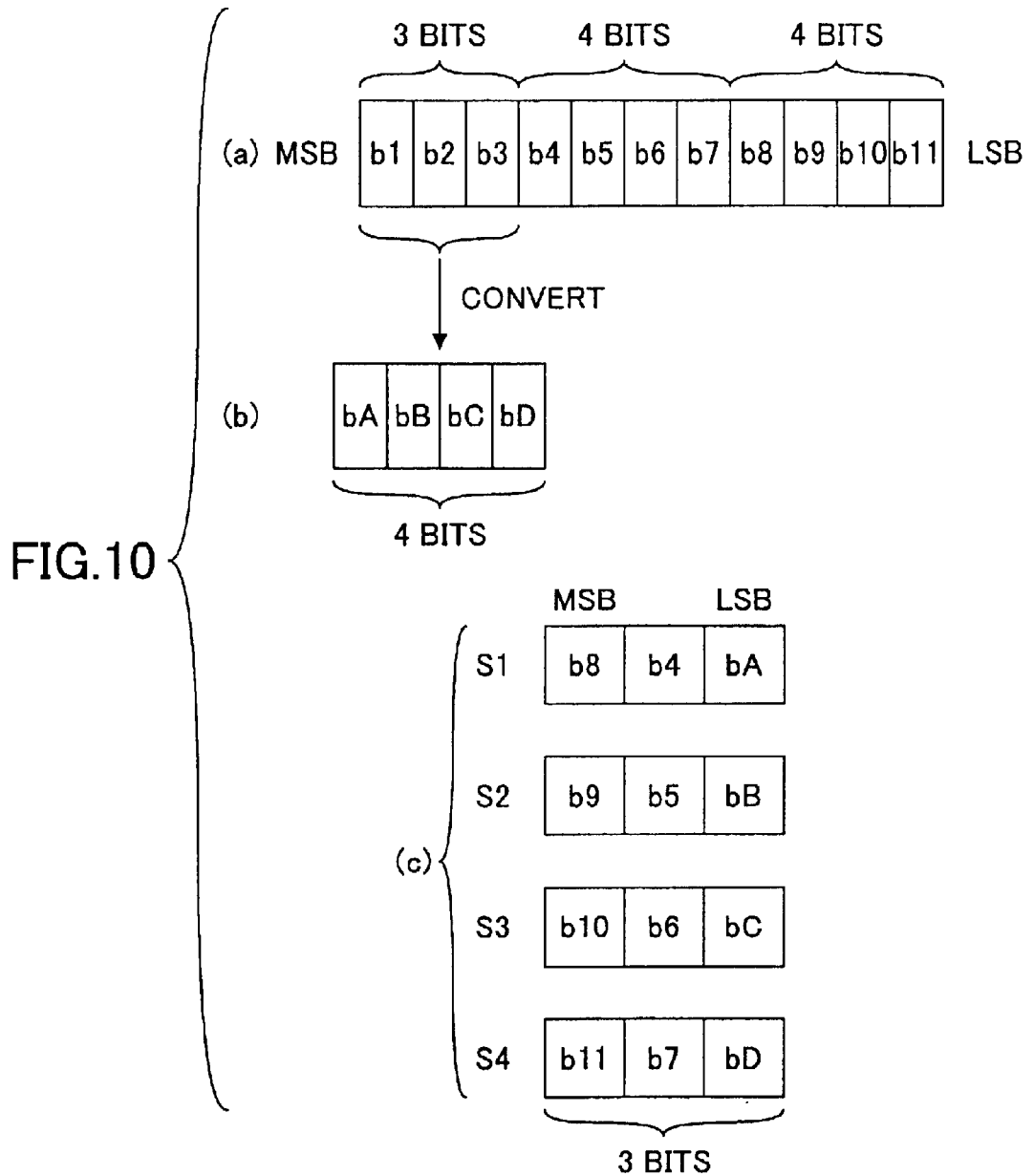
FIG. 10 is a diagram showing bit data arrangements for illustrating the operation of the data processing circuit of FIG. 9.

FIG. 10 is a diagram showing bit data arrangements for illustrating the operation of the data processing circuit of FIG. 9.

In this case, m=4 and n=3.

As shown in (a) of FIG. 10, the 11-bit input parallel data has bits b1 through b11 arranged from MSB to LSB. The upper-side three bits b1 through b3 are converted to four bits bA, bB, bC, and bD in the converter circuit 1 as shown in (b) of FIG. 10.

The converter circuit 1 may be realized as a conversion table by using a semiconductor memory and logic circuits.

Alternatively, the converter circuit 1 may be realized by additional interconnection lines if the conversion is simply performed by adding "0" or "1" to the input data.

Thereafter, the outputs of the three selectors (the first through third selectors 2-1 through 2-3 in this case) are successively switched so that three-bit parallel data are output to have their bit data arranged in four symbols S1 through S4 as shown in (c) of FIG. 10.

Since the data processing circuit of the fifth embodiment can convert binary data to multi-level data by simple hardware, the data processing circuit can perform processing at high speed.

Further, the data processing circuit of the fifth embodiment may include a shift register circuit so that serial data as well as parallel data may be input to the data processing circuit.

In this case, the data processing circuit is realized by a serial-input circuit to convert binary data to multi-level data. Therefore, an interface between the data processing circuit and another circuit may require fewer lines.

In the case of using two types of conversion tables and selecting one of the two conversion tables based on the numeric string P, the function may be added to the converter circuit 1 and the control circuit.

Next, a description will be given of a data processing circuit according to a sixth embodiment of the present invention.

Figure 11:
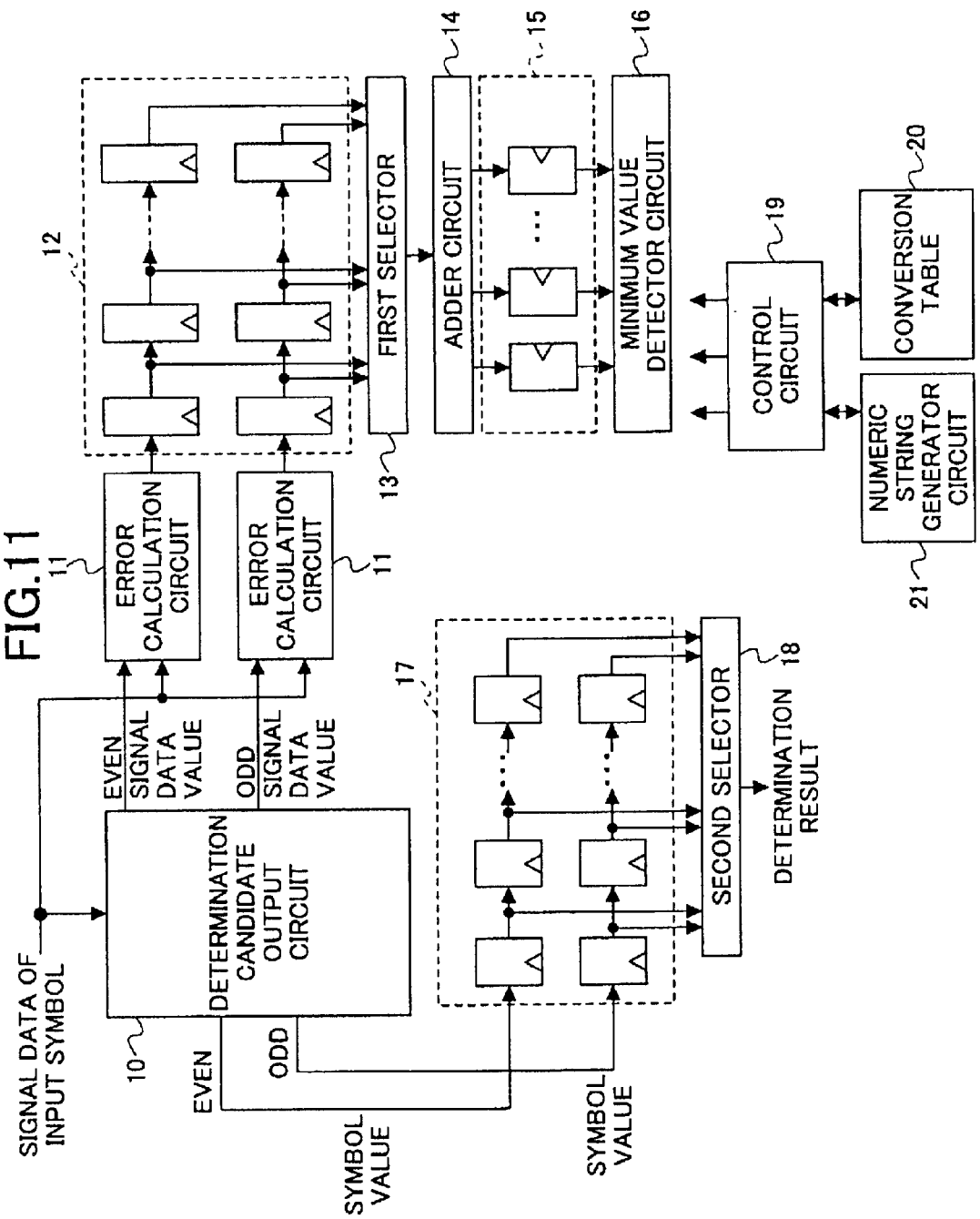
FIG. 11 is a block diagram showing a data processing circuit according to a sixth embodiment of the present invention.

FIG. 11 is a block diagram showing the data processing circuit of the sixth embodiment.

FIG. 12 is a table showing the relationship between the signal data value of an input symbol and its candidate symbol values for illustrating the operation of the data processing circuit of FIG. 11.

Signal data obtained after A/D-converting a multi-level signal is input symbol by symbol to the data processing circuit so that the data processing circuit performs multi-level data determination.

A description will be given below of the main components of the data processing circuit and their functions.

The signal data of an input symbol is input to a determination candidate output circuit 10. The determination candidate output circuit 10 then outputs even and odd candidate symbol values for the input signal data and their respective corresponding ideal signal data values. The determination candidate output circuit 10 may be realized in the form of the table shown in FIG. 12 by using a semiconductor memory and logic circuits.

The table of FIG. 12 shows even and odd candidate symbol values for the signal data value of an input symbol and an ideal signal data value for each candidate symbol value in the case where the signal data values range from 0 to 15 and the symbol values range from 0 to 3.

Error calculation circuits 11 output the absolute values of the differences between the signal data value of the input symbol and the ideal signal data values corresponding to the even and odd candidate symbol values output from the determination candidate output circuit 10. The error calculation circuits 11 may output the squares of the differences.

A first register 12 includes a plurality of registers that retain the outputs of the error calculation circuits 11 for the symbols of one or a plurality of sets.

A first selector 13 performs a selecting operation on the outputs of the registers of the first register 12 in accordance with the bit patterns of a conversion table 20, or the combination patterns of even and odd numbers, and outputs the error values as selected in combinations so that the sum of the error values of, each combination of the set(s) is calculated.

An adder circuit 14 adds up the error values of each combination output from the first selector 13 and outputs the sum of the error values of each combination.

A second register 15 retains the sum of the error values of each of the combinations determined in accordance with the bit patterns of the conversion table 20, or the combination patterns of even and odd numbers.

A minimum value detector circuit 16 detects the minimum value of the outputs of the second register 15.

A third register 17 retains the even and odd candidate symbol values for the symbols of the set(s) output from the determination candidate output circuit 10.

A second selector 18 performs a selecting operation on the candidate symbol values retained in the third register 17 in accordance with the bit pattern of the conversion table 20 which bit pattern corresponds to the minimum value detected in the minimum value detector circuit 16, and outputs the selected candidate symbol values as a determination result.

A control circuit 19 controls the operation of the entire data processing circuit.

The conversion table 20 is equal to that used in converting binary data to multi-level data in this embodiment.

A numeric string generator circuit 21 generates the numeric string P for selecting one of two conversion tables included in the conversion table 20 for each set. If the conversion table 20 consists of only one conversion table, the numeric string generator circuit 21 is unnecessary. Further, if the numeric string P is uniquely determined, the numeric string generator circuit 21 generates the same numeric string P as used in converting the binary data to the multi-level data. Alternatively, if the numeric string P is determined through a logical operation with data in a given set, the numeric string generator circuit 21 generates the numeric string P by inputting the candidate symbol values.

According to the data processing circuit including the above-described components, the error values between the input signal data values of the symbols of the set(s) and their respective ideal signal data values corresponding to the candidate symbol values of the input symbols can be retained, and further, the sum of the error values of each combination can be retained.

Further, the minimum value of the sums of the error values can be detected, and the determination result of each symbol can be output by selecting one of the bit patterns of the conversion table 20 which one corresponds to the detected minimum value.

The data processing circuit of the sixth embodiment, which realizes the multi-level data determination operation with a circuit, can perform processing at high speed.

Figure 13:
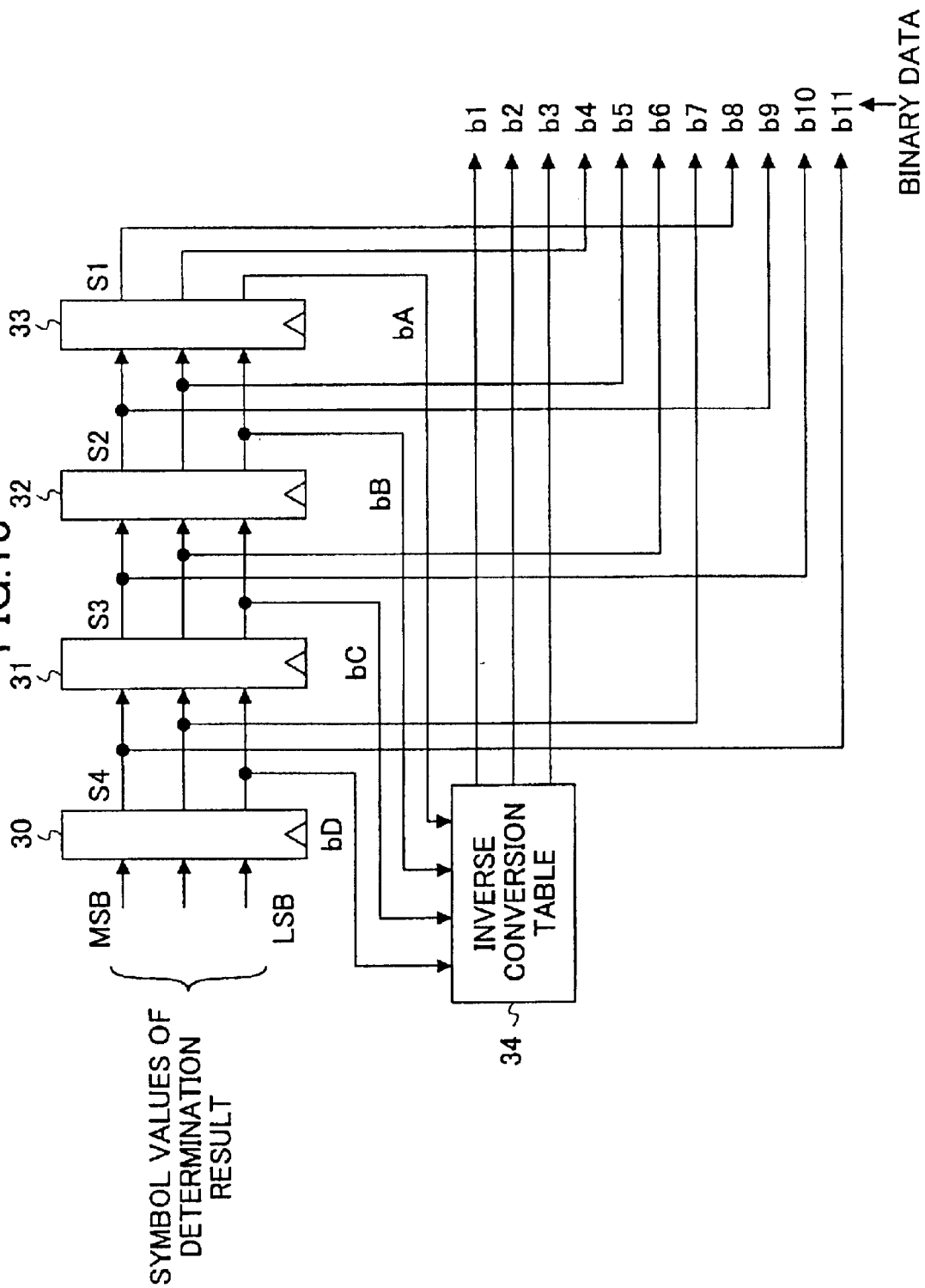
FIG. 13 is a block diagram showing a circuit that converts multi-level data obtained as a result of a multi-level data determination operation to binary data according to the sixth embodiment of the present invention.

FIG. 13 is a block diagram showing a circuit that converts to binary data the multi-level data (symbol values) obtained as a result of the above-described multi-level data determination operation.

The circuit of FIG. 13 converts each multi-level data set of three bits per symbol and four symbols per set to 11-bit binary data.

The circuit retains the symbol value data obtained as a result of the determination in the four stages of three-bit registers 30 through 33. Then, the circuit inversely converts the LSBs of the registers 30 through 33 (four bits in total) to three bits based on an inverse conversion table 34, and outputs the three bits together with the remaining eight bits as 11-bit parallel data.

Thus, the data processing circuit of the fifth embodiment for converting binary data to multi-level data and the data processing circuit of the sixth embodiment for determining multi-level data are useful even if each circuit is independently incorporated into an apparatus for recording information on or reproducing information from a recording medium or an apparatus for transmitting information to or receiving information from a transmission path.

Further, the above-described circuits may be usefully incorporated into a recording and reproduction apparatus or a transmission and reception apparatus in the form of a single (integrated) circuit.

Since such an integrated circuit performs multi-leveld determination as the above-described circuits, data processing can be performed at high speed compared with software processing.

As previously described, such an integrated circuit having the data processing circuits for converting binary data to multi-level data and for determining multi-level data can be incorporated into an information recording and reproduction apparatus and an information transmission and reception apparatus.

In such an integrated circuit, the data processing circuit for converting binary data to multi-level data may be of either a parallel-input type or a serial-input type. In the case of a serial-input data processing circuit, an interface requiring fewer lines can be established between the data processing circuit and another circuit.

In the sixth embodiment, A/D conversion quantizing the amplitude of a reproduction signal is performed to quantize the multi-level signal, while a description will be given below of another quantization method.

Figure 14:
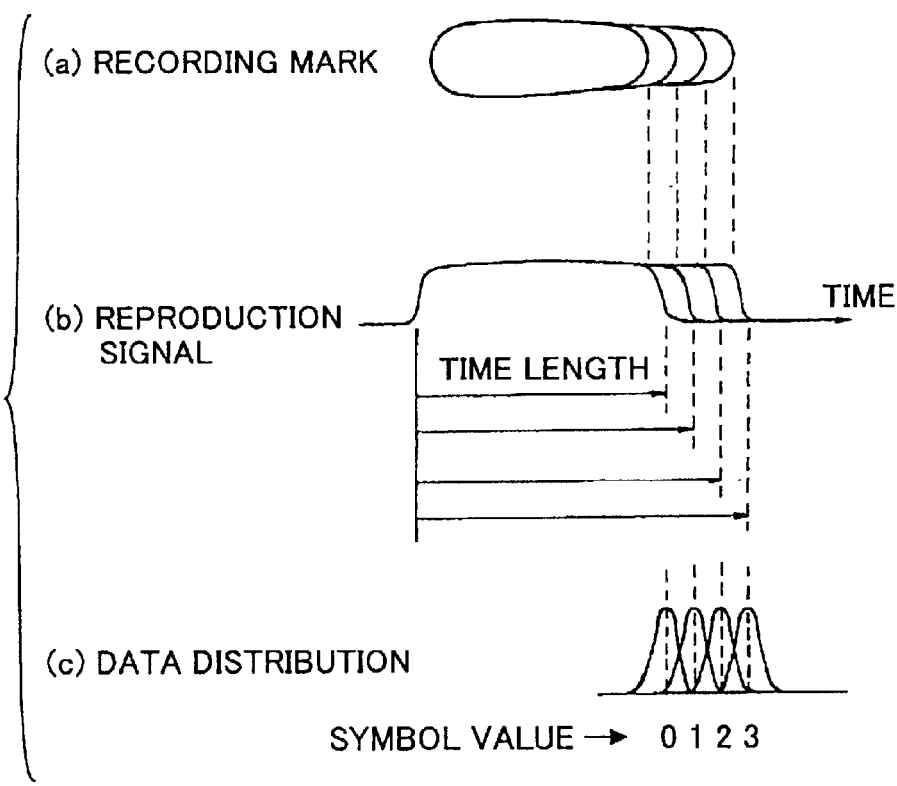
FIG. 14 is a diagram for illustrating multi-level data that is recorded on an information recording medium with marks of different lengths according to the sixth embodiment of the present invention.

FIG. 14 is a diagram for illustrating multi-level data that is recorded on an information recording medium such as an optical disk with marks of different lengths.

A reproduction signal of recording marks shown in (a) of FIG. 14 is binary, and is caused to be multi-level by a variation in the time lengths of pulses corresponding to the marks as shown in (b) of FIG. 14. By measuring the time lengths in a counter circuit operating on a reference clock signal, the multi-level signal can be quantized into signal data (digital data or symbol values 0, 1, 2, and 3). Thereafter, by subtracting a predetermined value from each signal data value, the distribution of the signal data as shown in (c) of FIG. 14 (or FIG. 1B) can be obtained. As a result, the configuration of the sixth embodiment where A/D conversion is performed can also be applied to the configuration of FIG. 15.

Further, the multi-level signal may be used in a communication device, being transmitted to a transmission path as a PWM-modulated signal so that the reproduction signal of FIG. 14 is obtained as a reception signal.

Next, a description will be given of a data processing apparatus according to a seventh embodiment of the present invention.

Figure 15:
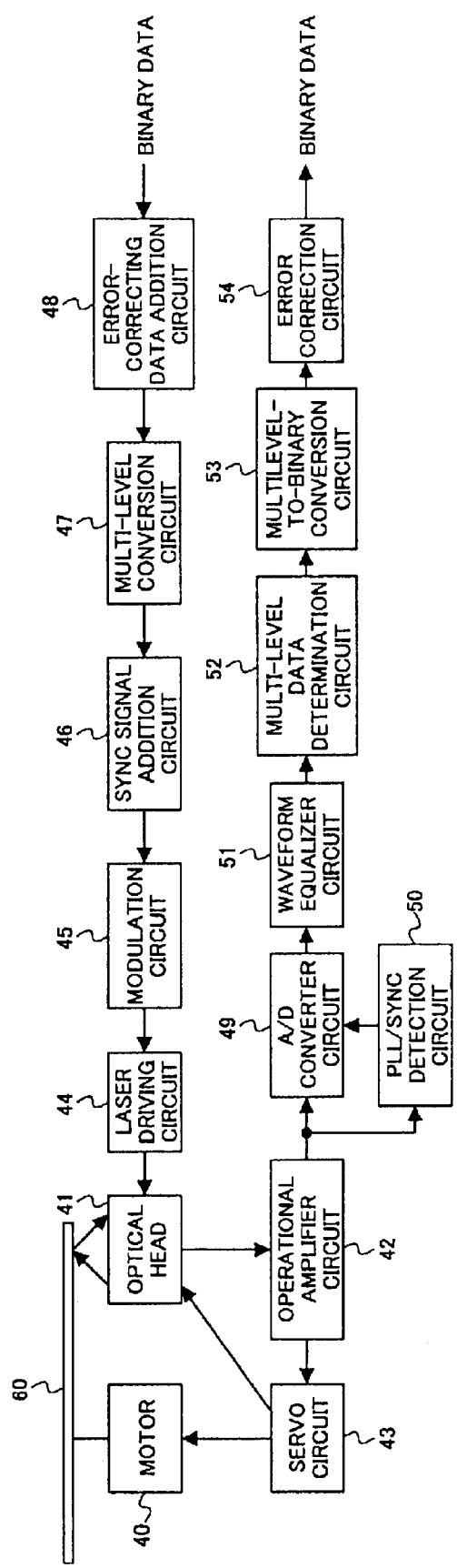
FIG. 15 is a block diagram showing the configuration of an optical disk unit that is a data processing apparatus according to a seventh embodiment of the present invention.

FIG. 15 is a block diagram showing the configuration of an optical disk unit that is a data processing apparatus according to the seventh embodiment of the present invention.

An optical disk 60 is an information recording medium on which information is recorded. A spiral track or concentric tracks are formed on the optical disk 60 and marks are recorded along the track(s) radially wobbling slightly at a predetermined frequency.

A motor 40 rotates the optical disk 60 at a predetermined speed of rotation at the time of recording and reproducing information.

An optical head 41 emits a laser light (beam) from a semiconductor light-emitting element (such as a laser diode) into a spot on the recording surface of the optical disk 60 so as to record marks thereon, and scans the marks with the laser spot so as to output an electrical signal.

An operational amplifier 42 amplifies the electrical signal output from the optical head 41, and outputs a focus error signal indicating whether the laser light is focused into a spot on the recording surface of the optical disk 60, a tracking error signal indicating whether the laser spot scans along the track(s), and a signal corresponding to the wobble of the track(s) (hereinafter referred to as a wobble signal).

A servo circuit 43, based on the focus error signal, the tracking error signal, and the wobble signal, focuses the laser light into a spot on the recording surface of the optical disk 60, causes the laser spot to scan the track(s) correctly, and rotates the optical disk 60 at a constant linear or angular velocity.

An error-correcting data addition circuit 48 adds data for error correction to input binary, data.

A multi-level conversion circuit 47 converts the input binary data to multi-level data. For instance, the data processing circuit of FIG. 9 is employed as the multi-level conversion circuit 47.

A synchronizing signal addition circuit 46 adds a synchronizing signal for indicating each data segment of a given amount to the output of the multi-level conversion circuit 47.

A modulation circuit 45 outputs a signal indicating marks and spaces of sizes corresponding to input multi-level data. No recording is performed at the spaces corresponding to "0"s of the multi-level data.

A laser driving circuit 44 outputs a signal for recording the marks on the optical disk 60 with the laser beam in accordance with the signal output from the modulation circuit 45.

An A/D converter circuit 49 converts the reproduction signal supplied from the operational amplifier circuit 42 to a digital signal.

A PLL (phase-locked loop) and synchronization detection circuit 50 detects the synchronizing signal included in the reproduction signal and outputs a clock signal synchronizing with the multi-level data.

A waveform equalizer circuit 51 performs waveform equalization on the digital signal output from the A/D converter circuit 49.

A multi-level data determination circuit 52 determines the multi-level data. For instance, the data processing circuit of FIG. 11 is employed as the multi-level data determination circuit 52.

A multilevel-to-binary conversion circuit 53 converts the multi-level data to binary data. For instance, the circuit of FIG. 13 is employed as the multi-to-binary converter circuit 53.

An error correction circuit 54 performs error correction on the binary data output from the multi-to-binary converter circuit 53 by using the data for error correction.

The optical disk unit of the seventh embodiment also includes a mechanism for searching for data on the optical disk 60 by moving the optical head 41 in the radial directions of the optical disk 60, which mechanism is not shown in the drawing.

The optical disk unit of the seventh embodiment further includes an interface circuit for using the optical disk unit as an information storage device for a computer and a microprocessor controlling the operation of the entire optical disk unit, although the interface circuit and the microprocessor are not shown in the drawing.

Next, a description will be given of operations of the optical disk unit.

First, a description will be given of the operation of the optical disk unit in the case of recording binary data on the optical disk 60 by converting the binary data to multi-level data.

When binary data is input from a host computer to the error-correcting data addition circuit 48, for instance, the error-correcting data addition circuit 48 divides the input binary data into blocks each of a predetermined amount, and adds data for error correction to the input binary data.

Thereafter, the multi-level conversion circuit 47 converts the binary data to sets of multi-level data. Further, the synchronizing signal addition circuit 46 adds a synchronizing signal to every predetermined number of sets. The modulation circuit 45 generates a signal for driving the laser light in order to record on the optical disk 60 marks corresponding to the values of the multi-level data with the synchronizing signal added thereto. Then, the optical head 41 records the marks on the optical disk 60.

Next, a description will be given of the operation of the optical disk unit in the case of reading out a multi-level signal from the optical disk 60, performing multi-level data determination on the multi-level signal, and outputting the multi-level signal as binary data.

The optical head 41 emits the laser light of a constant intensity onto the optical disk 60, and obtains an electrical signal by photoelectrically converting a reflected light from the optical disk 60. The obtained signal is input to the operational amplifier circuit 42 so as to cause the servo circuit 43 to stably rotate the optical disk 60 and perform focus control and tracking control of the optical head 41, thereby reproducing a multi-level signal.

The PLL and synchronization detection circuit 50 detects the synchronizing signal from the reproduced multi-level signal, and generates a clock signal synchronizing with the multi-level data (symbols) in the PLL circuit of the PLL and synchronization detection circuit 50. The A/D converter circuit 49 obtains a digital signal from the reproduced multi-level signal supplied from the operational amplifier circuit 42. Thereafter, the digital data is subjected to waveform equalization in the waveform equalizer circuit 51 to be supplied to the multi-level data determination circuit 52, which outputs the multi-level data obtained as a result of the multi-level data determination.

The multi-level data is supplied to the multilevel-to-binary conversion circuit 53 to be converted to binary data. The binary data is then supplied to the error correction circuit 54, which detects and corrects errors and outputs the corrected binary data to the host computer.

The optical disk unit of the seventh embodiment includes a part limiting each symbol of the multi-level data to either even or odd numbers and setting the multi-level data as limited at the time of converting the binary data to the multi-level data, and a part having the multi-level data recorded on the information recording medium (optical disk 60) or transmitted to a transmission path. Therefore, a highly reliable data processing apparatus (information recording apparatus or information transmission apparatus) can be realized.

Further, the optical disk unit of the seventh embodiment includes a part inputting the multi-level signal as a signal reproduced from the information recording medium or a signal received from a transmission path, and a part performing multi-level data determination based on the fact that each symbol of the multi-level data is limited to either even or odd numbers. Therefore, a highly reliable data processing apparatus (information reproduction apparatus or information reception apparatus) can be realized.

Therefore, according to the seventh embodiment, a highly reliable data processing apparatus such as an information recording and reproduction apparatus or an information transmission and reception apparatus can also be realized.

Next, a description will be given of a data processing method according to an eighth embodiment of the present invention.

In the above-described embodiment, the data pattern is determined so that redundancy data is added to one symbol of multi-level data in its LSB or lower-side bit. Therefore, each symbol has its candidate value limited to either even or odd numbers, so that the multi-level data is likely to be determined wrongly in the case of high intersymbol interference. This disadvantage is eliminated in this embodiment.

First, a description will be given of the conditions of a multi-level signal to which the data processing method of this embodiment is applied. In this embodiment, one piece of multi-level data is referred to as a "symbol", and values that the symbol can take are referred to as "symbol values". If the symbol is three bits of data, for instance, the symbol can take eight values ranging from 0 to 7.

Further, a multi-level signal refers to an analog signal in the case of recording information on and reproducing information from an information recording medium such as an optical disk or in the case of transmitting or receiving information through a transmission path. Digital data to which the multi-level signal is A/D-converted is referred to as "signal data".

FIG. 16 is a diagram showing a matrix for illustrating the data processing method of this embodiment.

Here, the multi-level data is treated as sets of a plurality of symbols (S1 through Sm) with each symbol having n bits of data (n is an integer satisfying $n \geq 2$) and each set consisting of m symbols (m is an integer satisfying $m \geq 3$).

In this case, each symbol can take $2^n$ symbol values. MSB means the Most Significant Bit, and LSB means the Least Significant Bit.

A description will be given of a method of converting binary data to multi-level data.

First, $\{(n-k) \times m\}$-bit binary data is arranged in the upper-side (n−k) bits of m symbols in one set. Here, k is an integer satisfying $k \geq 1$ and $n \geq k$.

Further, (m×k−1)-bit binary data is converted to (m×k)-bit binary data and arranged in the lower-side k bits of the m symbols.

Thus, the (n×m−1)-bit binary data ($\{(n-k) \times m\} + (m \times k - 1) = (n \times m - 1)$) is converted to the m symbols of multi-level data of n bits per symbol.

Here, if (n×m)-bit binary data is simply arranged in the m symbols of multi-level data of n bits per symbol, each symbol takes a random symbol value, and there are $2^{(n \times m)}$ symbol value strings in one set.

However, by converting the (m×k−1)-bit binary data to the (m×k)-bit binary data and arranging the (m×k)-bit binary data in the lower-side k bits of the m symbols, the number of symbol value strings in one set can be limited to $2^{(m \times k - 1)}$.

In the case of n=3, m=3, and k=2, for instance, the number of symbol value strings is $2^{(3 \times 2)} = 64$ per set when (3×2)-bit binary data is simply arranged in each set of multi-level data of three bits per symbol and two symbols per set, while the number of symbol value strings can be limited to $2^{(2 \times 2 - 1)} = 2^3 = 8$ per set by converting three-bit (2×2−1=3) data to four-bit (2×2=4) data and arranging the four-bit data in the lower-side two bits of each symbol of each set.

Therefore, in this case, the degree of variation can be reduced to one-eighth of that in the case where each symbol value varies at random.

Thereby, the number of candidates in the case of determining the multi-level data is reduced by seven-eighths, so that the error rate at the time of the determination can be reduced.

According to the data processing method of this embodiment, at the time of converting binary data to multi-level data, (m×k−1) bits are converted to (m×k) bits to be arranged in the lower-side k bits of the multi-level data. Therefore, the number of candidates can be reduced at the time of determining the multi-level data, thereby reducing errors in the determination.

That is, according to the data processing method of the eighth embodiment, test data including all the combinations of a plurality of successive multi-level data is recorded on an information recording medium. Further, binary (m×k−1) bits are converted to m×k bits to be set in the lower-side k bits of the multi-level data, which is also recorded on the information recording medium. Therefore, errors at the time of determining the multi-level data can be reduced by using pattern recognition and the above-described conversion rule in combination in the multi-level data determination.

Next, a description will be given of a first method of converting the (m−1)-bit data to the m-bit data according to the eighth embodiment of the present invention.

FIG. 17 is a table showing data patterns for illustrating the first method.

In FIG. 17, m=2, and k=2.

In the case of adding "0" to the right side (LSB side) of three-bit data to convert the three-bit data to four-bit data, the three-bit data "000", "001", "010", "011", "100", "101", "110", and "111" are converted to four-bit data "0000", "0010", "0100", "0110", "1000", "1010", "1100", and "1110", respectively, as shown in (a) of FIG. 17.

In the case of inserting "0" between the MSB and the center bit of the three bit data, the three-bit data "000", "001", "010", "011", "100", "101", "110", and "111" are converted to four-bit data "0000", "0001", "0010", "0011", "1000", "1001", "1010", and "1011", respectively, as shown in (b) of FIG. 17.

Further, in the case of adding "0" to the left side (MSB side) of the three bit data, the three-bit data "000", "001", "010", "011", "100", "101", "110", and "111" are converted to four-bit data "0000", "0001", "0010", "0011", "0100", "0101", "0110", and "0111", respectively, as shown in (c) of FIG. 17.

Furthermore, in the case of adding "1" to the left side (MSB side) of the three-bit data, the three-bit data "000", "001", "010", "011", "100", "101", "110", and "111" are converted to "1000", "1001", "1010", "1011", "1100", "1101", "1110", and "1111", respectively, as shown in (d) of FIG. 17.

In addition, "1" may be inserted between the LSB and the center bit or added to the LSB side of the three-bit data.

According to the above-described conversion method, the conversion can be performed easily without creating a conversion table.

The first conversion method, which converts the (m×k−1)-bit data to the (m×k)-bit data only by adding "0" or "1" to the (m×k−1)-bit data, is thus realized easily.

Next, a description will be given of a second method of converting the (m×k−1)-bit data to the (m×k)-bit data according to the eighth embodiment of the present invention.

Figures 18, 19:
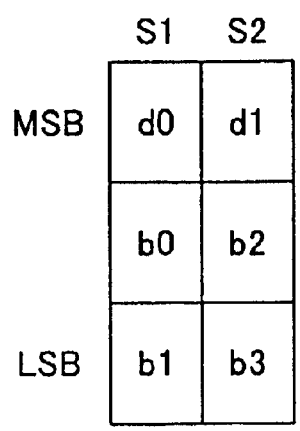
FIG. 18 is a table showing data patterns for illustrating a second data conversion method relating to the data processing method of the eighth embodiment.
FIG. 19 is a diagram showing a data bit arrangement in the case of processing two symbols of multi-level data of three bits per symbol as a set according to a tenth embodiment of the present invention.

FIG. 18 is a table showing data patterns for illustrating the second method.

FIG. 18 shows the results of conversion by the second method in the case of m=2 and k=2. In FIG. 18, the four-bit data patterns obtained after the conversion differ by more than two bits.

Thereby, the degree of separation among the data patterns is increased, so that errors can be reduced at the time of determining the multi-level data.

According to the second conversion method of the eighth embodiment, the (m×k−1)-bit data may be converted to the (m×k)-bit data, using a corresponding one of the data patterns of each conversion table which data patterns differ by more than two bits so that the degree of separation among the data patterns is increased. Therefore, errors can be reduced at the time of determining the multi-level data.

Next, a description will be given of a data processing method according to a ninth embodiment of the present invention.

According to the data processing method of the ninth embodiment, the (m×k−1)-bit data is converted to the (m×k)-bit data by selecting and using one of two different conversion methods for each set instead of using only one conversion method for all the sets.

For instance, a numeric string P consisting of "0"s and "1"s arranged to correspond to the sets for selecting the conversion tables of (a) and (b), respectively, of FIG. 18 is defined as P=0, 1, 0, 1, 0, 1, . . . or P=0, 0, 1, 1, 0, 0, . . . . The conversion table may be determined with respect to each set so that the conversion table (a) is selected in the case of P=0 and the conversion table (b) is selected in the case of P=1. Further, random numbers defined by an initial value and a generation method may be used as the numeric string P.

Since all the m-bit patterns are thus employed, the data patterns of the sets are prevented from being biased, so that the multi-level signal is prevented from having its specific frequency component from being emphasized. Therefore, the multi-level signal is easily adapted to the frequency characteristics of an information recording and reproduction system and a transmission path.

According to the data processing method of the ninth embodiment, two different conversion tables are employed to convert the (m×k−1)-bit data to the (m×k)-bit data. Therefore, since all the m-bit-data patterns are used, the data patterns of the converted data are prevented from being biased. Accordingly, the multi-level signal is prevented from having its specific frequency component from being biased so as to be adapted easily to the frequency characteristics of an information recording and reproduction system and a transmission path.

According to the ninth embodiment, one of the two tables is selected for a target set based on a predetermined numeric string P consisting of "0"s and "1"s each determined for a corresponding one of the sets. Since the numeric string P is generated thus easily, the data processing method of the ninth embodiment can be realized with ease. In the data processing method of the ninth embodiment, a uniquely determined numeric string is used to select one of the two conversion tables. Therefore, the selection can be made easily.

Further, according to the data processing method of the ninth embodiment, one of the two conversion tables may be selected by, instead of using the above-described fixed numeric string P, using data in a set to determine a value for the next set in the numeric string P.

For instance, a value P(1) for the first set in the numeric string P is determined to be "0" as an initial value, and a value P(i) for the ith set (i is an integer satisfying i≧2) in the numeric string P is defined based on the result of any of the following logical operations:

P(i)=P(i−1) EOR LSB of Sm of the (i−1)th set (EOR: exclusive OR operator)

P(i)=NOT MSB of S1 of the (i−1)th set (NOT: logical negation operator)

P(i)=LSB of S2 of the (i−1)th set

According to the data processing method of the ninth embodiment, in the numeric string P, a value for a set is interrelated with a value for the next set through the logical operation. Therefore, at the time of determining the multi-level data of a target set, the determination can be performed in consideration of a plurality of sets succeeding the target set, so that errors can be reduced at the time of determining the multi-level data.

Thus, the data processing method of the ninth embodiment includes, as well as a method of determining multi-level data over a plurality of sets, a method of recording multi-level data by relating data on a preceding set with a rule for converting binary data to multi-level data. Thereby, the multi-level data can be determined with increased reliability. The data processing method of the ninth embodiment is also applicable to a write-once or rewritable information recording medium.

If the result of the determination of the multi-level data of the target set is erroneous, however, the error is propagated to the succeeding sets. Therefore, the numeric string P may be terminated after determining k values (k is a predetermined integer satisfying k≧1) subsequent to the initial value, and thereafter, restarted from the initial value. This termination and restarting of the numeric string P may be performed repeatedly.

The numeric string P is terminated and then restarted from the initial value each time a predetermined number of values subsequent to the initial value are determined. Therefore, even if the result of the determination of the multi-level data of a target set contains an error, the propagation of the error can be limited to the predetermined number of sets after the target set.

Next, a description will be given of a data processing method according to a tenth embodiment of the present invention.

In the tenth embodiment, two-bit data is converted to multi-level data, and the multi-level signal is input as a signal reproduced from an information recording medium or received from a transmission path to be A/D-converted to digital data, from which the multi-level data is determined.

Here, for simplification of description, two symbols of multi-level data of three bits per symbol are processed as a set.

FIG. 19 is a diagram showing a data bit arrangement in the case of processing two symbols of multi-level data of three bits per symbol as a set.

In FIG. 19, each of d0 and d1 is binary data, and b0 through b3 are four-bit data to which three-bit data is converted by the conversion method described based on FIG. 18. Each three-bit symbol takes symbol values ranging from 0 to 7.

Figure 20:
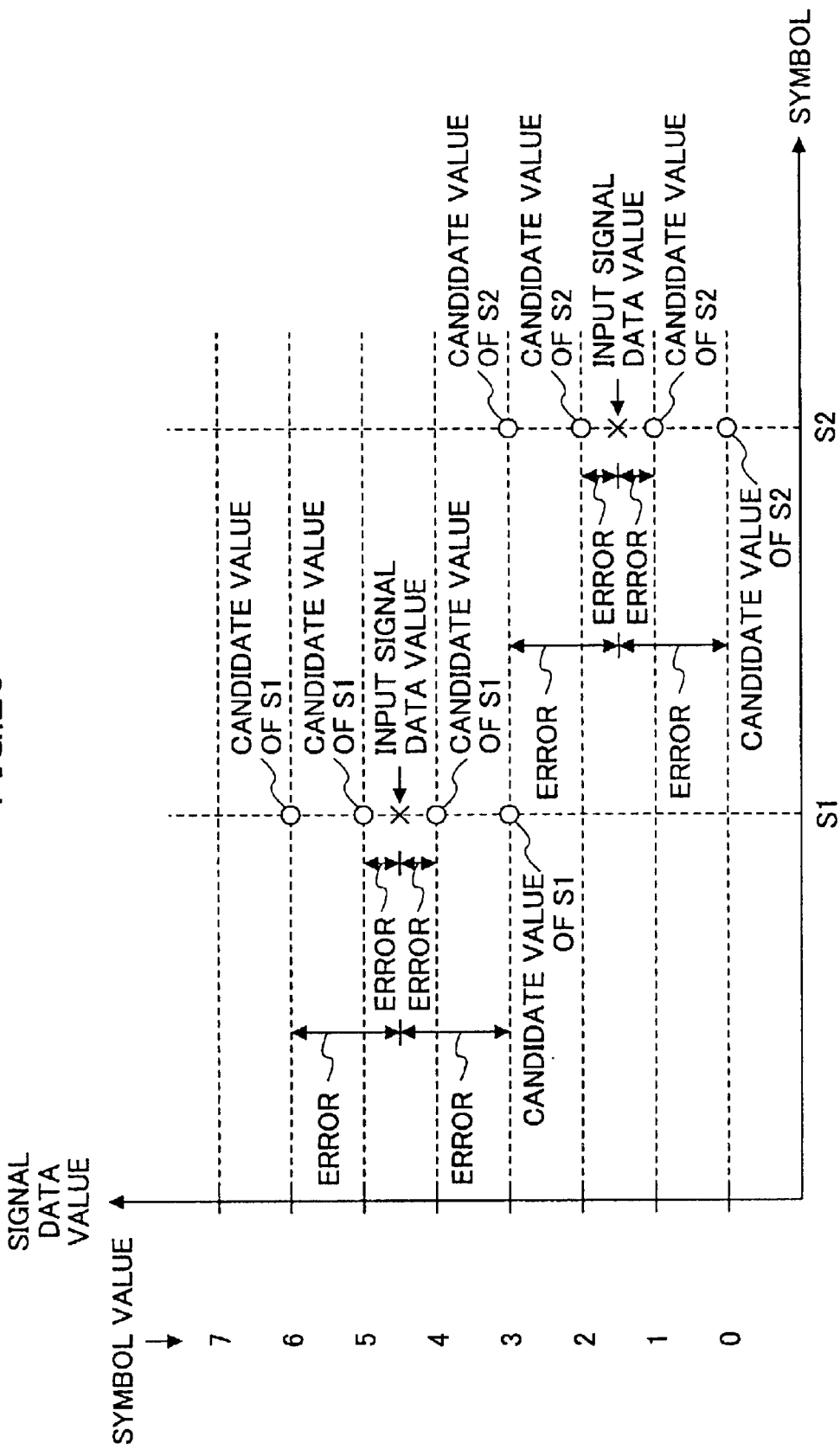
FIG. 20 is a diagram for illustrating a data processing method according to the tenth embodiment of the present invention.

FIG. 20 is a diagram for illustrating the data processing method of the tenth embodiment.

FIG. 20 shows a relationship between the signal data values of input symbols and their candidate symbol values. In FIG. 20, "X"s indicate the input signal data values of the first and second symbols S1 and S2 of one set of digital data obtained by A/D conversion.

Since data obtained based on the conversion table of FIG. 18 is arranged in the lower-side two bits of the two symbols, each symbol has four candidate symbol values. The four values closest to the input signal data value of a symbol are employed as the candidate symbol values of the symbol. Here, the conversion table of (a) of FIG. 18 is employed.

In FIG. 20, there are four candidate symbol values "3, 4, 5, and 6" for the first symbol S1, and four candidate symbol values "0, 1, 2, and 3" for the second symbol S2.

Since the lower-side two bits b0 and b1 of the first symbol S1 and the lower-side two bits b2 and b3 of the second symbol S2 are determined by the conversion table of (a) of FIG. 18, there are eight candidate symbol value strings "4-0", "4-3", "5-1", "5-2", "6-1", "6-2", "3-0", and "3-3" for the first and second symbols S1 and S2 as shown in FIG. 21. Since each of the first and second symbols S1 and S2 is three-bit data, the number of symbol value strings for the two symbols S1 and S2 is 64. However, one of the eight candidate symbol value strings of FIG. 21 which one minimizes the sum of errors between the ideal signal data values corresponding to the candidate symbol values and the input signal data values is selected and determined to be the multi-level data of the set.

Thus, by employing the determination result minimizing the error in the set, the reliability of the determination result is increased.

According to the data processing method of the tenth embodiment, at the time of converting binary data to multi-level data, the (m×k−1)-bit data is converted to the (m×k)-bit data to be set in the lower-side k bits of the multi-level data. Using this setting, the data processing method of the tenth embodiment obtains the minimum error between the ideal and input signal data values with respect to each candidate symbol value string, and determines the multi-level data based on the bit pattern of the conversion table which bit pattern provides the minimum value. Therefore, the determination is more reliable than in the case where one symbol is simply determined independently.

According to the data processing method of the tenth embodiment, the conversion table of (a) of FIG. 18 is employed in the above-described determination. Therefore, since the (m×k−1)-bit data is converted to the (m×k)-bit data, using a corresponding one of the data patterns of the conversion table which data patterns differ by more than two bits, the degree of separation among the data patterns is increased, thus reducing errors at the time of determining the multi-level data.

According to the data processing method of the tenth embodiment, the (m×k−1)-bit data may be converted to the (m×k)-bit data by adding "0" or "1" as shown in FIG. 17 instead of using the conversion table of (a) of FIG. 18.

Since the (m×k−1)-bit data can be converted to the (m×k)-bit data simply by adding "0" or "1", data processing for determining the multi-level data can be simplified and realized easily.

Further, the data processing method of the tenth embodiment may select and use one of two different conversion tables for each set instead of using only one conversion table as described above.

For instance, a numeric string P consisting of "0"s and "1"s arranged for selecting one of first and second conversion tables for each set is defined as P=0, 1, 0, 1, 0, 1, . . . or P=0, 0, 1, 1, 0, 0, . . . . The conversion table may be determined with respect to each set so that the first conversion table is selected in the case of P=0 and the second conversion table is selected in the case of P=1. Further, random numbers defined by an initial value and a generation method may be used as the numeric string P.

Since all the m-bit patterns are thus employed, the data patterns of the sets are prevented from being biased, so that the multi-level signal is prevented from having its specific frequency component from being emphasized. Therefore, the multi-level signal is easily adapted to the frequency characteristics of an information recording and reproduction system and a transmission path.

According to the tenth embodiment, the conversion table is selected for each set based on a predetermined numeric string P consisting of "0"s and "1"s each determined for a corresponding one of the sets. Therefore, the conversion table can be selected easily at the time of determining the multi-level data by using a uniquely determined numeric string P as a method for selecting one of two conversion tables.

Accordingly, the numeric string P is generated easily so that the data processing method of the tenth embodiment can be realized with ease.

Next, a description will be given of a data processing method according to an 11$^{th}$ embodiment of the present invention.

According to the data processing method of the 11$^{th}$ embodiment, one of two conversion tables may be selected by, instead of using a fixed numeric string P, using data in a set to determine a value for the next set in the numeric string P.

For instance, a value P(1) for the first set in the numeric string P is determined to be "0" as an initial value, and a value P(i) for the ith set (i is an integer satisfying i≧2) in the numeric string P is defined based on the result of any of the following logical operations:

P(i)=P(i−1) EOR LSB of Sm of the (i−1)th set (EOR: exclusive OR operator)

P(i)=NOT MSB of S1 of the (i−1)th set (NOT: logical negation operator)

P(i) LSB of S2 of the (i−1)th set

Thus, at the time of determining the multi-level data of a target set, the determination can be performed in consideration of a plurality of sets succeeding the target set, so that the multi-level data can be determined from more information. Therefore, errors can be reduced at the time of determining the multi-level data compared with the case where the multi-level data is determined independently set by set.

According to the data processing method of the 11$^{th}$ embodiment, at the time of converting binary data to multi-level data, the (m×k−1)-bit data is converted to the (m×k)-bit data to be set in the lower-side k bits of the multi-level data. Further, two conversion tables are used in converting the (m×k−1)-bit data to the (m×k)-bit data, and a value for a target set and a value for the next set are correlated through the logical operation in the numeric string P for selecting one of the two conversion tables for each set. Therefore, the multi-level data of the target set can be determined in consideration of not only the target set but also the next set. That is, the multi-level data determination can be performed in consideration of a plurality of sets. Therefore, errors can be reduced at the time of determining the multi-level data.

According to the data processing method of the 11$^{th}$ embodiment, the conversion tables of (a) and (b) of FIG. 18 may be used in converting the (m×k−1)-bit data to the (m×k)-bit data in the above-described determination process.

The (m×k−1)-bit data is converted to the (m×k)-bit data based on the conversion tables each having data patterns determined to differ by more than two bits so that the degree of separation among the data patterns is increased. Therefore, errors can be reduced at the time of determining the multi-level data.

In the 11$^{th}$ embodiment, the multi-level data of the preceding one of the two sets is determined based on the data for the two sets. However, the multi-level data of the preceding t (t is an integer satisfying t≧s) sets may be determined from data for s sets (s is an integer satisfying s≧2).

Further, the numeric string P for selecting one of the conversion tables for each set may be terminated when a predetermined number of values subsequent to an initial value are determined, and then restarted from the initial value. This termination and restarting of the numeric string P may be performed repeatedly.

According to the data processing method of the 11$^{th}$ embodiment, the termination and restarting of the numeric string P is performed each time the predetermined number of values subsequent to the initial value are determined. Therefore, even if the result of the determination of the multi-level data of a target set contains an error, the propagation of the error can be limited to the predetermined number of sets after the target set.

Any of the above-described data processing methods of the eighth through 11$^{th}$ embodiments can be realized as software that operates on a computer system using a microprocessor or a digital signal processor.

A description will be given of data processing circuits that realize functions according to the present invention by using special hardware.

Figure 22:
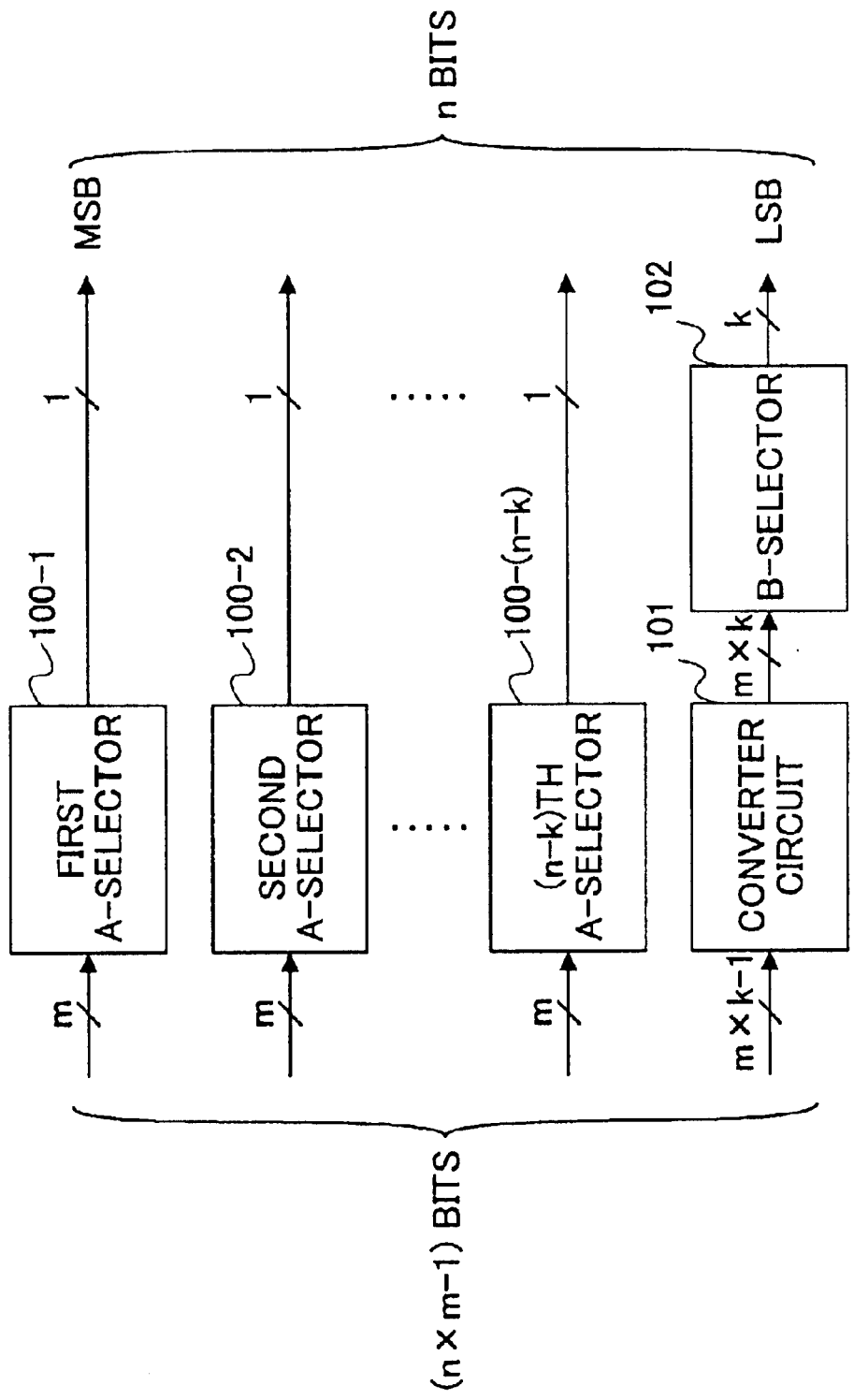
FIG. 22 is a block diagram showing the configuration of a data processing circuit according to a $12^{th}$ embodiment of the present invention.

FIG. 22 is a block diagram showing the configuration of a data processing circuit according to a 12$^{th}$ embodiment of the present invention.

The data processing circuit includes first through (n−k)th A-selectors 100-1 through 100-(n−k), a converter circuit 101, and a B-selector 102. Each of the first through (n−k)th A-selectors 100-1 through 100-(n−k) is supplied with m bits of input (n×m−1)-bit data and outputs one of the supplied m bits. The converter circuit 101 converts the remaining (m×k−1) bits of the input data to (m×k) bits, and outputs the (m×k) bits to the B-selector 102, which outputs k of the input (m×k) bits. Thus, the (n×m−1)-bit parallel data is input to the data processing circuit of the 12$^{th}$ embodiment, and the data processing circuit outputs parallel data of n bits per symbol.

The data processing circuit of the 12$^{th}$ embodiment further includes a circuit for controlling switching of each of the first through (n−k)th A-selectors 100-1 through 100-(n−k) and the B-selector 102 in timing with inputting and outputting of data, which circuit is not shown in the drawing.

Next, a description will be given of the operation of the data processing circuit for converting binary data to multi-level data.

Figure 23:
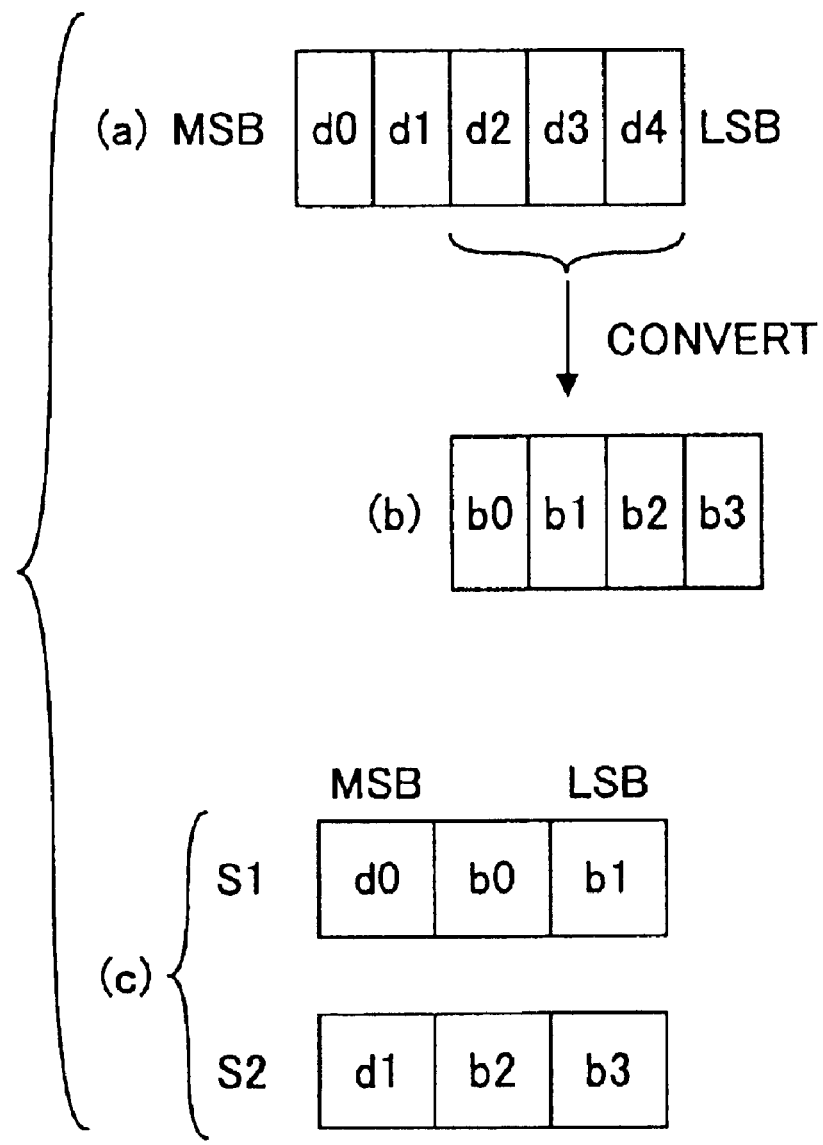
FIG. 23 is a diagram showing bit data arrangements for illustrating the operation of the data processing circuit of FIG. 22.

FIG. 23 is a diagram showing bit data arrangements for illustrating the operation of the data processing circuit of FIG. 22. In FIG. 23, m=2, n=3, and k=2.

As shown in (a) of FIG. 23, five-bit (n×m−1=3×2−1=5) input parallel data has bits d0 through d4 arranged from MSB to LSB. The lower-side three (m×k−1=2×2−1=3) bits d2 through d4 are converted to four (m×k=2×2=4) bits b0 through b3 in the converter circuit 101 as shown in (b) of FIG. 23.

The converter circuit 101 may be realized as a conversion table by using a semiconductor memory and logic circuits. Alternatively, the converter circuit 101 may be realized by additional interconnection lines if the conversion is simply performed by adding "0" or "1" to the input data.

Thereafter, the outputs of one (n−k=1) of the A-selectors 100-1 through 100-(n−k) (in this case, the A-selector 100-1) and the B-selector 102 are successively switched so that three-bit parallel data are output to have their bit data arranged in two symbols S1 and S2 as shown in (c) of FIG. 23.

Since the data processing circuit of the 12$^{th}$ embodiment can convert binary data to multi-level data by the above-described simple hardware, the data processing circuit can perform processing at high speed.

Further, the data processing circuit of the 12$^{th}$ embodiment may include a shift register circuit so that serial data as well as parallel data may be input to the data processing circuit.

In this case, the data processing circuit is realized by a serial-input circuit to convert binary data to multi-level data. Therefore, an interface between the data processing circuit and another circuit may require fewer lines.

In the case of using two types of conversion tables and selecting one of the two conversion tables based on the numeric string P, the function may be added to the converter circuit 101 and the control circuit.

Next, a description will be given of a data processing circuit according to 13$^{th}$ embodiment of the present invention.

Figure 24:
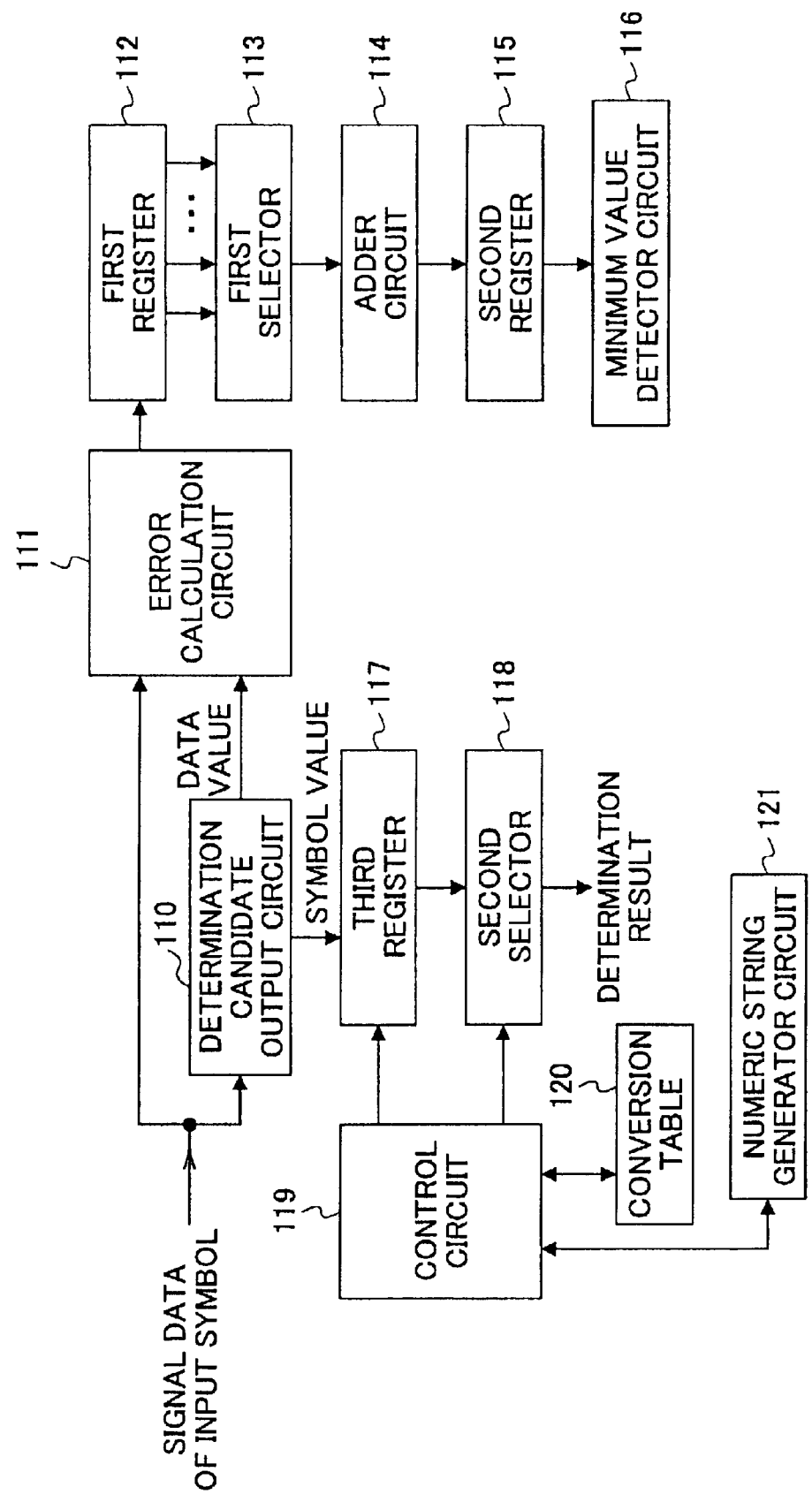
FIG. 24 is a block diagram showing a data processing circuit according to a $13^{th}$ embodiment of the present invention.

FIG. 24 is a block diagram showing the data processing circuit of the 13$^{th}$ embodiment.

Signal data obtained after A/D-converting a multi-level signal is input symbol by symbol to the data processing circuit so that the data processing circuit performs multi-level data determination.

A description will be given below of the main components of the data processing circuit and their functions.

The signal data of an input symbol is input to a determination candidate output circuit 110. The determination candidate output circuit 110 then outputs candidate symbol values for the input signal data and their respective corresponding ideal signal data values. As shown in FIG. 20, for instance, if the signal data value of the input symbol S1 falls between the symbol values "4" and "5", the candidate symbol values are determined to be "3", "4", "5", and "6", so that the determination candidate output circuit 110 outputs the ideal signal data values corresponding to the symbol values "3", "4", "5", and "6". The determination candidate output circuit 110 may be realized by using a semiconductor memory and logic circuits in the form of a table storing candidate symbol values and their respective corresponding ideal signal data values as data with the signal data values of the symbols of A/D-converted data being employed as addresses.

An error calculation circuit 111 outputs the absolute values of the differences between the signal data value of the input symbol and the ideal signal data values corresponding to the candidate symbol values output from the determination candidate output circuit 110. The error calculation circuit 111 may output the squares of the differences.

A first register (circuit) 112 retains the outputs of the error calculation circuit 111 for the symbols of one or a plurality of sets.

A first selector (circuit) 113 performs a selecting operation on the outputs of the first register 112 in accordance with the bit patterns of a conversion table 120, and outputs the error values as selected in combinations so that the sum of the error values of each combination of the set(s) is calculated.

An adder circuit 114 adds up the error values of each combination output from the first selector 113, and outputs the sum of the error values of each combination to a second register (circuit) 115.

The second register 115 retains the outputs of the adder circuit 114.

A minimum value detector circuit 116 detects the minimum value of the outputs of the second register 115.

A third register (circuit) 117 retains the candidate symbol values (candidate symbol value strings) for the symbols of the set(s) output from the determination candidate output circuit 110.

A second selector 118 performs a selecting operation on the candidate symbol values retained in the third register 117 in accordance with the bit pattern of the conversion table 120 which bit pattern corresponds to the minimum value detected in the minimum value detector circuit 116, and outputs the selected candidate symbol values as a determination result.

A control circuit 119 controls the operation of the entire data processing circuit.

The conversion table 120 is equal to that used in converting binary data to the multi-level data in this embodiment.

A numeric string generator circuit 121 generates the numeric string P for selecting one of two conversion tables included in the conversion table 120 for each set. If the conversion table 120 consists of only one conversion table, the numeric string generator circuit 121 is unnecessary. Further, if the numeric string P is uniquely determined, the numeric string generator circuit 121 generates the same numeric string P as used in converting the binary data to the multi-level data. Alternatively, if the numeric string P is determined through a logical operation with data in a given set, the numeric string generator circuit 121 generates the numeric string P by inputting the candidate symbol values.

According to the data processing circuit including the above-described components, the error values between the input signal data values of the symbols of the set(s) and their respective ideal signal data values corresponding to the candidate symbol values of the input symbols can be retained, and further, the sum of the error values of each combination can be retained.

Further, the minimum value of the sums of the error values can be detected, and the determination result of each symbol can be output by selecting one of the bit patterns of the conversion table 120 which one-corresponds to the detected minimum value.

The data processing circuit of the $13^{th}$ embodiment, which realizes the multi-level data determination operation with a circuit, can perform processing at high speed.

Figure 25:
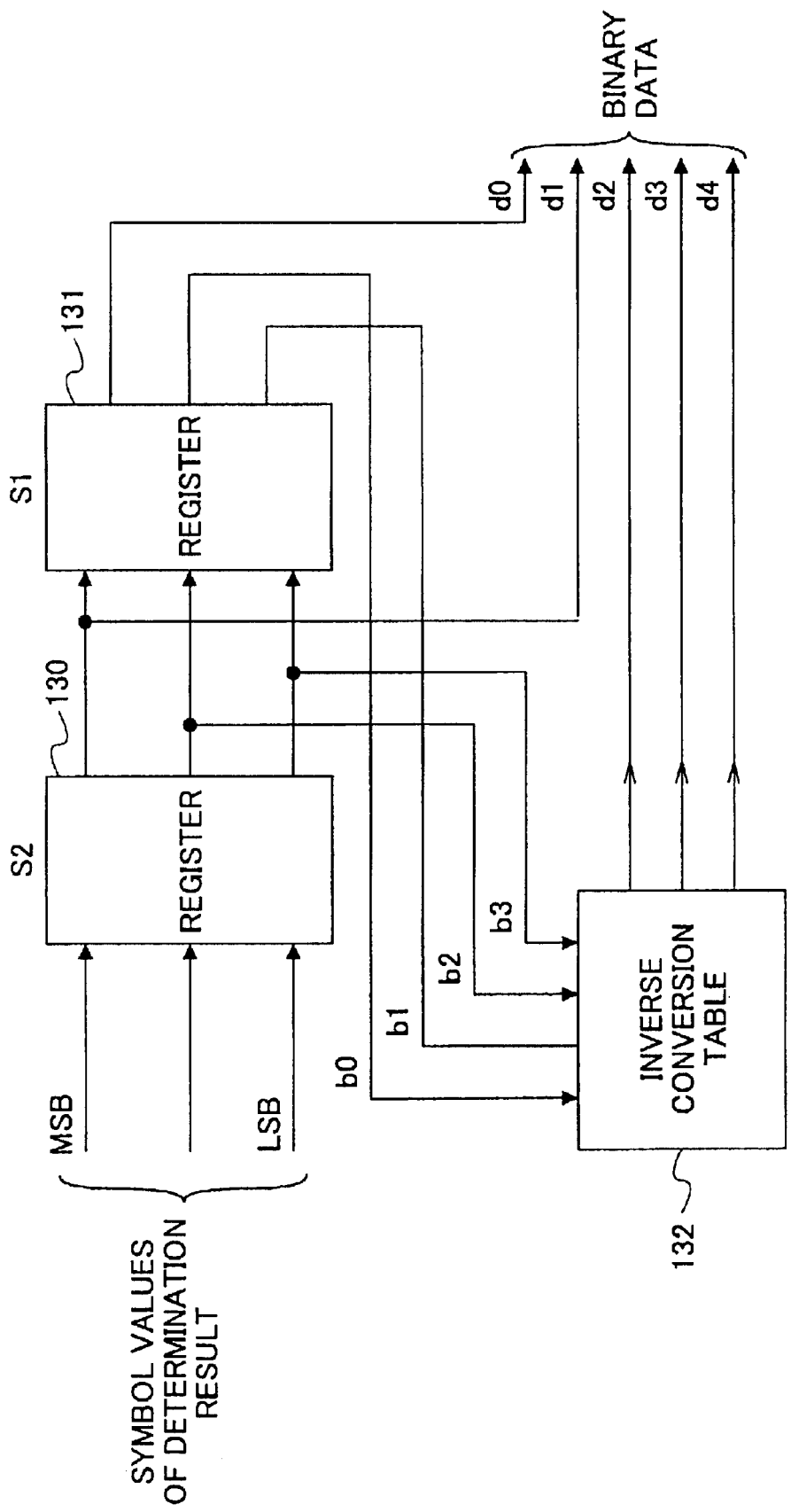
FIG. 25 is a block diagram showing a circuit that converts multi-level data obtained as a result of a multi-level data determination operation to binary data according to the $13^{th}$ embodiment of the present invention.

FIG. 25 is a block diagram showing a circuit that converts to binary data the multi-level data (symbol values) obtained as a result of the above-described multi-level data determination operation. The circuit of FIG. 25 converts the multi-level data determination result of three bits per symbol and two symbols per set as shown in (c) of FIG. 23 to five-bit binary data.

The circuit retains the symbol value data obtained as a result of the determination in the two stages of three-bit registers 130 and 131. Then, the circuit inversely converts the lower-side two bits of the registers 130 and 131 (four bits in total) to three bits based on an inverse conversion table 132, and outputs the three bits together with the remaining two bits as five-bit parallel data.

Since the multi-level data determination is thus performed by a circuit, data processing can be performed at high speed compared with software processing.

Further, the data processing circuit of the $12^{th}$ embodiment for converting binary data to multi-level data and the data processing circuit of the $13^{th}$ embodiment for determining multi-level data are useful even if each circuit is independently incorporated into an apparatus for recording information on or reproducing information from a recording medium or an apparatus for transmitting information to or receiving information from a transmission path.

Further, the above-described circuits may be usefully incorporated into a recording and reproduction apparatus or a transmission and reception apparatus in the form of a single (integrated) circuit.

As previously described, such an integrated circuit having the data processing circuits for converting binary data to multi-level data and for determining multi-level data can be incorporated into an information recording and reproduction apparatus and an information transmission and reception apparatus.

In such an integrated circuit, the data processing circuit for converting binary data to multi-level data may be of either a parallel-input type or a serial-input type. In the case of a serial-input data processing circuit, an interface requiring fewer lines can be established between the data processing circuit and another circuit.

In the $13^{th}$ embodiment, A/D conversion quantizing the amplitude of a reproduction signal is performed to quantize the multi-level signal, while the quantization method as previously described based on FIG. 14 may also be employed.

Next, a description will be given of a data processing apparatus according to a $14^{th}$ embodiment of the present invention.

An optical disk unit, which is the data processing apparatus of this embodiment, has the same configuration as that of FIG. 15 of the seventh embodiment. The optical disk unit of the $14^{th}$ embodiment is different from that of the seventh embodiment in that the data processing circuit of FIG. 22 is used for the multi-level conversion circuit 47, the data processing circuit of FIG. 24 is used for the multi-level data determination circuit 52, and the circuit of FIG. 25 is used for the multilevel-to-binary conversion circuit 53.

The components (circuits) of the optical disk unit of this embodiment performs the same functions as those of the optical disk unit of the seventh embodiment so that the optical disk unit of this embodiment can realize the above-described data processing method according to the present invention.

The optical disk unit of the $14^{th}$ embodiment includes a part converting (m×k−1)-bit data to (m×k)-bit data and arranging the (m×k)-bit data in the lower-side k bits of the symbols of each set at the time of converting binary data to multi-level data, and a part having the multi-level data recorded on the information recording medium (optical disk 60) or transmitted to a transmission path. Therefore, a highly reliable data processing apparatus (information recording apparatus or information transmission apparatus) can be realized.

Further, the optical disk unit of the 14th embodiment includes a part inputting a multi-level signal as a signal reproduced from the information recording medium or a signal received from a transmission path, and a part performing multi-level data determination based on the fact that the lower-side k bits of the multi-level data are the (m×k)-bit data to which the (m×k−1)-bit data is converted. Therefore, a highly reliable data processing apparatus (information reproduction apparatus or information reception apparatus) can be realized.

Therefore, according to the 14th embodiment, a highly reliable data processing apparatus such as an information recording and reproduction apparatus or an information transmission and reception apparatus can also be realized.

As previously described, according to the data processing methods, circuits, and apparatuses of the present invention, multi-level data can be reproduced correctly with more ease even at such recording density that an excellent eye opening cannot be obtained.

Next, a description will be given, with reference to the ninth embodiment, of test data recorded on an information recording medium separately from the multi-level data.

Table 8 below shows test data in the case of three successive symbols each taking eight values.

TABLE 8

| 000 | 001 | 002 | 003 | 004 | 005 | 006 | 007 |
|-----|-----|-----|-----|-----|-----|-----|-----|
| 010 | 011 | 012 | 013 | 014 | 015 | 016 | 017 |
| 020 | 021 | 022 | 023 | 024 | 025 | 026 | 027 |
| ... | ... | ... | ... | ... | ... | ... | ... |
| ... | ... | ... | ... | ... | ... | ... | ... |
| 760 | 761 | 762 | 763 | 764 | 765 | 766 | 767 |
| 770 | 771 | 772 | 773 | 774 | 775 | 776 | 777 |

As shown in Table 8, all the combinations of the three successive symbol values each taking the eight values ($8^3$=512 combinations) are written as test data.

If intersymbol interference affects only the adjacent preceding and succeeding multi-level data, all the combinations of three successive symbols are written as test data.

If intersymbol interference affects the preceding two symbols and the succeeding two symbols, all the combinations of five successive symbols ($8^5$=32768 combinations) are written as test data.

The test data is recorded on the optical disk (information recording medium) 60 of FIG. 15 on an inner part around its inner circumference, an outer part along its outer periphery, or an intermediate part between the inner and outer parts.

Alternatively, the test data may be recorded at every rotation of the optical disk 60. Further, the test data may be recorded by being inserted, in every given period, between multi-level data to which binary data is converted.

Thus, the multi-level data can be stably reproduced with the effect of a variation in a reproduction signal at a recording position on the optical disk 60 being controlled.

Since the optical disk (information recording medium) 60 is recorded with the multi-level data to which the binary data is converted and the test data, pattern recognition and the rule for converting the binary data to the multi-level data (conversion rule) can be employed in combination at the time of determining the multi-level data. Therefore, a highly reliable recording medium reducing errors in the multi-level data determination can be provided.

Next, a description will be given, with reference to the drawings for the tenth embodiment, of determining the multi-level data in the multi-level data determination circuit 52 of FIG. 15 at the time of reproducing data from the optical disk 60 recorded with the test data and the multi-level data to which the binary data is converted.

For simplification of description, two symbols of multi-level data of three bits per symbol are processed as a set.

Each three-bit symbol takes values ranging from 0 to 7. FIG. 19 shows the data bit arrangement of this case.

Each of d0 and d1 is binary data, and b0 through b3 are four bits of data to which three bits of data are converted by the conversion method described based on FIG. 18.

The test data in the case of the three successive symbol values each taking the eight values is employed.

Figures 26, 27:
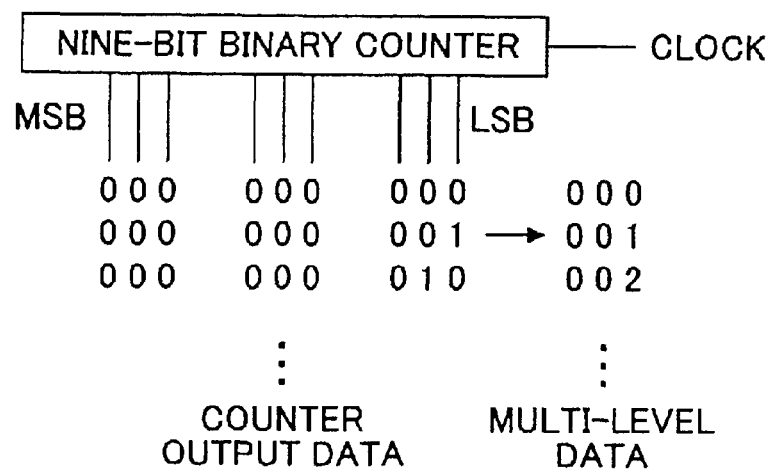
FIG. 26 is a table storing the signal values of the center multi-level data of all the combinations of three successive symbols of multi-level data in the test data of the multi-level data determination circuit of FIG. 15.
FIG. 27 is a schematic diagram showing a test data generator circuit according to the present invention.

First, the test data is reproduced so that the table shown in FIG. 26 is created. The table of FIG. 26 stores the signal value of the center multi-level data (symbol) of each of the combinations of the three-successive-symbol multi-level data.

T(p, q, r) (p, q, r=0 through 7) represents the signal value of the center multi-level data (symbol) of the three successive symbols p, q, and r.

The signal value may be obtained by reproducing the test data once or by reproducing the test data a plurality of times and averaging the obtained values.

Next, a description will be given of a method of outputting first multi-level data by using the above-described table.

In determining multi-level data, the signal values of the multi-level data of the three successive symbols are input and the symbol value of the center multi-level data is output.

In order to perform this operation, first, the preceding and succeeding multi-level data are temporarily determined. Thresholds for temporarily determining the preceding and succeeding multi-level data are calculated from the above-described table.

Since the thresholds for temporarily determining the preceding and succeeding multi-level data are determined from the signal values in the table, the effect of a variation in a reproduction signal can be reflected in the multi-level data determination so that errors at the time of the multi-level data determination can be reduced.

First, the representative value L(s) of the corresponding signal values of each of the symbol values (s=0 through 7) is calculated through the operation based on the equation (1) shown below.

Next, a threshold X(u) (u=0 through 6) between adjacent symbol values is calculated through the operation based on the equation (2) shown below.

Then, letting each of the signal values of the preceding and succeeding multi-level data be Y, v is temporarily determined to be a symbol value for Y based on the expressions (3).

$$L(s) = \sum_{p,r=0}^{7} T(p, s, r)/64 \quad (1)$$

$$X(u)=(L(u)+L(u+1))/2 \quad (2)$$

i) v=7 if Y≧X(6)

ii) X(v)>Y≧X(v−1)

iii) v=0 if X(0)>Y  (3)

With the thus obtained symbol values of the preceding and succeeding multi-level data being p and r, q that minimizes an error between the signal value of the center multi-level data and T(p, q, r) is output as the first multi-level data.

Thus, according to the present invention, the signal values of the center multi-level data of a plurality of successive multi-level data are stored in the table, and the preceding and succeeding multi-level data are temporarily determined at the time of determining the multi-level data. Therefore, the amount of data of the table can be reduced, and the amount of processing can be reduced to increase the processing rate.

Next, a description will be given, with reference to FIG. 20, of the operation of determining whether the output first multi-level data complies with a conversion rule at the time of recording.

FIG. 20 shows the signal data values of input symbols and their respective candidate symbol values.

The input signal data value of each of the first and second symbols S1 and S2 of one set is indicated by an "X".

Since the data converted through the conversion table (in this case, (a) of FIG. 18) is arranged in the lower-side two bits of the two symbols, each symbol takes four candidate symbol values closest to the input signal data value. In FIG. 20, the candidate symbol values of the symbol S1 are 3, 4, 5, and 6, and the candidate symbol values of the symbol S2 are 0, 1, 2, and 3.

Since the lower-side two bits b0 and b1 of the symbol S1 and the lower-side two bits b2 and b3 of the symbol S2 are determined by the conversion table (a) of FIG. 18, there are eight candidate symbol value strings "4-0", "4-3", "5-1", "5-2"/, "6-1", "6-2", "3-0", and "3-3" for the first and second symbols S1 and S2 as shown in FIG. 21.

If the first multi-level data of the two symbols S1 and S2 match any of the eight candidate symbol value strings, the first multi-level data are determined to be correct.

If the first multi-level data do not match any of the eight candidate symbol value strings, one of the eight candidate symbol value strings in which one the error between the input signal data values and the signal values corresponding to the candidate symbol values is minimized is output as second multi-level data.

At this point, the representative signal values L of the symbol values are used as the signal values corresponding to the candidate symbol values. Alternatively; the signal values in the table of FIG. 26 are used. For instance, if the candidate symbol value of the symbol S1 is 4 with the symbol value of the symbol S2 being 0 and the symbol value of the symbol preceding the symbol S1 is 5, T(5, 4, 0) is used as the signal value corresponding to the symbol S1.

Although there are 64 symbol value strings for the two symbols S1 and S2 each of three-bit data, the number of multi-level data determination candidates can be reduced to eight due to the conversion rule, so that the reliability of multi-level data determination can be increased.

Further, in the case of using the signal values in the table as the signal values corresponding to the candidate symbol values at the time of calculating the error, the interrelationship among the multi-level data is more reflected in determining the multi-level data. Therefore, the reliability of the determination result is further increased.

Thus, according to the present invention, a table is created by reproducing test data recorded on an information recording medium so that multi-level data determination is performed using pattern recognition. Thereafter, the data that does not comply with the conversion rule at the time of recording is again determined. Therefore, errors at the time of multi-level data determination can be reduced.

Further, the above-described data processing method of the present invention is also applicable to a write-once or rewritable information recording medium.

Accordingly, by determining whether the first multi-level data reproduced by pattern recognition is correct based on whether the first-multi-level data complies with the conversion rule for converting, the binary data to the multi-level data, and outputting the second multi-level data complying with the conversion rule if the first multi-level data is determined to be incorrect, the multi-level data can be reproduced with more accuracy.

In the above description, when the first multi-level data in one set does not comply with the conversion rule, the second multi-level data is output using only data in the set. However, if data in another set is used in the conversion rule at the time of recording, the second data may be output based on the set and the other set, so that the first multi-level data of the set is replaced by the thus obtained second multi-level of the set.

Next, a description will be given of the operation at the time of outputting the second multi-level data based on a plurality of sets.

First, the candidate having the minimum error is selected in each of the cases of P=0 and P=1 for each set.

Next, with respect to the candidate of the leading one of the sets in each of the cases of P=0 and P=1, the candidate of the next set which candidate is related to the leading set by P is selected, so that two candidate value strings are created for the sets. The candidate of a target set is selected from one of the two candidate value strings which one has the smaller error, and output as the second multi-level data of the target set.

Thus, in the case of determining multi-level data, a plurality of sets including the target set can be considered, so that errors can be reduced.

According to the data processing method of the present invention, multi-level data determination is performed over a plurality of related sets at the time of outputting the second multi-level data. Therefore, errors can be reduced at the time of determining multi-level data.

In the above description, only the candidate symbol values of each set which candidate values having the minimum error are employed at the time of outputting the second multi-level data based on a plurality of sets. Such candidate symbol values may be referred to as minimum-error candidate symbol values. However, other values may be employed as candidate symbol values.

For instance, the combination of candidate symbol values of a plurality of sets which combination has the minimum error may be selected as the second multi-level data from the combinations of the candidate symbol values of the sets including those having the second smallest error for the respective sets, or from the combinations of all the candidate symbol values of the sets.

Therefore, when the combination of the minimum-error candidate symbol values of the sets does not have the minimum sum of errors, the accuracy of multi-level data determination can be increased by using the above-described method.

Thus, according to the data processing method of the present invention, not only the minimum-error candidate symbol values of each set, but also other candidate symbol values may be included at the time of multi-level data determination. Therefore, when the combination of the minimum-error candidate symbol values of a plurality of sets does not have the minimum sum of errors, the accuracy of multi-level data determination can be increased by using the above-described method.

The above-described multi-level data processing method can be realized as software operating on a computer system using a microprocessor or a digital signal processor.

The above-described data processing method can be realized by using hardware as described in the $12^{th}$ embodiment.

According to the data processing circuit of the present invention, test data including all the combinations of a plurality of successive multi-level data is recorded on an information recording medium. Further, binary (m×k−1) bits are converted to m×k bits to be set in the lower-side k bits of the multi-level data, which is also recorded on the information recording medium. Therefore, errors at the time of determining the multi-level data can be reduced by using pattern recognition and the above-described conversion rule in combination in the multi-level data determination.

Further, the data processing circuit of the present invention is also applicable to a write-once or rewritable information recording medium.

Further, as described in the $12^{th}$ embodiment, the data processing circuit of the present invention may include a shift register circuit so that serial data as well as parallel data may be input to the data processing circuit.

Further, in the case of using two types of conversion tables and selecting one of the two conversion tables based on the numeric string P, the function may be added to the converter circuit 101 and the control circuit as described in the $12^{th}$ embodiment.

Since multi-level data is thus recorded with the rule for converting the binary data to the multi-level data being related to data on the preceding set, the multi-level data can be determined in consideration of a plurality of sets, so that errors can be reduced.

Further, the multi-level data is also determined over a plurality of sets. Therefore, the multi-level data can be determined with increased reliability, and the present invention is also applicable to a write-once or rewritable information recording medium.

FIG. 27 is a schematic diagram showing a test data generator circuit.

The output of the nine-bit binary counter is divided into three groups each of three bits, and each group of three bits is output as three-bit multi-level data taking eight values. Thereby, the test data is generated.

Next, a description will be given of a circuit outputting the first multi-level data (first multi-level data output circuit) in the multi-level data determination circuit 52 of FIG. 15.

Figure 28:
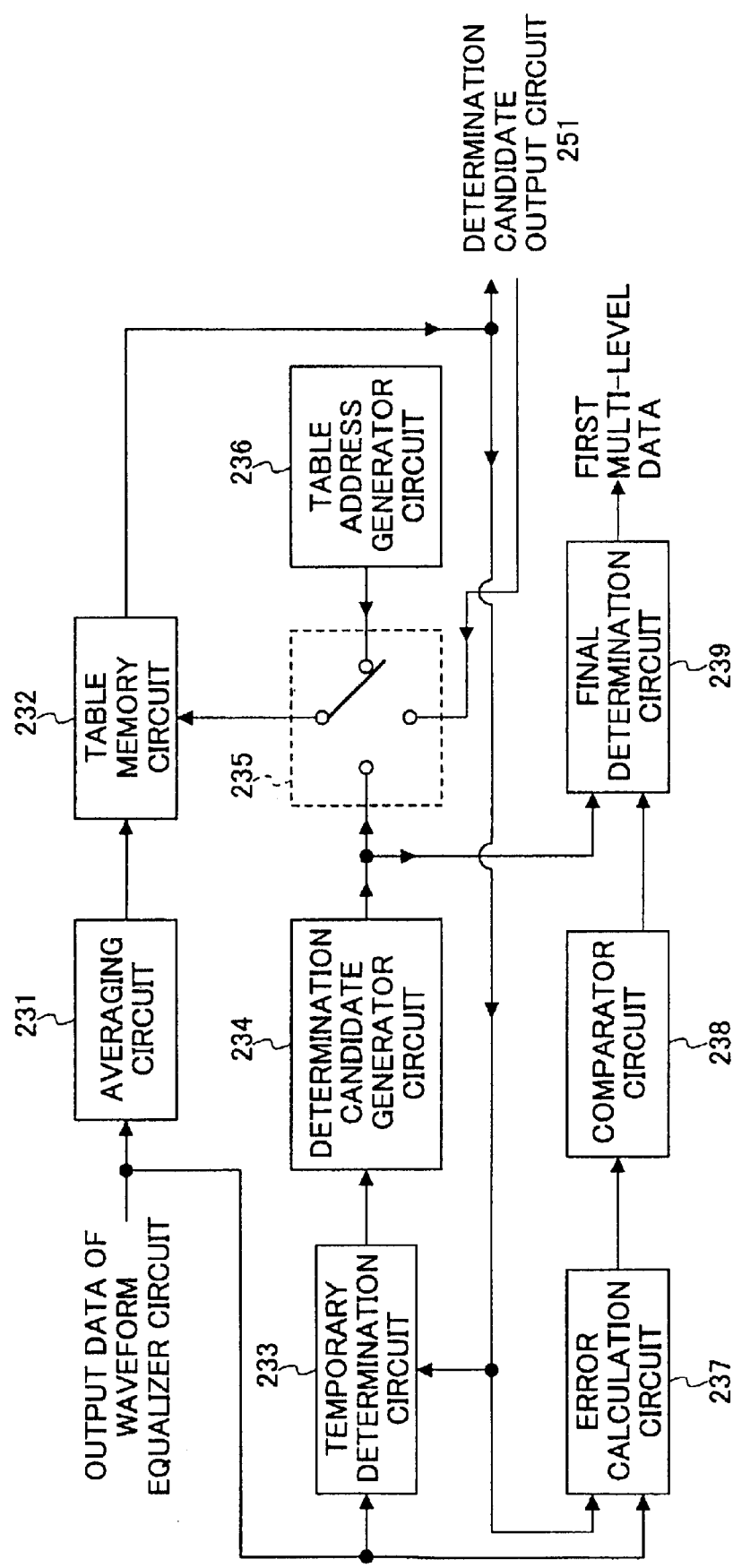
FIG. 28 is a block diagram showing a first multi-level data output circuit in the multi-level data determination circuit of FIG. 15.

FIG. 28 is a block diagram showing the first multi-level data output circuit.

An averaging circuit 231 obtains the average of each signal value of the test data.

A table memory circuit 232 is a memory circuit for realizing the table of FIG. 26. The table memory circuit 232 includes a data input terminal for inputting the signal value at the time of creating the table and a data output terminal for outputting the signal value at the time of calculating an error. Further, the table memory circuit 232 uses address input terminals as a plurality of multi-level data values.

For instance, if a plurality of sets of three successive eight-value data are formed in the table, nine-bit address data is used three bits by three bits. Further, the table memory circuit 232 also outputs the signal value to a later-described circuit for outputting the second multi-level data (second multi-level data output circuit) of FIG. 30.

A temporary determination circuit 233 determines thresholds by performing processing based on the above-described equations (1) and (2) by using an adder, and temporarily determines the multi-level data on both ends of three successive multi-level data by performing processing based on the above-described expressions (3) by using a comparator.

A determination candidate generator circuit 234 outputs the symbol values of both end multi-level data and the candidate symbol value (0 through 7) of the center multi-level data of the three successive multi-level data output from the temporary determination circuit 233.

An address switching circuit 235 switches address inputs to the table memory circuit 32. At the time of creating the table and calculating the thresholds for temporarily determining both end multi-level data, the address switching circuit 235 performs switching so that the output of a table address generator circuit 236 is input to the table memory circuit 232. At the time of determining multi-level data, the address switching circuit 235 performs switching so that the output of the determination candidate generator circuit 234 is input to the table memory circuit 232. Further, the address switching circuit 235 also has the switching function for outputting from the table signal values corresponding to candidate symbol values determined in a determination candidate output circuit 251 of the second multi-level data output circuit of FIG. 30.

The table address generator circuit 236, in the case of creating the table, reproduces the test data recorded on the optical disk, and inputs to the table memory circuit 232 the signal values of the center multi-level data of all the combinations of the three successive multi-level data. The symbol values of the multi-level data at this time are known as the test data, and can be generated in the test data generator circuit of FIG. 27. The table address generator circuit 236 inputs the symbol values of the multi-level data to the addresses of the table memory circuit 232. Further, the table address generator circuit 236 generates addresses for calculating the thresholds for the temporary determination.

An error calculation circuit 237 calculates errors between the signal value of the input center multi-level data and the signal values corresponding to the candidate symbol values.

A comparator circuit 238 obtains the minimum one of the errors output from the error calculation circuit 237.

A final determination circuit 239 outputs one of the candidate symbol values which one corresponds to the minimum error.

The first multi-level data output circuit further includes a main determination circuit and a circuit for controlling the operation of the entire optical disk unit, which circuits are not shown in the drawing.

Next, a description will be given of the operation of the above-described first multi-level data output circuit.

First, the test data recorded on the optical disk (information recording medium) is reproduced, and the signal value of the center multi-level data of each multi-level data of three successive symbols is input to the table memory circuit 232 by the table address generator circuit 236 and the averaging circuit 231, so that the table is created.

Next, the signal values in the table are input to the temporary determination circuit 233 so that thresholds for temporary determination are calculated.

The thresholds for temporary determination are thus determined from the signal values in the table. Therefore, the effect of a variation in a reproduction signal can be reflected in multi-level data determination, so that errors at the time of multi-level data determination can be reduced.

Next, multi-level data to which the binary data recorded on the optical disk is reproduced, and the signal values of the multi-level data on both ends of multi-level data of three successive symbols are input to the temporary determination circuit 233. Candidate symbol values determined as a result of the temporary determination are output from the determination candidate generator circuit 234. The errors between the signal value of the center multi-level data of the multi-level data of the three successive symbols and the signal values in the table corresponding to the candidate symbol values are calculated in the error calculation circuit 237, and the minimum of the errors is obtained in the comparator circuit 238. The final determination circuit 239 outputs as the first multi-level data one of the candidate symbol values which one corresponds to the minimum of the errors.

Thus, the signal value of the center multi-level data of each set of a plurality of successive multi-level data is stored in the table, and the preceding and succeeding multi-level data are temporarily determined at the time of determining the multi-level data. Therefore, memory capacity for the table can be reduced, and the amount of processing can be decreased. Accordingly, the cost of the data processing apparatus according to the present invention can be reduced, and data processing can be performed at a high rate according to the present invention.

Figure 29:
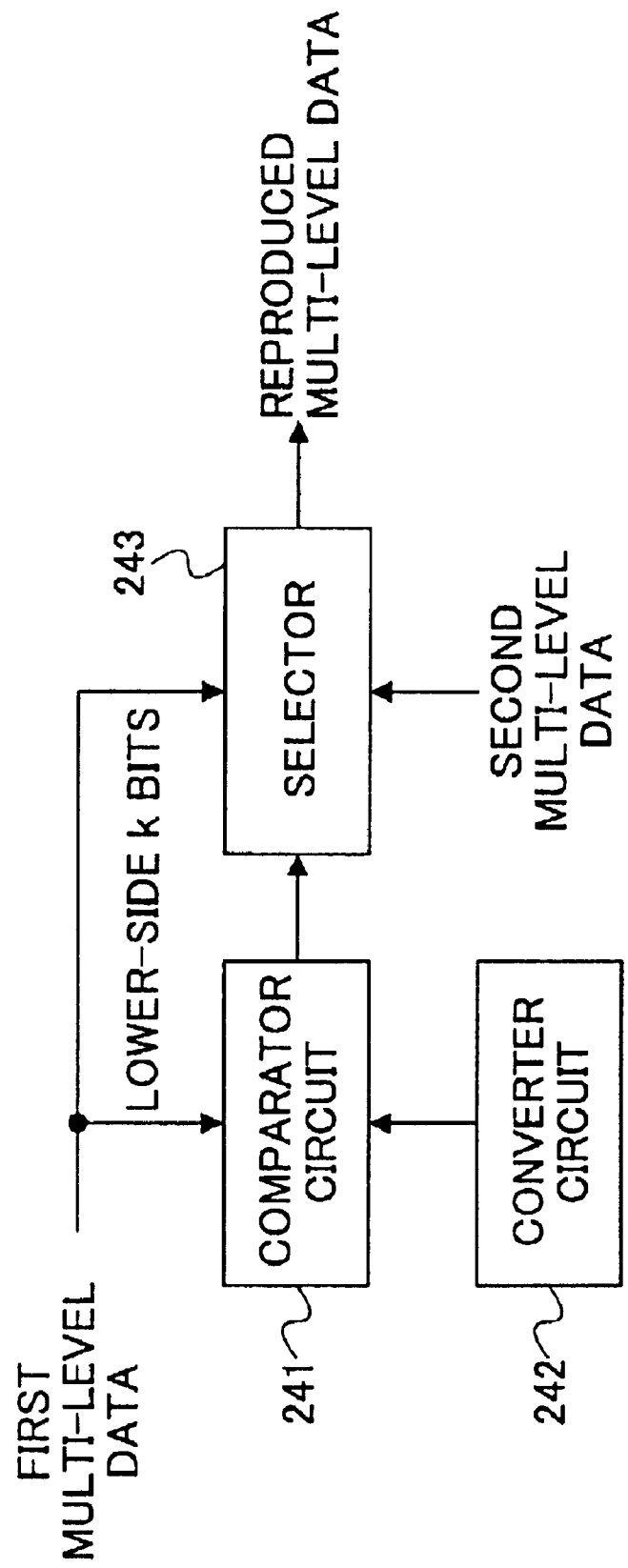
FIG. 29 is a block diagram showing a circuit outputting reproduced multi-level data based on first and second multi-level data according to the present invention.

FIG. 29 is a block diagram showing a circuit that compares the lower-side k bits of the output first multi-level data and the data obtained by conversion at the time of recording, and outputs the first multi-level data as reproduced multi-level data if the two data sets match each other and the second multi-level data if the two data sets do not match each other.

A converter circuit 242 of this circuit is equal to the converter circuit 101 of FIG. 22. A selector 243 outputs one of inputs thereto (one of the first and second multi-level data) based on the output of the result of comparison in a comparator circuit 241.

Figure 30:
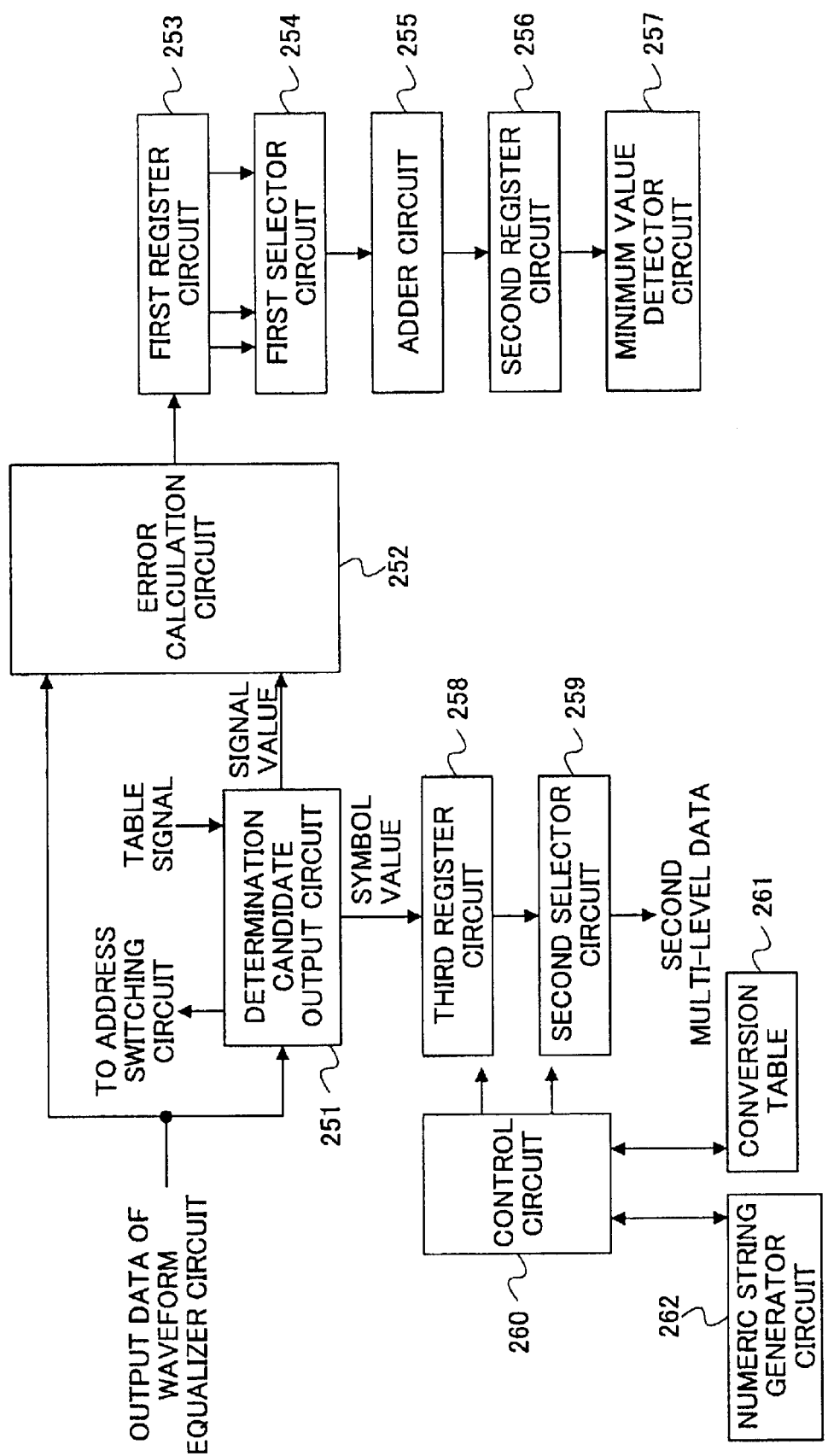
FIG. 30 is a block diagram showing a second multi-level data output circuit according to the present invention.

FIG. 30 is a block diagram showing the second multi-level output circuit.

The signal value of the output of the waveform equalizer circuit is input to a determination candidate output circuit 251. The determination candidate output circuit 251 then outputs candidate symbol values for the input signal value and their respective corresponding ideal signal values. As shown in FIG. 20, for instance, if the signal value of the input symbol S1 falls between the symbol values "4" and "5", the candidate symbol values are determined to be "3", "4", "5", and "6". The determination candidate output circuit 251 then inputs the signal values corresponding to the symbol values "3", "4", "5", and "6", together with the preceding and succeeding symbol values of each symbol, to addresses of the table of the first multi-level data output circuit of FIG. 28 so as to output the corresponding signal values in the table. The determination candidate output circuit 251 may be realized by using a semiconductor memory and logic circuits in the form of a table storing candidate symbol values as data with the input signal values being employed as addresses.

An error calculation circuit 252 outputs the errors between the signal value of, the input symbol and the signal values corresponding to the candidate symbol values.

A first register circuit 253 retains the outputs of the error calculation circuit 252 for the symbols of one or a plurality of sets.

A first selector circuit 254 performs a selecting operation on the outputs of the first register circuit 253 in accordance with the bit patterns of a conversion table 261, and outputs the errors as selected in combinations so that the sum of the errors of each combination of the set(s) is calculated.

An adder circuit 255 adds up the errors of each combination output from the first selector circuit 254, and outputs the sum of the errors of each combination to a second register circuit 256.

The second register circuit 256 retains the outputs of the adder circuit 255.

A minimum value detector circuit 257 detects the minimum value of the outputs of the second register circuit 256.

A third register circuit 258 retains the candidate symbol values (candidate symbol value strings) for the symbols of the set(s) output from the determination candidate output circuit 251.

A second selector circuit 259 performs a selecting operation on the candidate symbol values retained in the third register circuit 258 in accordance with the bit pattern of the conversion table 261 which bit pattern corresponds to the minimum value detected in the minimum value detector circuit 257, and outputs the selected candidate symbol values as a determination result.

A control circuit 260 controls the operation of the entire second multi-level data output circuit.

The conversion table 261 is equal to that used in converting the binary data to the multi-level data.

A numeric string generator circuit 262 generates the numeric string P for selecting one of two conversion tables included in the conversion table 261 for each set. If the conversion table 261 consists of only one conversion table, the numeric string generator circuit 262 is unnecessary. Further, if the numeric string P is uniquely determined, the numeric string generator circuit 262 generates the same numeric string P as used in converting the binary data to the multi-level data. Alternatively, if the numeric string P is determined through a logical operation with data in a given set, the numeric string generator circuit 262 generates the numeric string P by inputting the candidate symbol values.

According to the second multi-level data output circuit including the above-described components, the errors between the input signal values of the symbols of the set(s) and their respective ideal signal values corresponding to the candidate symbol values of the input symbols can be retained, and further, the sum of the errors of each combination can be retained. Further, the minimum value of the sums of the errors can be detected, and the determination result of each symbol can be output by selecting one of the bit patterns of the conversion table 261 which one corresponds to the detected minimum value.

Thus, according to the present invention, a table is created by reproducing test data recorded on an information recording medium so that multi-level data determination is performed using pattern recognition. Thereafter, the data that does not comply with the conversion rule at the time of recording is again determined. Therefore, errors at the time of multi-level data determination can be reduced.

Further, multi-level data determination is performed over a plurality of related sets at the time of outputting the second multi-level data. Therefore, errors can be reduced at the time of determining multi-level data.

According to the present invention, the errors of all the combinations of the candidate symbol values of a plurality of sets are retained so that the combination of candidate symbol values having the minimum sum of errors is selected from the combinations of all the candidate symbol values including not only the combinations of the minimum-error candidate symbol values of the sets but also the combinations of other candidate symbol values.

Thus, according to the present invention, not only the minimum-error candidate symbol values of each set, but also other candidate symbol values may be included at the time of multi-level data determination. Therefore, even if the combination of the minimum-error candidate symbol values of a plurality of sets does not have the minimum sum of errors, multi-level data determination can be performed with more accuracy.

In the above-described processing, A/D conversion quantizing the amplitude of a reproduction signal is performed to quantize the multi-level signal. However, another quantization method as described in the sixth embodiment with reference to FIG. 14 may be used.

The present invention is not limited to the specifically disclosed embodiments, but variations and modifications may be made without departing from the scope of the present invention.

The present application is based on Japanese priority applications No. 2001-289787 filed on Sep. 21, 2001, No. 2002-011160 filed on Jan. 21, 2002, and No. 2002-116738 filed on Apr. 18, 2002, the entire contents of which are hereby incorporated by reference.

What is claimed is:

1. A data processing method of converting (n×m−1)-bit data to multi-level data of m symbols of n bits per symbol, n and m being integers satisfying n≧2 and m≧2, respectively, wherein:

the m symbols each including n-bit data are arranged in m columns in an n×m matrix, with a value of each of the m symbols being set to an even or odd number, by creating the m symbols each including (n−1)-bit data of the (n×m−1)-bit data, arranging the m symbols in the m columns so that the {(n−1)×m}-bit data is arranged in upper-side {(n−1)×m} bits of the n×m matrix, and converting the remaining (m−1)-bit data of the (n×m−1)-bit data to m-bit data so that the m-bit data is arranged in a row in lower-side m bits of the n×m matrix.

2. The data processing method as claimed in claim 1, wherein the (m−1)-bit data is converted to the m-bit data by adding "0" or "1" to the (m−1)-bit data.

3. The data processing method as claimed in claim 1, wherein the (m−1)-bit data is converted to the m-bit data based on a table storing $2^{(m-1)}$ m-bit data patterns selected from $2^m$ m-bit data patterns, the $2^{(m-1)}$ m-bit data patterns differing by more than two bits.

4. The data processing method as claimed in claim 1, wherein:

two tables of different types each storing $2^{(m-1)}$ m-bit data patterns selected from $2^m$ m-bit data patterns are created, the $2^{(m-1)}$ m-bit data patterns differing by more than two bits; and the (m−1)-bit data is converted to the m-bit data based on one of the two tables which one is selected for the (n×m−1)-bit data based on a predetermined rule.

5. The data processing method as claimed in claim 4, wherein the predetermined rule provides that the one of the two tables is selected for the (n×m−1)-bit data based on a predetermined numeric value string formed of "0"s and "1"s arranged so as to correspond to respective (n×m−1)-bit data.

6. The data processing method as claimed in claim 5, wherein:

the predetermined numeric string starts from an initial value corresponding to first (n×m−1)-bit data; and a value of the predetermined numeric string for ith (n×m−1)-bit data is a result of a logical operation on a value of the predetermined numeric string for (i−1)th (n×m−1)-bit data and predetermined data in the (i−1)th (n×m−1)-bit data, i being an integer satisfying i≧2.

7. The data processing method as claimed in claim 6, wherein the predetermined numeric string is terminated and restarted from the initial value when k values are determined after the initial value, k being an integer satisfying k≧1.

8. A data processing method of determining a value of each of m symbols of a set of a multi-level signal based on input signal data of the m symbols obtained after quantizing the multi-level signal recorded on an information recording medium or transmitted to a transmission path and reproduced from the information recording medium or received from the transmission path, in which multi-level signal each of the m symbols is formed of n-bit data, the set is formed of the m symbols, {(n−1)×m}-bit data is arranged in upper-side (n−1) bits of the m symbols, (m−1)-bit data is converted to m-bit data, and the value of each of the m symbols is set to an even or odd number by arranging the m-bit data in the remaining lower-side bits of the m symbols, n and m being integers satisfying n≧2 and m≧2, respectively, wherein:

$2^{(m-1)}$ ideal signal data value strings corresponding to symbol value strings of even and odd symbol values closest to input signal data values of the m symbols of the set are determined, the symbol value strings corresponding to $2^{(m-1)}$ m-bit data patterns of m even and odd numbers based on one of which data patterns the (m−1)-bit data is converted to the m-bit data;

a sum of errors between the input signal data values and ideal signal data values of each of the ideal signal data value strings is calculated; and one of the symbol value strings is determined to be multi-level data of the set, the one of the symbol value strings corresponding to one, of the ideal signal value strings which one has the minimum sum of errors.

9. The data processing method as claimed in claim 8, wherein the (m−1)-bit data is converted to the m-bit data by adding "0" or "1" to the (m−1)-bit data.

10. The data processing method as claimed in claim 8, wherein the (m−1)-bit data is converted to the m-bit data based on a table storing the $2^{(m-1)}$ m-bit data patterns selected from $2^m$ m-bit data patterns, the $2^{(m-1)}$ m-bit data patterns differing by more than two bits.

11. The data processing method as claimed in claim 8, wherein:

two tables of different types each storing the $2^{(m-1)}$ m-bit data patterns selected from $2^m$ m-bit data patterns are created, the $2^{(m-1)}$ m-bit data patterns differing by more than two bits; and the (m−1)-bit data is converted to the m-bit data based on one of the two tables which one is selected for the set based on a predetermined rule.

12. The data processing method as claimed in claim 11, wherein the predetermined rule provides that the one of the two tables is selected for the set based on a predetermined numeric value string formed of "0"s and "1"s arranged so as to correspond to respective sets.

13. A data processing method of determining a value of each of m symbols of a set of a multi-level signal based on input signal data of the m symbols obtained after quantizing the multi-level signal recorded on an information recording medium or transmitted to a transmission path and reproduced from the information recording medium or received from the transmission path, in which multi-level signal: each of the m symbols is formed of n-bit data; the set is formed of the m symbols; {(n−1)×m}-bit data is arranged in upper-side (n−1) bits of the m symbols; (m−1)-bit data is converted to m-bit data based on one of first and second tables of different types each created to store $2^{(m−1)}$ m-bit data patterns selected from $2^m$ m-bit data patterns, the first table being selected in the case of a numeric string for selecting the one of the first and second tables for a given set=0 and the second table being selected in the case of the numeric string=1, the numeric string being started from an initial value corresponding to a first set and using a result of a logical operation on a value of the numeric string for an (i−1)th set and predetermined data in the (i−1)th set as a value of the predetermined numeric string for an ith set, i being an integer satisfying i≧2; and the value of each of the m symbols is set to an even or odd number by arranging the m-bit data in the remaining lower-side bits of the m symbols, n and m being integers satisfying n≧2 and m≧2, respectively, wherein:

$2^{(m−1)}$ ideal signal data value strings corresponding to symbol value strings of even and odd symbol values closest to input signal data values of the m symbols of each of a target set and one or a plurality of succeeding sets in each of cases of the numeric string=0 and 1 are determined, the symbol value strings corresponding to patterns of even and odd numbers on the selected one of the first and second tables;

a sum of errors between the input signal data values and ideal signal data values of each of the ideal signal data value strings is calculated with respect to the m symbols of each of the target and the one or plurality of succeeding sets;

one of the symbol value strings which one corresponds to one of the ideal signal value strings which one has the minimum sum of errors is determined, with respect to each of the target and the one or plurality of succeeding sets in each of the cases of the numeric string=0 and 1, to be temporary multi-level data of each of the target and the one or plurality of succeeding sets; and one of the symbol value strings of the target set which one corresponds to one of combinations of the temporary multi-level data of the target set and the one or plurality of succeeding sets which one minimizes a total of the sums of errors of the temporary multi-level data of the target set and the one or plurality of the succeeding sets is determined to be multi-level data of the target set, the combinations being made in accordance with the numeric string.

14. The data processing method as claimed in claim 13, wherein the numeric string is terminated and restarted from the initial value when k values are determined after the initial value, k being an integer satisfying k≧1.

15. The data processing method as claimed in claim 13, wherein each of the first and second tables stores the $2^{(m−1)}$ m-bit data patterns selected from the $2^m$ m-bit data patterns, the $2^{(m−1)}$ m-bit data patterns differing by more than two bits.

16. A data processing circuit comprising:

(n−1) first selector circuits each supplied with different m-bit data of (n×m−1)-bit parallel data and outputting one-bit data of the supplied m-bit data, n and m being integers satisfying n≧2 and m≧2, respectively;

a converter circuit supplied with the remaining (m−1)-bit data of the (n×m−1)-bit parallel data and converting the supplied (m−1)-bit data to m-bit data; and a second selector circuit supplied with the m-bit data output from said converter circuit and outputting one-bit data of the supplied m-bit data, wherein the (n×m−1)-bit parallel data is output as n-bit parallel data.

17. The data processing circuit as claimed in claim 16, further comprising a shift register circuit converting (n×m−1)-bit serial data to the (n×m−1)-bit parallel data so that the (n×m−1)-bit serial data is output as the n-bit parallel data.

18. A data processing circuit comprising:

an output circuit supplied with signal data values obtained after quantizing a multi-level signal whose one symbol is formed of n-bit data and outputting ideal signal data values corresponding to even and odd symbol values closest to each of the supplied signal data values, n being an integer satisfying n≧2;

a first calculator circuit calculating errors between the supplied signal data values and the respective ideal signal data values;

a plurality of first register circuits retaining the errors calculated in said first calculator circuit;

a second calculator circuit calculating a sum of errors of each of predetermined combinations of the errors output from said first register circuits;

a plurality of second register circuits retaining the sums calculated in said second calculator circuit;

a minimum value detector circuit detecting a minimum value of the sums output from said second register circuits; and a control circuit outputting a symbol value string that is n-bit parallel data, the symbol value string corresponding to the minimum value detected in said minimum value detector circuit.

19. A signal processing circuit comprising:

(n−1) first selector circuits each supplied with different m-bit data of (n×m−1)-bit parallel data and outputting one-bit data of the supplied m-bit data, n and m being integers satisfying n≧2 and m≧2, respectively;

a converter circuit supplied with the remaining (m−1)-bit data of the (n×m−1)-bit parallel data and converting the supplied (m−1)-bit data to m-bit data;

a second selector circuit supplied with the m-bit data output from said converter circuit and outputting one-bit data of the supplied m-bit data;

a first control circuit outputting the (n×m−1)-bit parallel data as n-bit parallel data;

an output circuit supplied with signal data values obtained after quantizing a multi-level signal whose one symbol is formed of n-bit data and outputting ideal signal data values corresponding to even and odd symbol values closest to each of the supplied signal data values;

a first calculator circuit calculating errors between the supplied signal data values and the respective ideal signal data values;

a plurality of first register circuits retaining the errors calculated in said first calculator circuit;

a second calculator circuit calculating a sum of errors of each of predetermined combinations of the errors output from said first register circuits;

a plurality of second register circuits retaining the sums calculated in said second calculator circuit;

a minimum value detector circuit detecting a minimum value of the sums output from said second register circuits; and a second control circuit outputting a symbol value string that is n-bit parallel data, the symbol value string corresponding to the minimum value detected in said minimum value detector circuit.

20. The data processing circuit as claimed in claim 19, further comprising a shift register circuit converting (n×m−1)-bit serial data to the (n×m−1)-bit parallel data so that the first control circuit outputs the (n×m−1)-bit serial data as the n-bit parallel data.

21. A data processing apparatus comprising:
a first part arranging {(n−1)×m}-bit data in upper-side (n−1) bits of m symbols of a set, each of the m symbols being formed of n-bit data, the set being formed of the m symbols, n and m being integers satisfying n≧2 and m≧2, respectively;
a second part converting (m−1)-bit data to m-bit data;
a third part setting a value of each of the m symbols of the set to an even or odd number by arranging the m-bit data in the remaining lower-side bits of the m symbols; and
a fourth part having the m symbols recorded on an information recording medium or transmitted to a transmission path as a multi-level signal.

22. A data processing apparatus comprising:
a first part supplied with a multi-level signal whose one symbol is formed of n-bit data as a signal reproduced from an information recording medium or received from a transmission path, n being an integer satisfying n≧2;
a second part supplied with signal data values obtained after quantizing the multi-level signal and outputting ideal signal data values corresponding to even and odd symbol values closest to each of the supplied signal data values;
a third part calculating errors between the signal data values obtained after quantizing the multi-level signal and the respective ideal signal data values output from said second part;
a plurality of first data retaining parts retaining the errors calculated in said third part;
a fourth part calculating a sum of errors of each of predetermined combinations of the errors output from said first data retaining parts;
a plurality of second data retaining parts retaining the sums calculated in said fourth part;
a fifth part obtaining a minimum value of the sums output from said second data retaining parts; and
a control part outputting a symbol value string that is n-bit parallel data, the symbol value string corresponding to the minimum value obtained in said fifth part.

23. A data processing apparatus comprising:
a first part arranging {(n−1)×m}-bit data in upper-side (n−1) bits of m symbols of a set, each of the m symbols being formed of n-bit data, the set being formed of the m symbols, n and m being integers satisfying n≧2 and m≧2, respectively;
a second part converting (m−1)-bit data to m-bit data;
a third part setting a value of each of the m symbols of the set to an even or odd number by arranging the m-bit data in the remaining lower-side bits of the m symbols;
a fourth part having the m symbols recorded on an information recording medium or transmitted to a transmission path as a multi-level signal;
a fifth part supplied with a multi-level signal whose one symbol is formed of n-bit data as a signal reproduced from an information recording medium or received from a transmission path;
a sixth part supplied with signal data values obtained after quantizing the multi-level signal and outputting ideal signal data values corresponding to even and odd symbol values closest to each of the supplied signal data values;
a seventh part calculating errors between the signal data values obtained after quantizing the multi-level signal and the respective ideal signal data values output from said sixth part;
a plurality of first data retaining parts retaining the errors calculated in said seventh part;
an eighth part calculating a sum of errors of each of predetermined combinations of the errors output from said first data retaining parts;
a plurality of second data retaining parts retaining the sums calculated in said eighth part;
a ninth part obtaining a minimum value of the sums output from said second data retaining parts; and
a control part outputting a symbol value string that is n-bit parallel data, the symbol value string corresponding to the minimum value obtained in said ninth part.

24. A data processing method of converting data to multi-level data of n bits per symbol, n being an integer satisfying n≧2, wherein:
a set is formed of m symbols, m being an integer satisfying m≧2;
{(n−k)×m}-bit data is arranged in upper-side (n−k) bits of the m symbols of the set, k being an integer satisfying n>k≧1; and
(m×k−1)-bit data is converted to (m×k)-bit data to be arranged in the remaining lower-side k bits of the m symbols of the set.

25. The data processing method as claimed in claim 24, wherein the (m×k−1)-bit data is converted to the (m×k)-bit data by adding "0" or "1" to the (m×k−1)-bit data.

26. The data processing method as claimed in claim 24, wherein the (m×k−1)-bit data is converted to the (m×k)-bit data based on a table storing $2^{(m \times k-1)}$ (m×k)-bit data patterns selected from $2^{(m \times k)}$ (m×k)-bit data patterns, the $2^{(m-1)}$ (m×k)-bit data patterns differing by more than two bits.

27. The data processing method as claimed in claim 24, wherein:
a pair of tables of different types each storing $2^{(m \times k-1)}$ (m×k)-bit data patterns selected from $2^{(m \times k)}$ (m×k)-bit data patterns are created, the $2^{(m \times k-1)}$ (m×k)-bit data patterns differing by more than two bits; and
the (m×k−1)-bit data is converted to the (m×k)-bit data based on one of the two tables which one is selected for the set based on a predetermined rule.

28. The data processing method as claimed in claim 27, wherein the predetermined rule provides that the one of the two tables is selected for the set based on a predetermined numeric value string formed of "0"s and "1"s arranged so as to correspond to respective sets.

29. The data processing method as claimed in claim 28, wherein:
the predetermined numeric string starts from an initial-value corresponding to a first set; and
a value of the predetermined numeric string for an ith set is a result of a logical operation on a value of the predetermined numeric string for an (i−1)th set and predetermined data in the (i−1)th set, i being an integer satisfying i≧2.

30. The data processing method as claimed in claim 29, wherein the predetermined numeric string is terminated and restarted from the initial value when k values are determined after the initial value, k being an integer satisfying k≧1.

31. A data processing method of determining a value of each of m symbols of a set of a multi-level signal based on input signal data of the m symbols obtained after quantizing the multi-level signal recorded on an information recording medium or transmitted to a transmission path and reproduced from the information recording medium or received from the transmission path, in which multi-level signal each of the m symbols is formed of n-bit data, the set is formed of the m symbols, $\{(n-k) \times m\}$-bit data is arranged in upper-side (n−k) bits of the m symbols, and (m×k−1)-bit data is converted to (m×k)-bit data to be arranged in the remaining lower-side k bits of the m symbols, n, m, and k being integers satisfying $n \geq 2$, $m \geq 2$, and $n > k \geq 1$, respectively, wherein:

$2^{(m \times k-1)}$ ideal signal data value strings corresponding to symbol value strings of even and odd symbol values closest to input signal data values of the m symbols of the set are determined, the symbol value strings corresponding to $2^{(m \times k-1)}$ (m×k)-bit data patterns of m even and odd numbers based on one of which data patterns the (m×k−1)-bit data is converted to the (m×k)-bit data;

a sum of errors between the input signal data values and ideal signal data values of each of the ideal signal data value strings is calculated; and one of the symbol value strings is determined to be multi-level data of the set, the one of the symbol value strings corresponding to one of the ideal signal value strings which one has the minimum sum of errors.

32. The data processing method as claimed in claim 31, wherein the (m×k−1)-bit data is converted to the (m×k)-bit data by adding "0" or "1" to the (m×k−1)-bit data.

33. The data processing method as claimed in claim 31, wherein the (m×k−1)-bit data is converted to the (m×k)-bit data based on a table storing the $2^{(m \times k-1)}$ (m×k)-bit data patterns selected from $2^{(m \times k)}$ (m×k)-bit data patterns, the $2^{(m \times k-1)}$ (m×k)-bit data patterns differing by more than two bits.

34. The data processing method as claimed in claim 31, wherein:

a pair of tables of different types each storing the $2^{(m \times k-1)}$ (m×k)-bit data patterns selected from $2^{(m \times k)}$ (m×k)-bit data patterns are created, the $2^{(m \times k-1)}$ (m×k)-bit data patterns differing by more than two bits; and the (m×k−1)-bit data is converted to the (m×k)-bit data based on one of the two tables which one is selected for the set based on a predetermined rule.

35. The data processing method as claimed in claim 34, wherein the predetermined rule provides that the one of the two tables is selected for the set based on a predetermined numeric value string formed of "0"s and "1"s arranged so as to correspond to respective sets.

36. A data processing method of determining a value of each of m symbols of a set of a multi-level signal based on input signal data of the m symbols obtained after quantizing the multi-level signal recorded on an information recording medium or transmitted to a transmission path and reproduced from the information recording medium or received from the transmission path, in which multi-level signal: each of the m symbols is formed of n-bit data; the set is formed of the m symbols; $\{(n-k) \times m\}$-bit data is arranged in upper-side (n−k) bits of the m symbols; (m×k−1)-bit data is converted to (m×k)-bit data based on one of first and second tables of different types each created to store $2^{(m \times k-1)}$ (m×k)-bit data patterns selected from $2^{(m \times k)}$ (m×k)-bit data patterns, the first table being selected in the case of a numeric string for selecting the one of the first and second tables for a given set=0 and the second table being selected in the case of the numeric string=1, the numeric string being started from an initial value corresponding to a first set and using a result of a logical operation on a value of the numeric string for an (i−1)th set and predetermined data in the (i−1)th set as a value of the predetermined numeric string for an ith set, i being an integer satisfying $i \geq 2$; and the (m×k)-bit data is arranged in the remaining lower-side k bits of the m symbols, n, m, and k being integers satisfying $n \geq 2$, $m \geq 2$, and $n > k \geq 1$, respectively, wherein:

$2^{(m \times k-1)}$ ideal signal data value strings corresponding to symbol value strings of even and odd symbol values closest to input signal data values of the m symbols of each of a target set and one or a plurality of succeeding sets in each of cases of the numeric string=0 and 1 are determined, the symbol value strings corresponding to patterns of even and odd numbers on the selected one of the first and second tables;

a sum of errors between the input signal data values and ideal signal data values of each of the ideal signal data value strings is calculated with respect to the m symbols of each of the target and the one or plurality of succeeding sets;

one of the symbol value strings which one corresponds to one of the ideal signal value strings which one has the minimum sum of errors is determined, with respect to each of the target and the one or plurality of succeeding sets in each of the cases of the numeric string=0 and 1, to be temporary multi-level data of each of the target and the one or plurality of succeeding sets; and one of the symbol value strings of the target set which one corresponds to one of combinations of the temporary multi-level data of the target set and the one or plurality of succeeding sets which one minimizes a total of the sums of errors of the temporary multi-level data of the target set and the one or plurality of the succeeding sets is determined to be multi-level data of the target set, the combinations being made in accordance with the numeric string.

37. The data processing method as claimed in claim 36, wherein the numeric string is terminated and restarted from the initial value when j values are determined after the initial value, j being an integer satisfying $j \geq 1$.

38. The data processing method as claimed in claim 36, wherein each of the first and second tables stores the $2^{(m \times k-1)}$ (m×k)-bit data patterns selected from the $2^{(m \times k)}$ (m×k)-bit data patterns, the $2^{(m \times k-1)}$ (m×k)-bit data patterns differing by more than two bits.

39. A data processing circuit comprising:

(n−k) first selector circuits each supplied with different m-bit data of (n×m−1)-bit parallel data and outputting one-bit data of the supplied m-bit data, n, m, and k being integers satisfying $n \geq 2$, $m \geq 2$, and $n > k \geq 1$, respectively;

a converter circuit supplied with the remaining (m×k−1)-bit data of the (n×m−1)-bit parallel data and converting the supplied (m×k−1)-bit data to (m×k)-bit data; and a second selector circuit supplied with the (m×k)-bit data output from said converter circuit and outputting one-bit data of the supplied (m×k)-bit data, wherein the (n×m−1)-bit parallel data is output as n-bit parallel data.

40. The data processing circuit as claimed in claim 39, further comprising a shift register circuit converting (n×m−1)-bit serial data to the (n×m−1)-bit parallel data so that the (n×m−1)-bit serial data is output as the n-bit parallel data.

41. A data processing circuit comprising:
an output circuit supplied with signal data values obtained after quantizing a multi-level signal whose one symbol is formed of n-bit data and outputting ideal signal data values corresponding to a plurality of symbol values closest to each of the supplied signal data values, n being an integer satisfying $n \geq 2$;
a first calculator circuit calculating errors between the supplied signal data values and the respective ideal signal data values;
a plurality of first register circuits retaining the errors calculated in said first calculator circuit;
a second calculator circuit calculating a sum of errors of each of predetermined combinations of the errors output from said first register circuits;
a plurality of second register circuits retaining the sums calculated in said second calculator circuit;
a minimum value detector circuit detecting a minimum value of the sums output from said second register circuits; and
a control circuit outputting a symbol value string that is n-bit parallel data, the symbol value string corresponding to the minimum value detected in said minimum value detector circuit.

42. A signal processing circuit comprising:
(n−k) first selector circuits each supplied with different m-bit data of (n×m−1)-bit parallel data and outputting one-bit data of the supplied m-bit data, n, m, and k being integers satisfying $n \geq 2$, $m \geq 2$, and $n > k \geq 1$, respectively;
a converter circuit supplied with the remaining (m×k−1)-bit data of the (n×m−1)-bit parallel data and converting the supplied (m×k−1)-bit data to (m×k)-bit data; and
a second selector circuit supplied with the (m×k)-bit data output from said converter circuit and outputs one-bit data of the supplied (m×k)-bit data;
a first control circuit outputting the (n×m−1)-bit parallel data as n-bit parallel data;
an output circuit supplied with signal data values obtained after quantizing a multi-level signal whose one symbol is formed of n-bit data and outputting ideal signal data values corresponding to a plurality of symbol values closest to each of the supplied signal data values;
a first calculator circuit calculating errors between the supplied signal data values and the respective ideal signal data values;
a plurality of first register circuits retaining the errors calculated in said first calculator circuit;
a second calculator circuit calculating a sum of errors of each of predetermined combinations of the errors output from said first register circuits;
a plurality of second register circuits retaining the sums calculated in said second calculator circuit;
a minimum value detector circuit detecting a minimum value of the sums output from said second register circuits; and
a second control circuit outputting a symbol value string that is n-bit parallel data, the symbol value string corresponding to the minimum value detected in said minimum value detector circuit.

43. The data processing circuit as claimed in claim 42, further comprising a shift register circuit converting (n×m−1)-bit serial data to the (n×m−1)-bit parallel data so that the first control circuit outputs the (n×m−1)-bit serial data as the n-bit parallel data.

44. A data processing apparatus comprising:
a first part arranging {(n−k)×m}-bit data in upper-side (n−k) bits of m symbols of a set, each of the m symbols being formed of n-bit data, the set being formed of the m symbols, n, m, and k being integers satisfying $n \geq 2$, $m \geq 2$, $n > k \geq 1$, respectively;
a second part converting (m×k−1)-bit data to (m×k)-bit data;
a third part arranging the m-bit data in the remaining lower-side k bits of the m symbols; and
a fourth part having the m symbols recorded on an information recording medium or transmitted to a transmission path as a multi-level signal.

45. A data processing apparatus comprising:
a first part supplied with a multi-level signal whose one symbol is formed of n-bit data as a signal reproduced from an information recording medium or received from a transmission path, n being an integer satisfying $n \geq 2$;
a second part supplied with signal data values obtained after quantizing the multi-level signal and outputting ideal signal data values corresponding to a plurality of symbol values closest to each of the supplied signal data values;
a third part calculating errors between the signal data values obtained after quantizing the multi-level signal and the respective ideal signal data values output from said second part;
a plurality of first data retaining parts retaining the errors calculated in said third part;
a fourth part calculating a sum of errors of each of predetermined combinations of the errors output from said first data retaining parts;
a plurality of second data retaining parts retaining the sums calculated in said fourth part;
a fifth part obtaining a minimum value of the sums output from said second data retaining parts; and
a control part outputting a symbol value string that is n-bit parallel data, the symbol value string corresponding to the minimum value obtained in said fifth part.

46. A data processing apparatus comprising:
a first part arranging {(n−k)×m}-bit data in upper-side (n−k) bits of m symbols of a set, each of the m symbols being formed of n-bit data, the set being formed of the m symbols, n, m, and k being integers satisfying $n \geq 2$, $m \geq 2$, $n > k \geq 1$, respectively;
a second part converting (m×k−1)-bit data to (m×k)-bit data;
a third part arranging the m-bit data in the remaining lower-side k bits of the m symbols;
a fourth part having the m symbols recorded on an information recording medium or transmitted to a transmission path as a multi-level signal;
a fifth part supplied with a multi-level signal whose one symbol is formed of n-bit data as a signal reproduced from the information recording medium or received from the transmission path;
a sixth part supplied with signal data values obtained after quantizing the multi-level signal and outputting ideal signal data values corresponding to a plurality of symbol values closest to each of the supplied signal data values;
a seventh part calculating errors between the signal data values obtained after quantizing the multi-level signal and the respective ideal signal data values output from said sixth part;

a plurality of first data retaining parts retaining the errors calculated in said seventh part;

an eighth part calculating a sum of errors of each of predetermined combinations of the errors output from said first data retaining parts;

a plurality of second data retaining parts retaining the sums calculated in said eighth part;

a ninth part obtaining a minimum value of the sums output from said second data retaining parts; and a control part outputting a symbol value string that is n-bit parallel data, the symbol value string corresponding to the minimum value obtained in said ninth part.

47. A multi-level data processing method for converting binary data to multi-level data of n bits per symbol and recording the multi-level data and test data on an information recording medium, the test data including $2^{(M \times n)}$ combinations of M successive multi-level data, n and M being integers satisfying $n \geq 2$ and $M \geq 3$, respectively, wherein:

one set is formed of m symbols of multi-level data, m being an integer satisfying $m \geq 2$;

$\{(n-k) \times m\}$-bit binary data of $(n \times m-1)$-bit binary data is arranged in upper-side (n–k) bits of m symbols of a set, k being an integer satisfying $n > k \geq 1$; and the remaining $(m \times k-1)$-bit binary data of the $(n \times m-1)$-bit binary data is converted to $(m \times k)$ bits to be arranged in the remaining lower-side k bits of the m symbols of the set, whereby the binary data is converted to the multi-level data.

48. The multi-level data processing method as claimed in claim 47, wherein:

a plurality of signal values of the multi-level data are stored in a table by inputting a reproduction signal of the test data;

the multi-level data to which the binary data is converted is reproduced to be input as a signal so that first multi-level data minimizing an error between signal values of the input multi-level data and corresponding signal values stored in the table is output;

lower-side k bits of m symbols of a target set of the first multi-level data are compared with conversion data for converting the $(m \times k-1)$-bit binary data to the $(m \times k)$ bits; and one of candidate multi-level data corresponding to the conversion data which one has signal values having a minimum error with respect to the signal values of the input multi-level data is output as second multi-level data and the second multi-level data is output as reproduced multi-level data when the lower-side k bits matches none of the conversion data, and the first multi-level data is output as the reproduced multi-level data when the lower-side k bits match any of the conversion data, whereby the multi-level data recorded on the information recording medium is reproduced therefrom.

49. The multi-level data processing method as claimed in claim 48, wherein:

$2^{(M \times n)}$ patterns of signal values of (M–2) multi-level data determined by excluding multi-level data on ends of the M successive multi-level data are stored in the table;

multi-level data on ends of M successive multi-level data are determined by predetermined thresholds when the first multi-level data is output; and multi-level data minimizing an error between one or a plurality of signal values of (M–2) multi-level data obtained by excluding the multi-level data on the ends of the M successive multi-level data and one or a plurality of corresponding signal values in the table is output as the first multi-level data.

50. The multi-level data processing method as claimed in claim 49, wherein the predetermined thresholds are determined from the signal values in the table.

51. A multi-level data processing method for converting binary data to multi-level data of n bits per symbol, recording the multi-level data and test data on an information recording medium, and reproducing the multi-level data from the information recording medium, the test data including $2^{(M \times n)}$ combinations of M successive multi-level data, n and M being integers satisfying $n \geq 2$ and $M \geq 3$, respectively, wherein:

at a time of recording the multi-level data, one set is formed of m symbols of multi-level data, m being an integer satisfying $m \geq 2$; $\{(n-k) \times m\}$-bit binary data of $(n \times m-1)$-bit binary data is arranged in upper-side (n–k) bits of m symbols of a set, k being an integer satisfying $n > k \geq 1$; and the remaining $(m \times k-1)$-bit binary data of the $(n \times m-1)$-bit binary data is converted to $(m \times k)$ bits to be arranged in the remaining lower-side k bits of the m symbols of the set, whereby the binary data is converted to the multi-level data; and at a time of reproducing the multi-level data, signal values of multi-level data are stored in a table by inputting a reproduction signal of the test data; the multi-level data to which the binary data is converted is reproduced to be input as a signal so that first multi-level data minimizing an error between signal values of the input multi-level data and corresponding signal values stored in the table is output; lower-side k bits of m symbols of a target set of the first multi-level data are compared with conversion data for converting the $(m \times k-1)$-bit binary data to the $(m \times k)$ bits; and one of candidate multi-level data corresponding to the conversion data which one has signal values having a minimum error with respect to the signal values of the input multi-level data is output as second multi-level data and the second multi-level data is output as reproduced multi-level data when the lower-side k bits match none of the conversion data, and the first multi-level data is output as the reproduced multi-level data when the lower-side k bits match any of the conversion data.

52. The multi-level data processing method as claimed in claim 51, wherein:

$2^{(M \times n)}$ patterns of signal values of (M–2) multi-level data determined by excluding multi-level data on ends of the M successive multi-level data are stored in the table;

multi-level data on ends of M successive multi-level data are determined by predetermined thresholds when the first multi-level data is output; and multi-level data minimizing an error between one or a plurality of signal values of (M–2) multi-level data obtained by excluding the multi-level data on the ends of the M successive multi-level data and one or a plurality of corresponding signal values in the table is output as the first multi-level data.

53. The multi-level data processing method as claimed in claim 52, wherein the predetermined thresholds are determined from the signal values in the table.

54. The multi-level data processing method as claimed in claim 47, wherein data for another set preceding the set is input for converting the remaining (m×k−1)-bit binary data to the (m×k) bits.

55. The multi-level data processing method as claimed in claim 54, wherein:
signal values of multi-level data are stored in a table by inputting a reproduction signal of the test data, the multi-level data to which the binary data is converted is reproduced to be input as a signal so that first multi-level data minimizing an error between signal values of the input multi-level data and corresponding signal values stored in the table is output, and lower-side k bits of m symbols of a target set of the first multi-level data are compared with conversion data for converting the (m×k−1)-bit binary data to the (m×k) bits; and
one of strings of candidate multi-level data of a plurality of successive sets including the target set is selected, the one of the strings having signal values having a minimum error with respect to input signal values of the sets, the candidate multi-level data corresponding to the conversion data, and candidate multi-level data of the target set in the selected one of the strings is output as second multi-level data of the target set so that the second multi-level data is output as reproduced multi-level data when the lower-side k bits match none of the conversion data, and the first multi-level data is output as the reproduced multi-level data when the lower-side k bits match any of the conversion data,
whereby the multi-level data recorded on the information recording medium is reproduced therefrom.

56. The multi-level data processing method as claimed in claim 55, wherein at a time of outputting the second multi-level data, N candidate multi-level data from candidate multi-level data having signal values having a minimum error with respect to the signal values of the input multi-level data to candidate multi-level data having signal values having an Nth smallest error with respect to the signal values of the input multi-level data are selected in each of the sets, N being an integer satisfying $1 \leq N \leq 2$, so that one of combinations of the selected candidate multi-level data of the sets is output, the one of the combinations having signal values having a minimum error with respect to the signal values of the sets.

57. The multi-level data processing method as claimed in claim 55, wherein:
$2^{(M \times n)}$ patterns of signal values of (M−2) multi-level data determined by excluding multi-level data on ends of the M successive multi-level data are stored in the table;
multi-level data on ends of M successive multi-level data are determined by predetermined thresholds when the first multi-level data is output; and
multi-level data minimizing an error between one or a plurality of signal values of (M−2) multi-level data obtained by excluding the multi-level data on the ends of the M successive multi-level data and one or a plurality of corresponding signal values in the table is output as the first multi-level data.

58. The multi-level data processing method as claimed in claim 57, wherein the predetermined thresholds are determined from the signal values in the table.

59. A multi-level data processing method for converting binary data to multi-level data of n bits per symbol, recording the multi-level data and test data on an information recording medium, and reproducing the multi-level data from the information recording medium, the test data including $2^{(M \times n)}$ combinations of M successive multi-level data, n and M being integers satisfying $n \geq 2$ and $M \geq 3$, respectively, wherein:

at a time of recording the multi-level data, one set is formed of m symbols of multi-level data, m being an integer satisfying $m \geq 2$; {(n−k)×m}-bit binary data of (n×m−1)-bit binary data is arranged in upper-side (n−k) bits of m symbols of a set, k being an integer satisfying $n > k \geq 1$; and the remaining (m×k−1)-bit binary data of the (n×m−1)-bit binary data is converted to (m×k) bits to be arranged in the remaining lower-side k bits of the m symbols of the set, whereby the binary data is converted to the multi-level data; and at a time of reproducing the multi-level data, signal values of multi-level data are stored in a table by inputting a reproduction signal of the test data; the multi-level data to which the binary data is converted is reproduced to be input as a signal so that first multi-level data minimizing an error between signal values of the input multi-level data and corresponding signal values stored in the table is output; lower-side k bits of m symbols of a target set of the first multi-level data are compared with conversion data for converting the (m×k−1)-bit binary data to the (m×k) bits; and one of strings of candidate multi-level data of a plurality of successive sets including the target set is selected, the one of the strings having signal values having a minimum error with respect to input signal values of the sets, the candidate multi-level data corresponding to the conversion data, and candidate multi-level data of the target set in the selected one of the strings is output as second multi-level data of the target set so that the second multi-level data is output as reproduced multi-level data when the lower-side k bits match none of the conversion data, and the first multi-level data is output as the reproduced multi-level data when the lower-side k bits match any of the conversion data.

60. The multi-level data processing method as claimed in claim 59, wherein at a time of outputting the second multi-level data, N candidate multi-level data from candidate multi-level data having signal values having a minimum error with respect to the signal values of the input multi-level data to candidate multi-level data having signal values having an Nth smallest error with respect to the signal values of the input multi-level data are selected in each of the sets, N being an integer satisfying $1 \leq N \leq 2$, so that one of combinations of the selected candidate multi-level data of the sets is output, the one of the combinations having signal values having a minimum error with respect to the signal values of the sets.

61. The multi-level data processing method as claimed in claim 59, wherein:
$2^{(M \times n)}$ patterns of signal values of (M−2) multi-level data determined by excluding multi-level data on ends of the M successive multi-level data are stored in the table;
multi-level data on ends of M successive multi-level data are determined by predetermined thresholds when the first multi-level data is output; and
multi-level data minimizing an error between one or a plurality of signal values of (M−2) multi-level data obtained by excluding the multi-level data on the ends of the M successive multi-level data and one or a plurality of corresponding signal values in the table is output as the first multi-level data.

62. The multi-level data processing method as claimed in claim 61, wherein the predetermined thresholds are determined from the signal values in the table.

63. A multi-level data processing apparatus comprising:
a conversion part converting input binary data to multi-level data of n bits per symbol, n being an integer satisfying $n \geq 2$;

a generation part generating test data including $2^{(M \times n)}$ combinations of M successive multi-level data, M being an integer satisfying M≧3; and a recording part recording the multi-level data output from said conversion part and the test data output from said generation part on an information recording medium, wherein said conversion part converts input (n×m−1)-bit binary data to multi-level data of m symbols per set, m being an integer satisfying m≧2, said conversion part comprising:

a first part arranging {(n−k)×m}-bit binary data of the (n×m−1)-bit binary data in upper-side (n−k) bits of m symbols of a set, k being an integer satisfying n>k≧1;

a second part converting the remaining (m×k−1)-bit binary data of the (m×k−1)-bit data to (m×k) bits; and a third part arranging the (m×k) bits in the remaining lower-side k bits of the m symbols of the set.

64. The multi-level data processing apparatus as claimed in claim 63, further comprising:

a reproduction signal output part outputting a reproduction signal from the information recording medium;

a signal value output part supplied with the reproduction signal output from said reproduction signal output part to output signal values of multi-level data;

a storage part storing the signal values of the test data output from said signal value output part in a table;

a first error-calculation part calculating an error between signal values of the multi-level data to which the binary data is converted and corresponding signal values stored in the table;

a first multi-level data output part outputting first multi-level data minimizing the error output from said first error calculation part;

a comparison part comparing lower-side k bits of m symbols of a target set of the first multi-level data with conversion data for converting the (m×k−1)-bit binary data to the (m×k) bits;

a second error calculation part that, based on the comparison of said comparison part, calculates an error between each of candidate multi-level data corresponding to the conversion data and the signal values of the multi-level data to which the binary data is converted;

a second multi-level data output part outputting one of the candidate multi-level data which one has a minimum of the errors output from said second error calculation part as second multi-level data; and a reproduced multi-level data output part outputting, as reproduced multi-level data, the second multi-level data if the lower-side k bits match none of the conversion data in said comparison part and the first multi-level data if the lower-side k bits match any of the conversion data in said comparison part, whereby the multi-level data recorded on the information recording medium is reproduced therefrom.

65. The multi-level data processing apparatus as claimed in claim 64, wherein:

said storage part stores $2^{(M \times n)}$ patterns of signal values of (M−2) multi-level data determined by excluding multi-level data on ends of the M successive multi-level data as the signal values in the table; and said first error calculation part comprises a determination part determining multi-level data on ends of M successive multi-level data by predetermined thresholds so as to calculate an error between one or a plurality-of signal values of (M−2) multi-level data obtained by excluding the multi-level data on the ends of the M successive multi-level data and one or a plurality of corresponding signal values in the table.

66. The multi-level data processing apparatus as claimed in claim 65, wherein said determination part comprises a part calculating the predetermined thresholds from the signal values stored in the table in said storage part.

67. The multi-level data processing apparatus as claimed in claim 63, wherein said second part of said conversion part is supplied with data for another set preceding the set in converting the remaining (m×k−1)-bit binary data to the (m×k) bits.

68. The multi-level data processing apparatus as claimed in claim 67, further comprising:

a reproduction signal output part outputting a reproduction signal from the information recording medium;

a signal value output part supplied with the reproduction signal output from said reproduction signal output part to output signal values of multi-level data;

a storage part storing the signal values of the test data output from said signal value output part in a table;

a first error calculation part calculating an error between signal values of the multi-level data to which the binary data is converted and corresponding signal values stored in the table;

a first multi-level data output part outputting first multi-level data minimizing the error output from said first error calculation part;

a comparison part comparing lower-side k bits of m symbols of a target set of the first multi-level data with conversion data for converting the (m×k−1)-bit binary data to the (m×k) bits;

a second error, calculation part that, based on the comparison in said comparison part, calculates an error between input signal values of the sets and each of strings of candidate multi-level data of a plurality of successive sets including the target set, the candidate multi-level data corresponding to the conversion data; and a second multi-level data output part outputting, as second multi-level data of the target set, candidate multi-level data of the target set in one of the strings of the candidate multi-level data which one has a minimum of the errors calculated in said second error calculation part; and a reproduced multi-level data output part outputting, as reproduced multi-level data, the second multi-level data when the lower-side k bits match none of the conversion data, and the first multi-level data when the lower-side k bits match any of the conversion data, whereby the multi-level data recorded on the information recording medium is reproduced therefrom.

69. The multi-level data processing apparatus as claimed in claim 68, wherein, in each of the sets, said second error calculation part selects N candidate multi-level data ranging from candidate multi-level data having signal values having a minimum error with respect to the input signal values of the set to candidate multi-level data having signal values having an Nth smallest error with respect to the input signal values of the set, N being an integer satisfying 1≦N≦2, and calculates an error between the input signal values of the sets and signal values of each of combinations of the selected candidate multi-level data of the sets.

70. The multi-level data processing apparatus as claimed in claim 68, wherein:
   said storage part stores $2^{(M \times n)}$ patterns of signal values of (M−2) multi-level data determined by excluding multi-level data on ends of the M successive multi-level data as the signal values in the table; and
   said first error calculation part comprises a determination part determining multi-level data on ends of M successive multi-level data by predetermined thresholds so as to calculate an error between one or a plurality of signal values of (M−2) multi-level data obtained by excluding the multi-level data on the ends of the M successive multi-level data and one or a plurality of corresponding signal values in the table.

71. The multi-level data processing apparatus as claimed in claim 70, wherein said determination part comprises a part calculating the predetermined thresholds from the signal values stored in the table in said storage part.

72. A multi-level data processing apparatus comprising:
   a conversion part converting input binary data to multi-level data of n bits per symbol, n being an integer satisfying $n \geq 2$;
   a generation part generating test data including $2^{(M \times n)}$ combinations of M successive multi-level data, M being an integer satisfying $M \geq 3$;
   a recording part recording the multi-level data output from said conversion part and the test data output from said generation part on an information recording medium; and
   a reproduction part reproducing the multi-level data from the information recording medium,
   wherein:
   said conversion part converts input (n×m−1)-bit binary data to multi-level data of m symbols per set, m being an integer satisfying $m \geq 2$,
   said conversion part comprising:
      a first part arranging {(n−k)×m}-bit binary data of the (n×m−1)-bit binary data in upper-side (n−k) bits of m symbols of a set, k being an integer satisfying $n > k \geq 1$;
      a second part converting the remaining (m×k−1)-bit binary data of the (m×k−1)-bit data to (m×k) bits; and
      a third part arranging the (m×k) bits in the remaining lower-side k bits of the m symbols of the set; and
   said reproduction part comprises:
      a reproduction signal output part outputting a reproduction signal from the information recording medium;
      a signal value output part supplied with the reproduction signal output from said reproduction signal output part and outputting signal values of multi-level data;
      a storage part storing the signal values of the test data output from said signal value output part in a table;
      a first error calculation part calculating an error between signal values of the multi-level data to which the binary data is converted and corresponding signal values stored in the table;
      a first multi-level data output part outputting first multi-level data minimizing the error output from said first error calculation part;
      a comparison part comparing lower-side k bits of m symbols of a target set of the first multi-level data with conversion data for converting the (m×k−1)-bit binary data to the (m×k) bits;
      a second error calculation part calculating, based on the comparison of said comparison part, an error between each of candidate multi-level data corresponding to the conversion data and the signal values of the multi-level data to which the binary data is converted,
      a second multi-level data output part outputting one of the candidate multi-level data which one has a minimum of the errors output from said second error calculation part as second multi-level data; and
      a reproduced multi-level data output part outputting, as reproduced multi-level data, the second multi-level data if the lower-side k bits match none of the conversion data in said comparison part and the first multi-level data if the lower-side k bits match any of the conversion data in said comparison part.

73. The multi-level data processing apparatus as claimed in claim 72, wherein:
   said storage part stores $2^{(M \times n)}$ patterns of signal values of (M−2) multi-level data determined by excluding multi-level data on ends of the M successive multi-level data as the signal values in the table; and
   said first error calculation part comprises a determination part determining multi-level data on ends of M successive multi-level data by predetermined thresholds so as to calculate an error between one or a plurality of signal values of (M−2) multi-level data obtained by excluding the multi-level data on the ends of the M successive multi-level data and one or a plurality of corresponding signal values in the table.

74. The multi-level data processing apparatus as claimed in claim 73, wherein said determination part comprises a part calculating the predetermined thresholds from the signal values stored in the table in said storage part.

75. A multi-level data processing apparatus comprising:
   a conversion part converting input binary data to multi-level data of n bits per symbol, n being an integer satisfying $n \geq 2$;
   a generation part generating test data including $2^{(M \times n)}$ combinations of M successive multi-level data, M being an integer satisfying $M \geq 3$,
   a recording part recording the multi-level data output from said conversion part and the test data output from said generation part on an information recording medium; and
   a reproduction part reproducing the multi-level data from the information recording medium,
   wherein:
   said conversion part converts input (n×m−1)-bit binary data to multi-level data of m symbols per set, m being an integer satisfying $m \geq 2$,
   said conversion part comprising:
      a first part arranging {(n−k)×m}-bit binary data of the (n×m−1)-bit binary data in upper-side (n−k) bits of m symbols of a set, k being an integer satisfying $n > k \geq 1$;
      a second part converting the remaining (m×k−1)-bit binary data of the (m×k−1)-bit data to (m×k) bits; and
      a third part arranging the (m×k) bits in the remaining lower-side k bits of the m symbols of the set; and
   said reproduction part comprises:
      a reproduction signal output part outputting a reproduction signal from the information recording medium;

a signal value output part supplied with the reproduction signal output from said reproduction signal output part and outputting signal values of multi-level data;

a storage part storing the signal values of the test data output from said signal value output part in a table;

a first error calculation part calculating an error between signal values of the multi-level data to which the binary data is converted and corresponding signal values stored in the table;

a first multi-level data output part outputting first multi-level data minimizing the error output from said first error calculation part;

a comparison part comparing lower-side k bits of m symbols of a target set of the first multi-level data with conversion data for converting the (m×k−1)-bit binary data to the (m×k) bits;

a second error calculation part calculating, based on the comparison in said comparison part, an error between input signal values of the sets and each of strings of candidate multi-level data of a plurality of successive sets including the target set, the candidate multi-level data corresponding to the conversion data;

a second multi-level data output part outputting, as second multi-level data of the target set, candidate multi-level data of the target set in one of the strings of the candidate multi-level data which one has a minimum of the errors calculated in said second error calculation part; and a reproduced multi-level data output part outputting, as reproduced multi-level data, the second multi-level data when the lower-side k bits match none of the conversion data, and the first multi-level data when the lower-side k bits match any of the conversion data.

76. The multi-level data processing apparatus as claimed in claim 75, wherein, in each of the sets, said second error calculation part selects N candidate multi-level data ranging from candidate multi-level data having signal values having a minimum error with respect to the input signal values of the set to candidate multi-level data having signal values having an Nth smallest error with respect to the input signal values of the set, N being an integer satisfying $1 \leq N \leq 2$, and calculates an error between the input signal values of the sets and signal values of each of combinations of the selected candidate multi-level data of the sets.

77. The multi-level data processing apparatus as claimed in claim 75, wherein:

said storage part stores $2^{(M \times n)}$ patterns of signal values of (M−2) multi-level data determined by excluding multi-level data on ends of the M successive multi-level data as the signal values in the table; and said first error calculation part comprises a determination part determining multi-level data on ends of M successive multi-level data by predetermined thresholds so as to calculate an error between one or a plurality of signal values of (M−2) multi-level data obtained by excluding the multi-level data on the ends of the M successive multi-level data and one or a plurality of corresponding signal values in the table.

78. The multi-level data processing apparatus as claimed in claim 77, wherein said determination part comprises a part calculating the predetermined thresholds from the signal values stored in the table in said storage part.

79. The information recording medium on which the multi-level data and the test data are recorded by the multi-level data processing apparatus as claimed in claim 63 or 67.

* * * * *